United States Patent
Fujimura et al.

(10) Patent No.: US 11,392,102 B2
(45) Date of Patent: Jul. 19, 2022

(54) LOAD DRIVE DEVICE, SEMICONDUCTOR DEVICE, LOAD DRIVE SYSTEM AND VEHICLE

(71) Applicant: Rohm Co., Ltd., Kyoto (JP)

(72) Inventors: Takashi Fujimura, Kyoto (JP); Takashi Kira, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 155 days.

(21) Appl. No.: 16/651,291

(22) PCT Filed: Sep. 19, 2018

(86) PCT No.: PCT/JP2018/034590
§ 371 (c)(1),
(2) Date: Mar. 26, 2020

(87) PCT Pub. No.: WO2019/065395
PCT Pub. Date: Apr. 4, 2019

(65) Prior Publication Data
US 2020/0272120 A1     Aug. 27, 2020

(30) Foreign Application Priority Data

Sep. 29, 2017 (JP) .............................. JP2017-190007
Sep. 29, 2017 (JP) .............................. JP2017-190015

(51) Int. Cl.
*G05B 19/042*     (2006.01)
*H03K 3/0233*     (2006.01)
(Continued)

(52) U.S. Cl.
CPC ........ *G05B 19/0423* (2013.01); *H01L 23/538* (2013.01); *H03K 3/02337* (2013.01);
(Continued)

(58) Field of Classification Search
CPC ........... G05B 19/0423; H03K 3/02337; H03K 17/6871; H05K 1/029; H05K 1/181;
(Continued)

(56) References Cited

U.S. PATENT DOCUMENTS

2005/0047176 A1   3/2005   Fukumoto
2006/0239038 A1   10/2006  Fukumoto
(Continued)

FOREIGN PATENT DOCUMENTS

CN    1596504 A    3/2005
JP    S60-97494 A  5/1985
(Continued)

OTHER PUBLICATIONS

European Patent Office, Extended Search Report in European Appln. No. 18861859.9, dated Mar. 24, 2021, 7 pages.
(Continued)

*Primary Examiner* — Jung Kim
(74) *Attorney, Agent, or Firm* — Fish & Richardson P.C.

(57) ABSTRACT

A driver IC (100) includes a pair of output terminals in each of a plurality of channels and in each of the channels, power is supplied from the pair of output terminals (OUT1 and OUT2, OUT3 and OUT4, OUT5 and OUT6 or OUT7 and OUT8) to a load (M1, M2, M3 or M4). In each of the channels, the pair of output terminals are adjacent to each other.

13 Claims, 25 Drawing Sheets

(51) Int. Cl.
*H03K 17/687* (2006.01)
*H05K 1/02* (2006.01)
*H05K 1/18* (2006.01)
*H01L 23/538* (2006.01)

(52) U.S. Cl.
CPC ......... *H03K 17/6871* (2013.01); *H05K 1/029* (2013.01); *H05K 1/181* (2013.01); *H05K 1/182* (2013.01)

(58) Field of Classification Search
CPC ........... H05K 1/182; H02P 5/68; H01L 24/00; H01L 24/01; H01L 24/42; H01L 24/74; H01L 23/538
See application file for complete search history.

(56) References Cited

U.S. PATENT DOCUMENTS

| | | |
|---|---|---|
| 2008/0037291 A1 | 2/2008 | Fukumoto |
| 2008/0285321 A1 | 11/2008 | Fukumoto |
| 2010/0014336 A1 | 1/2010 | Fukumoto |
| 2015/0179234 A1* | 6/2015 | Kawase ................. G11C 5/148 365/185.08 |

FOREIGN PATENT DOCUMENTS

| | | |
|---|---|---|
| JP | H04-125093 A | 4/1992 |
| JP | 2004-20981 A | 4/2004 |
| JP | 2007-130783 | 5/2007 |
| JP | 2009-208269 A | 9/2009 |
| JP | 2015-056913 A | 3/2015 |
| KR | 20050047501 A | 5/2005 |
| KR | 0983703 B1 | 9/2010 |
| WO | 2004/032315 | 4/2004 |

OTHER PUBLICATIONS

Infineon.com [online], "PG-DSO-28-41 Enhanced Power Hex-Half-Bridge/Double Six-Driver TLE 6208-6 G," Oct. 1, 2013, [Retrieved on Mar. 16, 2021], retrieved from: URL<https://www.infineon.com/dgdl/Infineon-TLE6208_6G-DS-v01_02-en.pdf?fileId=db3a30431c48a312011c4c052072000c>, XP055786185, 25 pages.
Japan Patent Office, International Search Report for PCT/JPPCT/JP2018/034590 dated Dec. 18, 2018.

* cited by examiner

FIG.2
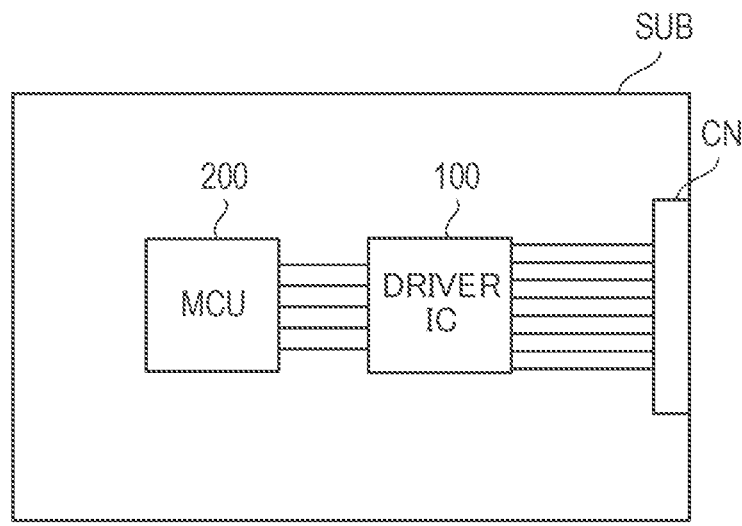
FIG.3
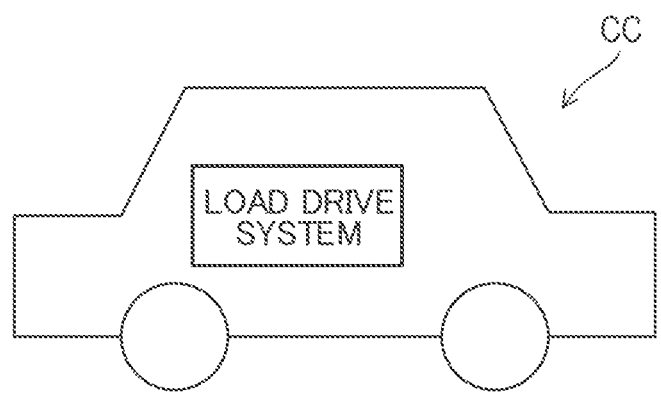
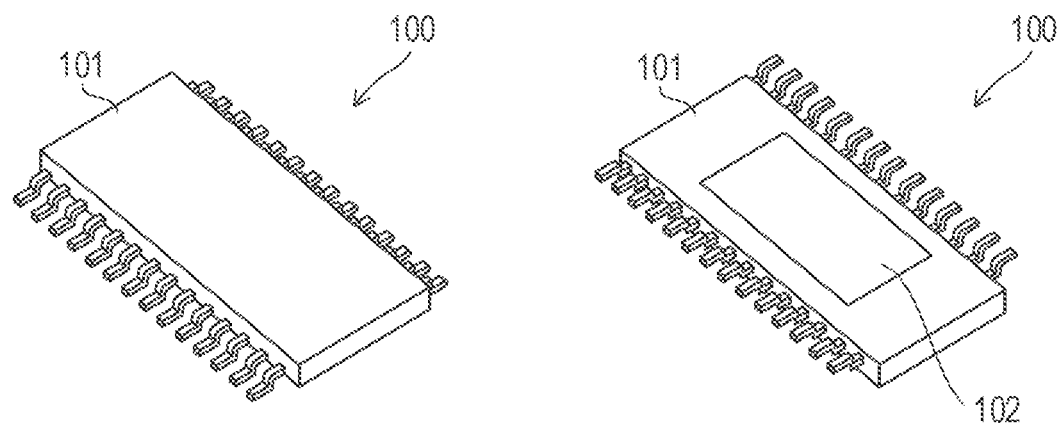
FIG.4A  FIG.4B

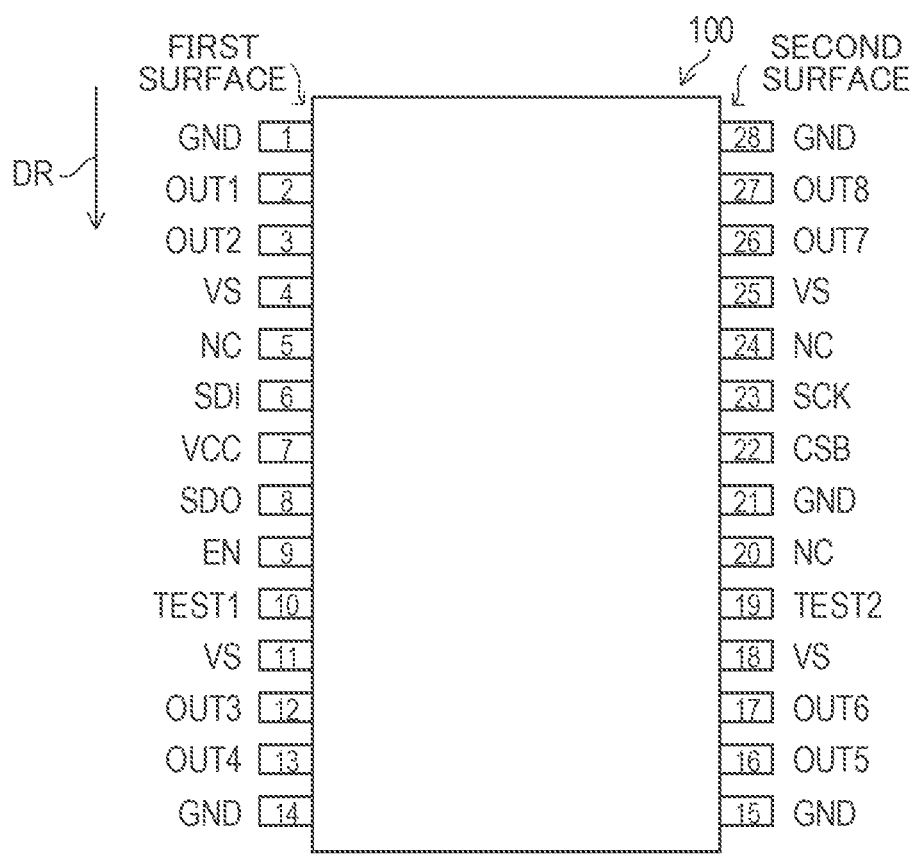

FIG. 10

Write Address A
WR1

| Bit Number | Name | Description | Bit Status 0 | Bit Status 1 | Initial Value | NOTE |
|---|---|---|---|---|---|---|
| 15 | WE | Write Enable | Read Only | Write & Read | 0 | 0: Read Register MODE<br>1: Write&Read Register MODE |
| 14 | WR AD | Write Address | Address A | Address B | 0 | 0: Access to WriteAddressA<br>1: Access to WriteAddressB |
| 13 | RD AD | Read Address | Address A | Address B | 0 | 0: Access to ReadAddressA<br>1: Access to ReadAddressB |
| 12 | SRR | Status Reset Register | Normal | Reset | 0 | 0: Normal<br>1: LOGIC RESET |
| 11 | HSC4 | Control High side 4 (OUT4) | High side OFF | High side On | 0 | 0: OUT4 Highside OFF<br>1: OUT4 Highside ON |
| 10 | LSC4 | Control Low side 4 (OUT4) | Low side Off | Low side On | 0 | 0: OUT4 Lowside OFF<br>1: OUT4 Lowside ON |
| 9 | HSC3 | Control High side 3 (OUT3) | High side OFF | High side On | 0 | 0: OUT3 Highside OFF<br>1: OUT3 Highside ON |
| 8 | LSC3 | Control Low side 3 (OUT3) | Low side Off | Low side On | 0 | 0: OUT3 Lowside OFF<br>1: OUT3 Lowside ON |
| 7 | HSC2 | Control High side 2 (OUT2) | High side OFF | High side On | 0 | 0: OUT2 Highside OFF<br>1: OUT2 Highside ON |
| 6 | LSC2 | Control Low side 2 (OUT2) | Low side Off | Low side On | 0 | 0: OUT2 Lowside OFF<br>1: OUT2 Lowside ON |
| 5 | HSC1 | Control High side 1 (OUT1) | High side OFF | High side On | 0 | 0: OUT1 Highside OFF<br>1: OUT1 Highside ON |
| 4 | LSC1 | Control Low side 1 (OUT1) | Low side Off | Low side On | 0 | 0: OUT1 Lowside OFF<br>1: OUT1 Lowside ON |
| 3 | UNDERLOAD | UNDERLOADS Register Mode(OUT1 to 8) | UL ON | UL OFF | 0 | 0: UNDERLOAD(=UCD) Function ON<br>1: UNDERLOAD(=UCD) Function OFF |
| 2 | TSDSTH | TSDS Latch / Through | Latch | Through | 0 | 0: TSD·TW Register Latch<br>1: TSD·TW Register no Latch |
| 1 | PSSTH | PSS Latch / Through | Latch | Through | 0 | 0: OVP·UVLO Register Latch<br>1: OVP·UVLO Register no Latch |
| 0 | TESTMODE EN | TESTMODE ENABLE | — | TESTMODE | 0 | Bit15=1 & BIT0=1<br>→TESTMODE |

ON/OFF SPECIFYING BITS (bits 4–11)

FIG. 11

Write Address B
WR2

| Bit Number | Name | Description | Bit Status 0 | Bit Status 1 | Initial Value | NOTE |
|---|---|---|---|---|---|---|
| 15 | WE | Read/Write | Read Only | Write & Read | 0 | 0: Read Register MODE<br>1: Write&Read Register MODE |
| 14 | WR AD | Write Address | Address A | Address B | 0 | 0: Access to WriteAddressA<br>1: Access to WriteAddressB |
| 13 | RD AD | Read Address | Address A | Address B | 0 | 0: Access to ReadAddressA<br>1: Access to ReadAddressB |
| 12 | SRR | Status Reset Register | Normal | Reset | 0 | 0: Normal<br>1: LOGIC RESET |
| 11 | HSC8 | Control High side 8 (OUT8) | High side OFF | High side On | 0 | 0: OUT8 Highside OFF<br>1: OUT8 Highside On |
| 10 | LSC8 | Control Low side 8 (OUT8) | Low side Off | Low side On | 0 | 0: OUT8 Lowside OFF<br>1: OUT8 Lowside On |
| 9 | HSC7 | Control High side 7 (OUT7) | High side OFF | High side On | 0 | 0: OUT7 Highside OFF<br>1: OUT7 Highside On |
| 8 | LSC7 | Control Low side 7 (OUT7) | Low side Off | Low side On | 0 | 0: OUT7 Lowside OFF<br>1: OUT7 Lowside On |
| 7 | HSC6 | Control High side 6 (OUT6) | High side OFF | High side On | 0 | 0: OUT6 Highside OFF<br>1: OUT6 Highside On |
| 6 | LSC6 | Control Low side 6 (OUT6) | Low side Off | Low side On | 0 | 0: OUT6 Lowside OFF<br>1: OUT6 Lowside On |
| 5 | HSC5 | Control High side 5 (OUT5) | High side OFF | High side On | 0 | 0: OUT5 Highside OFF<br>1: OUT5 Highside On |
| 4 | LSC5 | Control Low side 5 (OUT5) | Low side Off | Low side On | 0 | 0: OUT5 Lowside OFF<br>1: OUT5 Lowside On |
| 3 | OVPSEL | OVP Threshold select | VOVPH1, VOVPL1 | VOVPH2, VOVPL2 | 0 | 0: Setting VOVPH=36V, VOVPL=33.3V<br>1: Setting VOVPH=20V, VOVPL=18V |
| 2 | RESERVE | - | - | - | - | |
| 1 | RESERVE | - | - | - | - | |
| 0 | TESTMODE EN | TESTMODE ENABLE | - | TESTMODE | 0 | Bit15=1 & BIT0=1<br>→TESTMODE |

ON/OFF SPECIFYING BITS (bits 11–4)

FIG. 12

Write Address A
Read Address A
RR1

| Bit Number | Name | Description | Bit Status 0 | Bit Status 1 | Initial Value | NOTE |
|---|---|---|---|---|---|---|
| 15 | — | — | — | — | 0 | |
| 14 | TSDS | Thermal Shutdown Status | Normal | Fault | 1 | Read TSD's condition 0: TSD OFF, 1: TSD ON |
| 13 | TWS | Thermal Warning Status | Normal | Fault | 1 | Read TW's condition 0: TW OFF, 1: TW ON |
| 12 | — | — | — | — | 0 | |
| 11 | HSS4 | Status High side 4 (OUT4) | High side OFF | High side On | 0 | Read OUT4 Highside Output condition |
| 10 | LSS4 | Status Low side 4 (OUT4) | Low side Off | Low side On | 0 | Read OUT4 Lowside Output condition |
| 9 | HSS3 | Status High side 3 (OUT3) | High side OFF | High side On | 0 | Read OUT3 Highside Output condition |
| 8 | LSS3 | Status Low side 3 (OUT3) | Low side Off | Low side On | 0 | Read OUT3 Lowside Output condition |
| 7 | HSS2 | Status High side 2 (OUT2) | High side OFF | High side On | 0 | Read OUT2 Highside Output condition |
| 6 | LSS2 | Status Low side 2 (OUT2) | Low side Off | Low side On | 0 | Read OUT2 Lowside Output condition |
| 5 | HSS1 | Status High side 1 (OUT1) | High side OFF | High side On | 0 | Read OUT1 Highside Output condition |
| 4 | LSS1 | Status Low side 1 (OUT1) | Low side Off | Low side On | 0 | Read OUT1 Lowside Output condition |
| 3 | OCDS | Over Current Detection Status(OUT1 to 4) | Normal | Fault | 1 | Read OCD1-4's condition OR result |
| 2 | UNDERLOADS | UNDERLOAD Status(OUT1 to 4) | Normal | Fault | 1 | Read UNDERLOAD(=UCD)1-4's condition OR result |
| 1 | OVPS | Over Voltage Protection Status | Normal | Fault | 1 | Read OVP's condition |
| 0 | UVLOS | UVLO (VS) Status | Normal | Fault | 1 | Read UVLO's condition |

ON/OFF STATE BITS (bits 4–11)
LOGICAL SUM OVERCURRENT STATE BIT (bit 3)
LOGICAL SUM LOW LOAD STATE BIT (bit 2)

FIG. 13

Write Address B
Read Address A
RR2

| Bit Number | Name | Description | Bit Status 0 | Bit Status 1 | Initial Value | NOTE |
|---|---|---|---|---|---|---|
| 15 | – | – | – | – | 0 | |
| 14 | TSDS | Thermal Shutdown Status | Normal | Fault | 1 | Read TSD's condition 0: TSD OFF, 1:TSD ON |
| 13 | TWS | Thermal Warning Status | Normal | Fault | 1 | Read TW's condition 0: TW OFF, 1: TW ON |
| 12 | – | – | – | – | 0 | |
| 11 | HSS8 | Status High side 8 (OUT8) | High side OFF | High side On | 0 | Read OUT8 Highside Output condition |
| 10 | LSS8 | Status Low side 8 (OUT8) | Low side Off | Low side On | 0 | Read OUT8 Lowside Output condition |
| 9 | HSS7 | Status High side 7 (OUT7) | High side OFF | High side On | 0 | Read OUT7 Highside Output condition |
| 8 | LSS7 | Status Low side 7 (OUT7) | Low side Off | Low side On | 0 | Read OUT7 Lowside Output condition |
| 7 | HSS6 | Status High side 6 (OUT6) | High side OFF | High side On | 0 | Read OUT6 Highside Output condition |
| 6 | LSS6 | Status Low side 6 (OUT6) | Low side Off | Low side On | 0 | Read OUT6 Lowside Output condition |
| 5 | HSS5 | Status High side 5 (OUT5) | High side OFF | High side On | 0 | Read OUT5 Highside Output condition |
| 4 | LSS5 | Status Low side 5 (OUT5) | Low side Off | Low side On | 0 | Read OUT5 Lowside Output condition |
| 3 | OCDS | Over Current Detection Status(OUT5 to 8) | Normal | Fault | 1 | Read OCD5-8's condition OR result |
| 2 | UNDERLOADS | UNDERLOAD Status(OUT5 to 8) | Normal | Fault | 1 | Read UNDERLOAD(=UCD)5-8's condition OR result |
| 1 | OVPS | Over Voltage Protection Status | Normal | Fault | 1 | Read OVP's condition |
| 0 | UVLOS | UVLO (VS) Status | Normal | Fault | 1 | Read UVLO's condition |

ON/OFF STATE BITS (bits 11–4)
LOGICAL SUM OVERCURRENT STATE BIT (bit 3)
LOGICAL SUM LOW LOAD STATE BIT (bit 2)

FIG.14
Write Address A
Read Address B  RR3

| Bit Number | Name | Description | Bit Status 0 | Bit Status 1 | Initial Value | NOTE |
|---|---|---|---|---|---|---|
| 15 | - | - | - | - | 0 | |
| 14 | TSDS | Thermal Shutdown Status | Normal | Fault | 1 | Read TSD's condition 0 : TSD OFF, 1:TSD ON |
| 13 | TWS | Thermal Warning Status | Normal | Fault | 1 | Read TW's condition 0 : TW OFF, 1 : TW ON |
| 12 | - | - | - | - | 0 | |
| 11 | UNDERLOAD4 | UNDERLOAD Status OUT4 | Normal | Fault | 1 | Read OUT4 UNDERLOAD(=UOD) condition |
| 10 | UNDERLOAD3 | UNDERLOAD Status OUT3 | Normal | Fault | 1 | Read OUT3 UNDERLOAD(=UOD) condition |
| 9 | UNDERLOAD2 | UNDERLOAD Status OUT2 | Normal | Fault | 1 | Read OUT2 UNDERLOAD(=UOD) condition |
| 8 | UNDERLOAD1 | UNDERLOAD Status OUT1 | Normal | Fault | 1 | Read OUT1 UNDERLOAD(=UOD) condition |
| 7 | OCDH4 | Over Current Detection HI side Status OUT4 | Normal | Fault | 1 | Read OUT4 Highside OCD condition |
| 6 | OCDL4 | Over Current Detection LOW side Status OUT4 | Normal | Fault | 1 | Read OUT4 Lowside OCD condition |
| 5 | OCDH3 | Over Current Detection HI side Status OUT3 | Normal | Fault | 1 | Read OUT3 Highside OCD condition |
| 4 | OCDL3 | Over Current Detection LOW side Status OUT3 | Normal | Fault | 1 | Read OUT3 Lowside OCD condition |
| 3 | OCDH2 | Over Current Detection HI side Status OUT2 | Normal | Fault | 1 | Read OUT2 Highside OCD condition |
| 2 | OCDL2 | Over Current Detection LOW side Status OUT2 | Normal | Fault | 1 | Read OUT2 Lowside OCD condition |
| 1 | OCDH1 | Over Current Detection HI side Status OUT1 | Normal | Fault | 1 | Read OUT1 Highside OCD condition |
| 0 | OCDL1 | Over Current Detection LOW side Status OUT1 | Normal | Fault | 1 | Read OUT1 Lowside OCD condition |

Bits 8-11: INDIVIDUAL LOW LOAD STATE BITS
Bits 0-7: INDIVIDUAL OVERCURRENT STATE BITS

FIG. 15

Write Address B
Read Address B  RR4

| Bit Number | Name | Description | Bit Status 0 | Bit Status 1 | Initial Value | NOTE |
|---|---|---|---|---|---|---|
| 15 | - | - | - | - | 0 | |
| 14 | TSDS | Thermal Shutdown Status | Normal | Fault | 1 | Read TSD's condition 0:TSD OFF, 1:TSD ON |
| 13 | TWS | Thermal Warning Status | Normal | Fault | 1 | Read TW's condition 0:TW OFF, 1:TW ON |
| 12 | - | - | - | - | 0 | |
| 11 | UNDERLOAD8 | UNDERLOAD Status OUT8 | Normal | Fault | 1 | Read OUT8 UNDERLOAD(=UCD) condition |
| 10 | UNDERLOAD7 | UNDERLOAD Status OUT7 | Normal | Fault | 1 | Read OUT7 UNDERLOAD(=UCD) condition |
| 9 | UNDERLOAD6 | UNDERLOAD Status OUT6 | Normal | Fault | 1 | Read OUT6 UNDERLOAD(=UCD) condition |
| 8 | UNDERLOAD5 | UNDERLOAD Status OUT5 | Normal | Fault | 1 | Read OUT5 UNDERLOAD(=UCD) condition |
| 7 | OCDH8 | Over Current Detection HI side Status OUT8 | Normal | Fault | 1 | Read OUT8 Highside OCD condition |
| 6 | OCDL8 | Over Current Detection LOW side Status OUT8 | Normal | Fault | 1 | Read OUT8 Lowside OCD condition |
| 5 | OCDH7 | Over Current Detection HI side Status OUT7 | Normal | Fault | 1 | Read OUT7 Highside OCD condition |
| 4 | OCDL7 | Over Current Detection LOW side Status OUT7 | Normal | Fault | 1 | Read OUT7 Lowside OCD condition |
| 3 | OCDH6 | Over Current Detection HI side Status OUT6 | Normal | Fault | 1 | Read OUT6 Highside OCD condition |
| 2 | OCDL6 | Over Current Detection LOW side Status OUT6 | Normal | Fault | 1 | Read OUT6 Lowside OCD condition |
| 1 | OCDH5 | Over Current Detection HI side Status OUT5 | Normal | Fault | 1 | Read OUT5 Highside OCD condition |
| 0 | OCDL5 | Over Current Detection LOW side Status OUT5 | Normal | Fault | 1 | Read OUT5 Lowside OCD condition |

INDIVIDUAL LOW LOAD STATE BITS (bits 11–8)

INDIVIDUAL OVERCURRENT STATE BITS (bits 7–0)

|  | DRIVER IC 100 OF FIRST EMBODIMENT | DRIVER IC 100A OF SECOND EMBODIMENT |
|---|---|---|
| WRITE REGISTERS | WR1<br>WR2 | WR1<br>WR2A |
| READ REGISTERS | RR1<br>RR2<br>RR3<br>RR4 | RR1<br>RR2A<br>RR3<br>RR4A |

FIG. 24

Write Address B WR2A

| Bit Number | Name | Description | Bit Status 0 | Bit Status 1 | Initial Value | NOTE |
|---|---|---|---|---|---|---|
| 15 | WE | Read/Write | Read Only | Write & Read | 0 | 0: Read Register MODE<br>1: Write&Read Register MODE |
| 14 | WR AD | Write Address | Address A | Address B | 0 | 0: Access to WriteAddressA<br>1: Access to WriteAddressB |
| 13 | RD AD | Read Address | Address A | Address B | 0 | 0: Access to ReadAddressA<br>1: Access to ReadAddressB |
| 12 | SRR | Status Reset Register | Normal | Reset | 0 | 0: Normal<br>1: LOGIC RESET |
| 11 | - | - | - | - | - | removed HSC8 |
| 10 | - | - | - | - | - | removed LSC8 |
| 9 | - | - | - | - | - | removed HSC7 |
| 8 | - | - | - | - | - | removed LSC7 |
| 7 | HSC6 | Control High side 6 (OUT6) | High side OFF | High side On | 0 | 0: OUT6 Highside OFF<br>1: OUT6 Highside ON |
| 6 | LSC6 | Control Low side 6 (OUT6) | Low side Off | Low side On | 0 | 0: OUT6 Lowside OFF<br>1: OUT6 Lowside ON |
| 5 | HSC5 | Control High side 5 (OUT5) | High side OFF | High side On | 0 | 0: OUT5 Highside OFF<br>1: OUT5 Highside ON |
| 4 | LSC5 | Control Low side 5 (OUT5) | Low side Off | Low side On | 0 | 0: OUT5 Lowside OFF<br>1: OUT5 Lowside ON |
| 3 | OVPSEL | OVP Threshold select | VOVPH1, VOVPL1 | VOVPH2, VOVPL2 | 0 | 0: Setting VOVPH=36V, VOVPL=33.3V<br>1: Setting VOVPH=20V, VOVPL=18V |
| 2 | RESERVE | - | - | - | - | |
| 1 | RESERVE | - | - | - | - | |
| 0 | TESTMODE EN | TESTMODE ENABLE | - | TESTMODE | 0 | Bit15=1 & BIT0=1<br>→TESTMODE |

WRITE DUMMY BITS (WRITE DUMMY MEMORY SPACE): bits 11–8

ON/OFF SPECIFYING BITS: bits 7–4

FIG. 25

Write Address B
Read Address A
RR2A

| Bit Number | Name | Description | Bit Status 0 | Bit Status 1 | Initial Value | NOTE |
|---|---|---|---|---|---|---|
| 15 | — | — | — | — | 0 | |
| 14 | TSDS | Thermal Shutdown Status | Normal | Fault | 1 | Read TSD's condition 0: TSD OFF, 1:TSD ON |
| 13 | TWS | Thermal Warning Status | Normal | Fault | 1 | Read TW's condition 0: TW OFF, 1: TW ON |
| 12 | — | — | — | — | 0 | |
| 11 | — | — | — | — | 0 | removed HSC8 |
| 10 | — | — | — | — | 0 | removed LSC8 |
| 9 | — | — | — | — | 0 | removed HSC7 |
| 8 | — | — | — | — | 0 | removed LSC7 |
| 7 | HSS6 | Status High side 6 (OUT6) | High side OFF | High side On | 0 | Read OUT6 Highside Output condition |
| 6 | LSS6 | Status Low side 6 (OUT6) | Low side Off | Low side On | 0 | Read OUT6 Lowside Output condition |
| 5 | HSS5 | Status High side 5 (OUT5) | High side OFF | High side On | 0 | Read OUT5 Highside Output condition |
| 4 | LSS5 | Status Low side 5 (OUT5) | Low side Off | Low side On | 0 | Read OUT5 Lowside Output condition |
| 3 | OCDS | Over Current Detection Status(OUT5 to 6) | Normal | Fault | 1 | Read OCD5-6's condition OR result |
| 2 | UNDERLOADS | UNDERLOAD Status(OUT5 to 6) | Normal | Fault | 1 | Read UNDERLOAD(=UCD5-6's condition OR result |
| 1 | OVPS | Over Voltage Protection Status | Normal | Fault | 1 | Read OVP's condition |
| 0 | UVLOS | UVLO (VS) Status | Normal | Fault | 1 | Read UVLO's condition |

READ DUMMY BITS (READ DUMMY MEMORY SPACE): bits 11–8
ON/OFF STATE BITS: bits 7–4
LOGICAL SUM OVERCURRENT STATE BIT: bit 3
LOGICAL SUM LOW LOAD STATE BIT: bit 2

FIG.26

Write Address B
Read Address B
RR4A

| Bit Number | Name | Description | Bit Status 0 | Bit Status 1 | Initial Value | NOTE |
|---|---|---|---|---|---|---|
| 15 | - | - | - | - | 0 | |
| 14 | TSDS | Thermal Shutdown Status | Normal | Fault | 1 | Read TSD's condition 0: TSD OFF, 1:TSD ON |
| 13 | TWS | Thermal Warning Status | Normal | Fault | 1 | Read TW's condition 0: TW OFF, 1:TW ON |
| 12 | - | - | - | - | 0 | |
| 11 | - | - | - | - | 0 | removed UNDERLOAD8 |
| 10 | - | - | - | - | 0 | removed UNDERLOAD7 |
| 9 | UNDERLOAD6 | UNDERLOAD Status OUT6 | Normal | Fault | 1 | Read OUT6 UNDERLOAD(=UCD) condition |
| 8 | UNDERLOAD5 | UNDERLOAD Status OUT5 | Normal | Fault | 1 | Read OUT5 UNDERLOAD(=UCD) condition |
| 7 | - | - | - | - | 0 | removed OCDH8 |
| 6 | - | - | - | - | 0 | removed OCDL8 |
| 5 | - | - | - | - | 0 | removed OCDH7 |
| 4 | - | - | - | - | 0 | removed OCDL7 |
| 3 | OCDH6 | Over Current Detection Hi side Status OUT6 | Normal | Fault | 1 | Read OUT6 Highside OCD condition |
| 2 | OCDL6 | Over Current Detection LOW side Status OUT6 | Normal | Fault | 1 | Read OUT6 Lowside OCD condition |
| 1 | OCDH5 | Over Current Detection Hi side Status OUT5 | Normal | Fault | 1 | Read OUT5 Highside OCD condition |
| 0 | OCDL5 | Over Current Detection LOW side Status OUT5 | Normal | Fault | 1 | Read OUT5 Lowside OCD condition |

READ DUMMY BITS (READ DUMMY MEMORY SPACE): bits 15–10
INDIVIDUAL LOW LOAD STATE BITS: bits 9–8
DUMMY BITS (DUMMY MEMORY SPACE): bits 7–4
INDIVIDUAL OVERCURRENT STATE BITS: bits 3–0

*SAME FOR DRIVE CHS 2 TO 4

LOAD DRIVE DEVICE, SEMICONDUCTOR DEVICE, LOAD DRIVE SYSTEM AND VEHICLE

TECHNICAL FIELD

The present invention relates to a load drive device, a semiconductor device, a load drive system and a vehicle.

BACKGROUND ART

A load drive device supplies power to a load so as to drive the load. A device which drives a motor as a load may also be referred to as a motor driver. Motor drivers are used in various applications including a vehicle-mounted application.

RELATED ART DOCUMENT

Patent Document

Patent document 1: Japanese Unexamined Patent Application Publication No. 2015-56913

DISCLOSURE OF THE INVENTION

Problems to be Solved by the Invention

In a load drive device, in order to drive a plurality of loads, an output circuit may be provided in each of a plurality of channels. In this case, in each of the channels, power is supplied from a pair of output terminals to the load, and here, it is necessary to consider signal interference between the channels, the ease of the routing of wiring and the like.

Hence, an object of the present invention is to provide a load drive device, a semiconductor device, a load drive system and a vehicle which have superiority on signal interference, wiring design and the like.

Means for Solving the Problem

A load drive device according to the present invention is a load drive device which includes a pair of output terminals in each of a plurality of channels and in which in each of the channels, power can be supplied from the pair of output terminals to a load, and in each of two or more channels included in the plurality of channels, the pair of output terminals are arranged adjacent to each other.

Preferably, specifically, for example, in the load drive device, in two target channels which are included in the two or more channels and in which the corresponding output terminals are provided on the same surface of a housing of the load drive device, between a pair of output terminals forming one of the target channels and a pair of output terminals forming the other target channel, one or more terminals different from the output terminals are arranged.

Preferably, more specifically, for example, the load drive device includes: one or more first power supply terminals which receive the supply of a first voltage; one or more second power supply terminals which receive the supply of a second voltage different from the first voltage; a ground terminal which is kept at a predetermined reference potential; a plurality of external connection terminals which are connected to an external device for the load drive device; and a separate terminal which is different from the first power supply terminal, the second power supply terminal, the ground terminal and the external connection terminals, in each of the channels, power based on the first voltage is supplied from the pair of output terminals to the load, the second voltage itself or a signal based on the second voltage is applied to the external connection terminals, on the same surface, a first terminal group which includes a pair of output terminals forming any one of plurality of channels and which is formed with a plurality of terminals that are aligned adjacent to each other and a second terminal group which includes one or more of the external connection terminals and which is formed with a plurality of other terminals that are aligned adjacent to each other are provided and one or more of the separate terminals are arranged between the first terminal group and the second terminal group.

Preferably, here, for example, in the load drive device, the first terminal group further includes the first power supply terminal, the second terminal group includes two or more of the external connection terminals and the second terminal group further includes the second power supply terminal.

Preferably, for example, in the load drive device, the first voltage is higher than the second voltage, and between the first terminal group and the second terminal group, the separate terminal arranged adjacent to the first terminal group has a withstand voltage equal to or higher than the first voltage.

Preferably, for example, the load drive device further includes a control circuit which includes, for each of the output terminals, an output circuit for supplying power to the load and which controls the output circuits, the control circuit includes a write storage portion into which state specifying data that specifies the state of each of the output circuits is written, writes the state specifying data into the write storage portion based on a predetermined command signal which is received from the external device through any one or more of the plurality of external connection terminals and performs state control on each of the output circuits based on the state specifying data in the write storage portion and a storage region corresponding to a predetermined bit number is provided in the write storage portion for each of the channels as a storage bit of the state specifying data.

Preferably, here, for example, in the load drive device, in the write storage portion, a write memory space corresponding to w bits is defined, w has a value which is equal to or more than the product of an integer greater than the number of the channels and the predetermined bit number and a dummy memory space which does not affect the state of the load drive device including the output circuits and which corresponds to an integral multiple of the predetermined bit number is present in the wright memory space.

Preferably, for example, the load drive device further includes a control circuit which includes, for each of the output terminals, an output circuit for supplying power to the load and which controls the output circuits, the control circuit includes a read storage portion in which state data that indicates the state of each of the output circuits is stored, reads, when receiving a predetermined command signal from the external device through any one or more of the plurality of external connection terminals, the state data from the read storage portion and outputs the read state data through any one or more of the plurality of external connection terminals and a storage region corresponding to a predetermined bit number is provided in the read storage portion for each of the channels as a storage bit of the state data.

Preferably, here, for example, in the load drive device in the read storage portion, a read memory space corresponding to r bits is defined, r has a value which is equal to or more than the product of an integer greater than the number of the channels and the predetermined bit number and a dummy memory space from which a fixed value is read based on the command signal and which corresponds to an integral multiple of the predetermined bit number is present in the read memory space.

A semiconductor device according to the present invention is a semiconductor device which forms the load drive device, and the load drive device is formed with an integrated circuit.

Preferably, for example, in the semiconductor device, a dissipation pad is provided on a housing in which the integrated circuit is sealed.

A load drive system according to the present invention includes: the load drive device; and a processing device which is connected to the load drive device through the plurality of external connection terminals in the load drive device and which serves as the external device.

Preferably, a vehicle in which the load drive system is mounted is formed.

Advantages of the Invention

According to the present invention, it is possible to provide a load drive device, a semiconductor device, a load drive system and a vehicle which have superiority on signal interference, wiring design and the like.

BRIEF DESCRIPTION OF DRAWINGS

FIG. 2 is a diagram showing how constituent components of the load drive system according to the first embodiment of the present invention are mounted on a substrate;

FIG. 3 is a diagram showing how the load drive system according to the first embodiment of the present invention is mounted in a vehicle;

FIGS. 4A and 4B are external perspective views of a driver IC in the first embodiment of the present invention;

FIG. 5 is a diagram showing the pin arrangement of the driver IC in the first embodiment of the present invention;

FIG. 10 is a configuration diagram of a write register (WR1) provided in the driver IC in the first embodiment of the present invention;

FIG. 11 is a configuration diagram of a write register (WR2) provided in the driver IC in the first embodiment of the present invention;

FIG. 12 is a configuration diagram of a read register (RR1) provided in the driver IC in the first embodiment of the present invention;

FIG. 13 is a configuration diagram of a read register (RR2) provided in the driver IC in the first embodiment of the present invention;

FIG. 14 is a configuration diagram of a read register (RR3) provided in the driver IC in the first embodiment of the present invention;

FIG. 15 is a configuration diagram of a read register (RR4) provided in the driver IC in the first embodiment of the present invention;

FIG. 24 is a configuration diagram of a write register (WR2A) provided in the driver IC in the second embodiment of the present invention;

FIG. 25 is a configuration diagram of a read register (RR2A) provided in the driver IC in the second embodiment of the present invention;

FIG. 26 is a configuration diagram of a read register (RR4A) provided in the driver IC in the second embodiment of the present invention;

DESCRIPTION OF EMBODIMENTS

Examples of the embodiment of the present invention will be specifically described below with reference to drawings. In the referenced drawings, the same parts are identified with the same symbols, and descriptions on the same parts will not be repeated in principle. In the present specification, for simplification of description, signs or symbols which represent information, signals, physical quantities, members and the like are provided, and thus the designations of the information, the signals, the physical quantities, the members and the like corresponding to the signs or symbols may be omitted or may be described in short.

First Embodiment

Figure 1:
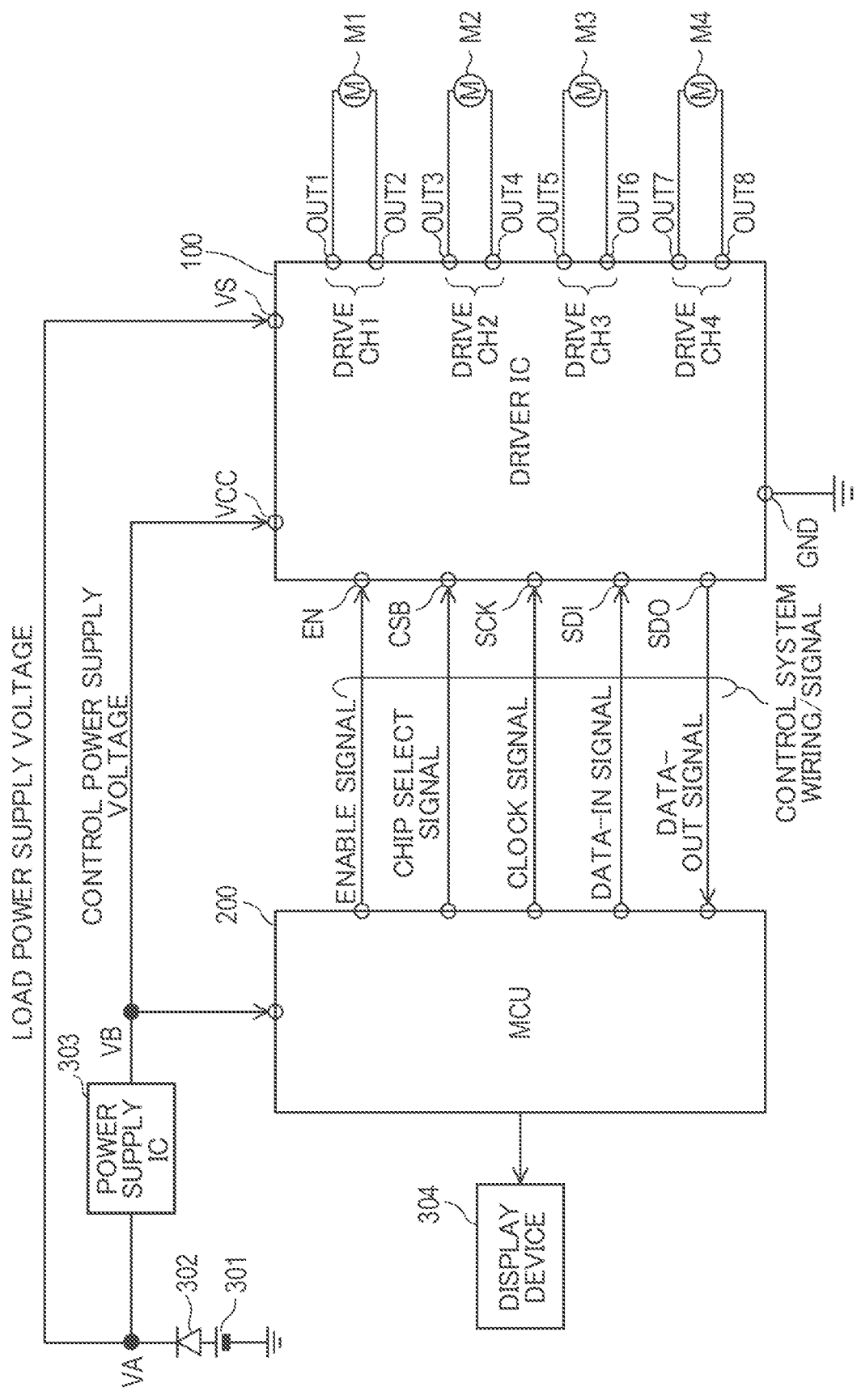
FIG. 1 is an overall configuration diagram of a load drive system according to a first embodiment of the present invention.

A first embodiment of the present invention will be described. FIG. 1 is an overall configuration diagram of a load drive system according to the first embodiment of the present invention. The load drive system of FIG. 1 includes at least a driver IC 100 and an MCU (Micro Control Unit) 200, and can further include all or part of a battery 301, a backflow prevention diode 302, a power supply IC 303 and a display device 304. The load drive system can drive one or more motors, and in this case, the load drive system can also be referred to as a motor drive system. It may be considered that motors M1 to M4 are provided within the motor drive system.

With reference to FIG. 2, the driver IC 100 and the MCU 200 can be mounted on the same substrate SUB. However, the driver IC 100 and the MCU 200 may be mounted on separate substrates. A connector CN is also mounted on the substrate SUB, and terminals OUT1 to OUT8 which will be described later are connected through the connector CN to the corresponding motors.

The battery 301 is a rechargeable battery which outputs an arbitrary direct-current voltage. In the present embodiment, as shown in FIG. 3, the load drive system is assumed to be mounted in a vehicle CC such as an automobile, and in this case, the battery 301 may be a battery which is mounted in the vehicle CC. The output voltage of the battery 301 is supplied through the backflow prevention diode 302 as a direct-current voltage VA to the power supply IC 303. The power supply IC 303 is formed with a linear regulator or the like which is classified into an LDO (Low Dropout), and generates, from the direct-current voltage VA, a direct-current voltage VB whose voltage value is different from that of the direct-current voltage VA and outputs the direct-current voltage VB. Here, the voltage value of the direct-current voltage VB is assumed to be lower than the voltage value of the direct-current voltage VA. For example, the direct-current voltage VA is a direct-current voltage which falls within a range of 6.3 V (volts) to 32 V, and the direct-current voltage VB is a direct-current voltage which falls within a range of 3 V to 5 V.

The direct-current voltage VA is supplied as a load power supply voltage to the driver IC 100, and the direct-current voltage VB is supplied as a control power supply voltage to the driver IC 100 and the MCU 200. In the power supply IC 303, the load power supply voltage VA and the control power supply voltage VB may be generated from the output voltage of the battery 301.

FIGS. 4A and 4B respectively show perspective views of the driver IC 100 which are seen from the front surface side and the back surface side of the driver IC 100. The driver IC 100 is a surface-mounted electronic component, and is formed by sealing a semiconductor integrated circuit in a housing (package) 101 formed of resin. A plurality of metal terminals are protruded from the housing 101, and all or part of the metal terminals are connected to the semiconductor integrated circuit which is sealed in the housing 101. On the back surface of the housing 101, a heat dissipation metal pad (thermal pad for dissipating heat generated in the semiconductor integrated circuit) 102 is provided. When the driver IC 100 is mounted on the substrate SUB as one electronic component, the back surface of the driver IC 100 is opposite the side of the substrate.

FIG. 5 shows the terminal arrangement (so-called pin arrangement) of the driver IC 100. In the driver IC 100, a total of 28 metal terminals are provided in which pin numbers 1 to 28 are assigned. A total of 14 metal terminals in which the pin numbers 1 to 14 are assigned are provided on the first surface of the housing 101 so as to protrude from the first surface, and a total of 14 metal terminals in which the pin numbers 15 to 28 are assigned are provided on the second surface of the housing 101 so as to protrude from the second surface. The first surface and the second surface are different from each other, and are opposite each other.

When a predetermined direction DR which is parallel to the first and second surfaces of the housing 101 is assumed for convenience of description, on the first surface of the housing 101, the metal terminals of the pin numbers 1 to 14 are aligned in the order of the pin numbers along the predetermined direction DR, and on the second surface of the housing 101, the metal terminals of the pin numbers 15 to 28 are aligned in the order of the pin numbers along a direction opposite to the predetermined direction DR. Hence, with respect to an arbitrary one i of natural numbers equal to or more than 1 but equal to or less than 13, the metal terminal of the pin number i and the metal terminal of the pin number (i+1) are adjacent to each other, and the metal terminal of the pin number (i+1) is arranged in a position only a predetermined distance apart in the predetermined direction DR when seen from the metal terminal of the pin number i. Moreover, with respect to an arbitrary one i of natural numbers equal to or more than 15 but equal to or less than 27, the metal terminal of the pin number i and the metal terminal of the pin number (i+1) are adjacent to each other, and the metal terminal of the pin number (i+1) is arranged in a position only the predetermined distance apart in the direction opposite to the predetermined direction DR when seen from the metal terminal of the pin number i. The individual metal terminals are arranged such that the metal terminal of the pin number 1 and the metal terminal of the pin number 28 are opposite each other and that the metal terminal of the pin number 14 and the metal terminal of the pin number 15 are opposite each other. In the following description, the metal terminals may simply be referred to as terminals.

The terminals of the pin numbers 1 to 28 are respectively identified and represented by symbols GND, OUT1, OUT2, VS, NC, SDI, VCC, SDO, EN, TEST1, VS, OUT3, OUT4, GND, GND, OUT5, OUT6, VS, TEST2, NC, GND, CSB, SCK, NC, VS, OUT7, OUT8 and GND. Specifically, for example, the terminal OUT1 indicates the metal terminal of the pin number 2, and the terminal OUT2 indicates the metal terminal of the pin number 3. On the substrate SUB, metal pads (lands) for individually fixing the metal terminals of the pin numbers 1 to 28 are formed, and the metal terminals are joined to the corresponding metal pads by soldering.

In the following description, the terminals OUT1 to OUT8 may be referred to as output terminals. The terminals NC of the pin numbers 5, 20 and 24 are not connected to the semiconductor integrated circuit of the driver IC 100, and do not affect the operation of the driver IC 100 at all. The terminal TEST1 of the pin number 10 and the terminal TEST2 of the pin number 19 are used only in the development and manufacturing stages of the driver IC 100, and are not used when the driver IC 100 is actually operated.

A total of five terminals formed with the terminals GND of the pin numbers 1, 14, 15, 21 and 28 are connected together to each other within the driver IC 100. However, all or part of the five terminals do not need to be connected to each other within the driver IC 100, and may be connected to each other with a pattern on the substrate SUB on which the driver IC 100 is mounted. Although the heat dissipation metal pad 102 (see FIG. 4B) is connected to any one or more of the above-mentioned five terminals within the driver IC 100, the heat dissipation metal pad 102 may be prevented from being connected to any one or more of the above-mentioned five terminals within the driver IC 100.

A total of four terminals formed with the terminals VS of the pin numbers 4, 11, 18 and 25 are connected together to each other within the driver IC 100. However, all or part of the four terminals do not need to be connected to each other within the driver IC 100, and may be connected to each other with the pattern on the substrate SUB on which the driver IC 100 is mounted.

With reference to FIGS. 1 and 5, the load power supply voltage VA is supplied to the individual terminals VS, and the control power supply voltage VB is supplied to the terminal VCC. Hence, the terminal VS can be referred to as the power supply terminal or the load power supply terminal, and the terminal VCC can be referred to as the power supply terminal or the control power supply terminal. When the driver IC 100 is mounted on the substrate SUB, the individual terminals GND are connected to a ground fixed to a reference potential of 0 V (that is, are grounded). Hence, the terminal GND can be referred to as the ground terminal.

As shown in FIG. 1, the motor M1 is connected between the output terminals OUT1 and OUT2 and is driven by supply power from the output terminals OUT1 and OUT2, the motor M2 is connected between the output terminals OUT3 and OUT4 and is driven by supply power from the output terminals OUT3 and OUT4, the motor M3 is connected between the output terminals OUT5 and OUT6 and is driven by supply power from the output terminals OUT5 and OUT6 and the motor M4 is connected between the output terminals OUT7 and OUT8 and is driven by supply power from the output terminals OUT7 and OUT8 (drive CHs 1 to 4 shown in FIG. 1 will be described later).

The terminals EN, CSB, SCK, SDI and SDO are connected to the MCU 200 through control system wiring formed on the substrate SUB. The control system wiring is formed with: wiring which is connected to the terminal EN and through which an enable signal is propagated; wiring which is connected to the terminal CSB and through which a chip select signal is propagated; wiring which is connected to the terminal SCK and through which a clock signal is propagated; wiring which is connected to the terminal SDI and through which a data-in signal is propagated; and wiring which is connected to the terminal SDO and through which a data-out signal is propagated. The signals which are propagated through the control system wiring are collectively referred to as control system signals. Among the control system signals, the enable signal, the chip select signal, the clock signal and the data-in signal are voltage signals which are transmitted from the MCU 200 to the driver IC 100, and the data-out signal is a voltage signal which is transmitted from the driver IC 100 to the MCU 200.

The MCU 200 is formed with a microcomputer which is operated by use of the control power supply voltage VB as a drive voltage, and for example, controls, through the transmission and reception of the control system signals, the operation of the driver IC 100 and the operations of the motors M1 to M4 and monitors the state of the driver IC 100.

In the MCU 200 and the driver IC 100, the MCU 200 functions as a master device, and the driver IC 100 functions as a slave device. The MCU 200 may be able to perform bidirectional communication with a plurality of slave devices. Communication between the MCU 200 and the driver IC 100 is realized by an SPI (Serial Peripheral Interface). The communication using the SPI is realized by the transmission and reception of the chip select signal, the clock signal, the data-in signal and the data-out signal.

The MCU 200 also performs display control on the display device 304 which is formed with a liquid crystal display panel or the like. In addition, the MCU 200 may be able to realize operation control on unillustrated various other devices (for example, sound output control on a speaker mounted in the vehicle CC and drive control on lamps and power windows mounted in the vehicle CC).

Figure 6:
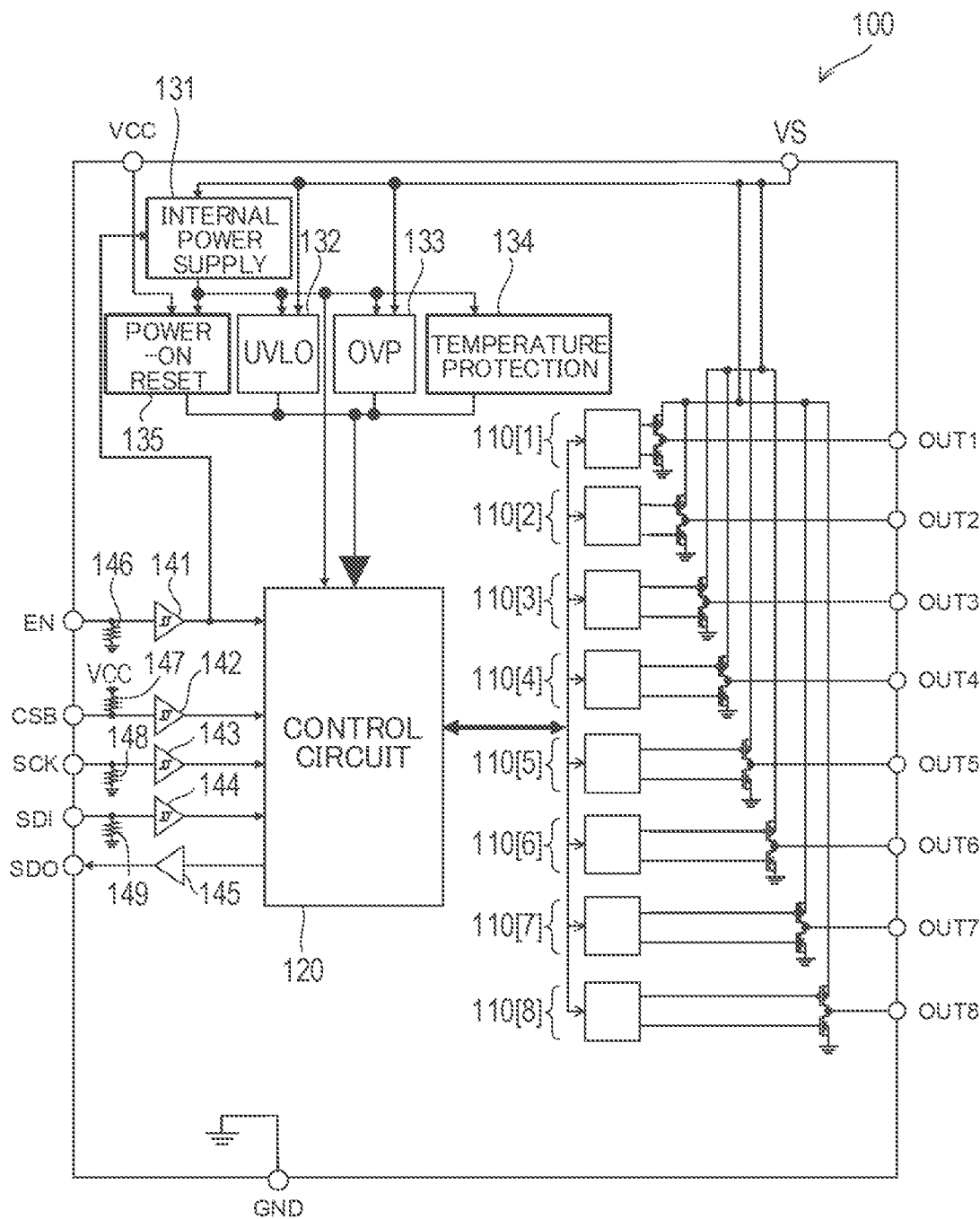
FIG. 6 is a functional block diagram of the driver IC which partially includes a circuit diagram in the first embodiment of the present invention.

FIG. 6 is a functional block diagram of the driver IC 100 which partially includes a circuit diagram. Within the housing 101 of the driver IC 100, individual portions which are represented by symbols 110 [1] to 110 [8], 120, 131 to 135 and 141 to 149 are provided in the form of a semiconductor integrated circuit.

In the driver IC 100, eight unit output circuits are provided, and the eight unit output circuits are represented by symbols 110 [1] to 110 [8]. The unit output circuits 110 [1] to 110 [8] are respectively connected to the output terminals OUT 1 to OUT8, and are circuits for supplying power to loads connected to the output terminals. The configurations and operations of the unit output circuits will be described later, and the other circuits within the driver IC 100 will first be described.

The control circuit 120 follows instructions from the MCU 200 so as to control the operations of the individual unit output circuits. The control circuit 120 is connected to the MCU 200 through the terminals EN, CSB, SCK, SDI and SDO, and can perform bidirectional communication with the MCU 200 through the SPI.

The internal power supply circuit 131 generates, based on the supply voltage to the terminal VS (that is, the load power supply voltage VA; see FIG. 1), an internal power supply voltage having a predetermined voltage value (for example, 3.3 V or 5 V). The internal power supply voltage is used as a power supply voltage, and thus the control circuit 120, a UVLO (Under Voltage Lock Out) circuit 132, an OVP circuit 133, a temperature protection circuit 134 and a power-on reset circuit 135 are operated.

The UVLO circuit 132 determines whether or not the supply voltage to the terminal VS is excessively low (whether or not the supply voltage is in a reduced voltage state) so as to transmit the result of the determination to the control circuit 120. When the supply voltage to the terminal VS is equal to or less than a predetermined UVLO determination voltage, it is determined that the supply voltage is in the reduced voltage state, and thus the control circuit 120 performs necessary processing including processing in which all power transistors connected to the output terminals OUT 1 to OUT8 are kept off.

The OVP circuit 133 determines whether or not the supply voltage to the terminal VS is excessively high (whether or not the supply voltage is in an overvoltage state) so as to transmit the result of the determination to the control circuit

120. When the supply voltage to the terminal VS is equal to or more than a predetermined OVP determination voltage which is higher than the UVLO determination voltage, it is determined that the supply voltage is in the overvoltage state, and thus the control circuit 120 performs necessary processing including processing in which all power transistors connected to the output terminals OUT 1 to OUT8 are kept off.

The temperature protection circuit 134 receives the result of detection of a temperature sensor which detects the temperature of a predetermined portion within the driver IC 100, and when the detected temperature falls within a predetermined warning temperature range, the temperature protection circuit 134 determines that the temperature is in a warning temperature state which corresponds to thermal warning whereas when the detected temperature exceeds the predetermined warning temperature range, the temperature protection circuit 134 determines that the temperature is in a shutdown temperature state which corresponds to thermal shutdown. The predetermined warning temperature range is a range which is equal to or more than a predetermined warning temperature but is less than a predetermined shutdown temperature which is higher than the warning temperature. In a plurality of portions, the temperatures thereof may be detected. In this case, when any one of the detected temperatures exceeds the predetermined warning temperature range, it is determined that the temperature is in the shutdown temperature state whereas when the detected temperatures do not exceed the predetermined warning temperature range but any one of the detected temperatures falls within the predetermined warning temperature range, it is determined that the temperature is in the warning temperature state. The result of determination of the temperature protection circuit 134 is transmitted to the control circuit 120. When it is determined that the temperature is in the shutdown temperature state, the control circuit 120 performs necessary processing including forced-off processing in which all the power transistors connected to the output terminals OUT 1 to OUT8 are kept off. The control circuit 120 does not need to perform the forced-off processing when it is determined that the temperature is in the warning temperature state. When it is determined that the temperature is in the warning temperature state or in the shutdown temperature state, the control circuit 120 can transmit a warning signal indicating the information thereof to the MCU 200 through communication using the SPI.

The power-on reset circuit 135 compares the supply voltage to the terminal VCC (that is, the control power supply voltage VB; see FIG. 1) with a predetermined reset determination voltage, and when the supply voltage to the terminal VCC is less than the reset determination voltage, the power-on reset circuit 135 outputs a low-level determination signal to the control circuit 120 whereas when the supply voltage to the terminal VCC is equal to or more than the reset determination voltage, the power-on reset circuit 135 outputs, to the control circuit 120, a high-level determination signal which has a potential higher than the low-level determination signal. The high-level determination signal functions as a reset release signal, and thus the control circuit 120 receives the high-level determination signal so as to start up. When the low-level determination signal is supplied to the control circuit 120, the operation of the control circuit 120 is stopped.

Signals which are applied to the terminals EN, CSB, SCK, SDI and SDO are digital signals which have a low-level potential or a high-level potential higher than the low-level potential. The control circuit 120 outputs, through an output buffer 145, the data-out signal to the terminal SDO serving as a data-out terminal. The circuit for outputting the data-out signal is not limited to this circuit. For example, the data-out signal may be output in a configuration in which instead of the output buffer 145, a transistor having a collector or a drain in an open state is provided in the driver IC 100, in which the collector or the drain is connected to the terminal SDO and in which a resistance element is connected to the terminal SDO as an external component of the driver 100.

The terminal EN serving as an enable terminal is connected to the input of a Schmitt trigger buffer 141, and is also connected to the ground through a resistor 146 (that is, is pulled down), and the output signal of the Schmitt trigger buffer 141 is input to the control circuit 120.

The terminal CSB serving as a chip select terminal is connected to the input of a Schmitt trigger buffer 142, and is also connected to the terminal VCC through a resistor 147 (that is, is pulled up), and the output signal of the Schmitt trigger buffer 142 is input to the control circuit 120.

The terminal SCK serving as a clock terminal is connected to the input of a Schmitt trigger buffer 143, and is also connected to the ground through a resistor 148 (that is, is pulled down), and the output signal of the Schmitt trigger buffer 143 is input to the control circuit 120.

The terminal SDI serving as a data-in terminal is connected to the input of a Schmitt trigger buffer 144, and is also connected to the ground through a resistor 149 (that is, is pulled down), and the output signal of the Schmitt trigger buffer 144 is input to the control circuit 120.

Hence, the enable signal, the chip select signal, the clock signal and the data-in signal (see FIG. 1) which are output from the MCU 200 are transmitted to the control circuit 120 without logical inversion (switching from the low-level to the high-level or switching from the high-level to the low-level) being performed. The same is true for the data-out signal which is transmitted from the control circuit 120 to the MCU 200. The circuit may be changed such that any one of those signals is subjected to logical inversion in a process in which the signal is transmitted between the MCU 200 and the control circuit 120. The Schmitt trigger buffers 141 to 144 and the output buffer 145 are driven based on the supply voltage to the terminal VCC.

Only when the enable signal is high, the individual operations in the driver IC 100 described above are realized. When the enable signal is low, the internal power supply circuit 131 is not operated (the internal power supply voltage is not generated), and thus the operations of the individual circuits including the control circuit 120 within the driver IC 100 are stopped, with the result that the power consumption of the driver IC 100 is substantially zero. When the operation of the control circuit 120 is stopped, all the power transistors connected to the output terminals OUT 1 to OUT8 are turned off. In the following description, unless otherwise specified, the enable signal is assumed to be kept high.

The chip select signal is turned low, and thus the driver IC 100 is selected from a plurality of slave devices including the driver IC 100, and only when the chip select signal is low, communication between the driver IC 100 and the MCU 200 is enabled. The reason why the terminals EN, CSB, SCK and SDI are pulled down or pulled up within the driver IC 100 is that when those terminals are opened such as by a disconnection between the driver IC 100 and the MCU 200, the driver IC 100 is set to a state on a safety side (on a side where the operation of the driver IC 100 is stopped for the terminal EN, on a side where the communication described above is disabled for the terminal CSB or on a side where the clock signal and the data-in signal which are valid are not input for the terminals SCK and SDI).

Figure 7:
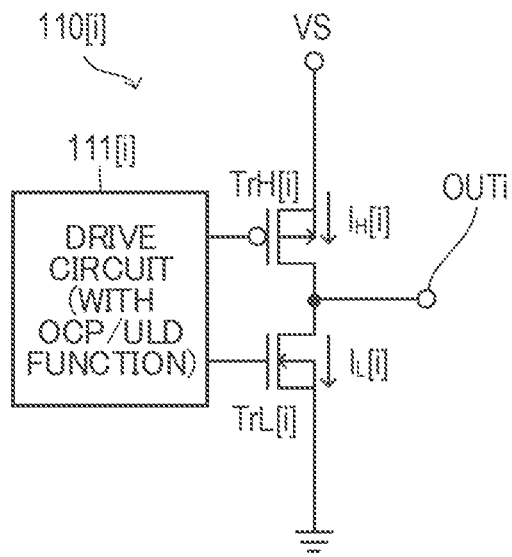
FIG. 7 is a configuration diagram of one unit output circuit included in the driver IC in the first embodiment of the present invention.

The configuration of the unit output circuit will be described with reference to FIG. 7. FIG. 7 is a configuration diagram of one unit output circuit. Since the configuration of the unit output circuit is the same in the unit output circuits 110 [1] to 110 [8], the configuration of a unit output circuit 110 [i] which is any one of the unit output circuits 110 [1] to 110 [8] will be described (here, i is an integer of 1 or more but 8 or less). For convenience, the output terminal which is connected to the unit output circuit 110 [i] is represented by "OUTi". When in the output terminals OUTi, i is 1, 2, 3, 4, 5, 6, 7 and 8, they respectively indicate output terminals OUT1, OUT2, OUT3, OUT4, OUT5, OUT6, OUT7 and OUT8.

The unit output circuit 110 [i] includes: a drive circuit (hereinafter simply referred to as a drive circuit) 111 [i] with functions of overcurrent protection (OCP) and low load detection (ULD); and a power transistor TrH [i] on the side of a high side and a power transistor TrL [i] on the side of a low side. The power transistor TrH [i] is formed as a p-channel MOSFET (MOS field-effect transistor; metal-oxide-semiconductor field-effect transistor), and the power transistor TrL [i] is formed as an n-channel MOSFET. A half-bridge circuit is formed with a series connection circuit of the power transistors TrH [i] and TrL [i]. Specifically, the supply voltage (that is, the load power supply voltage VA; see FIG. 1) to the terminal VS is applied to the source of the power transistor TrH [i], and the drains of the power transistors TrH [i] and TrL [i] and the output terminal OUTi are connected together to each other. The source of the power transistor TrL [i] is connected to the ground. The drive circuit 111 [i] is connected to the gates of the power transistors TrH [i] and TrL [i], the gate voltages thereof are controlled and thus the power transistors TrH [i] and TrL [i] are individually turned on and off. The drive circuit 111 [i] has the function of preventing the power transistors TrH [i] and TrL [i] from being simultaneously turned on. The individual power transistors may be formed with bipolar transistors.

The drive circuit 111 [i] can individually detect the current values of currents which flow through the power transistors TrH [i] and TrL [i], the detection value (hereinafter referred to as a current value $I_H$ [i]) of the current flowing through the power transistor TrH [i] and the detection value (hereinafter referred to as a current value $I_L$ [i]) of the current flowing through the power transistor TrL [i] are referenced and thus the overcurrent protection and the low load detection are realized.

Specifically, in the overcurrent protection, the drive circuit 111 [i] compares each of the current values $I_H$ [i] and $I_L$ [i] with a predetermined overcurrent protection threshold value, and when the current value $I_H$ [i] is equal to or more than the overcurrent protection threshold value, the drive circuit 111 [i] determines that the power transistor TrH [i] is in an overcurrent state (that is, that an overcurrent flows through the power transistor TrH [i]) so as to instantly turn off the power transistor TrH [i] whereas when this is not true, the drive circuit 111 [i] determines that the power transistor TrH [i] is not in the overcurrent state. Likewise, when the current value $I_L$ [i] is equal to or more than the overcurrent protection threshold value, the drive circuit 111 [i] determines that the power transistor TrL [i] is in the overcurrent state (that is, that an overcurrent flows through the power transistor TrL [i]) so as to instantly turn off the power transistor TrL [i] whereas when this is not true, the drive circuit 111 [i] determines that the power transistor TrL [i] is not in the overcurrent state. The results of the determinations are transmitted to the control circuit 120. Although in the present embodiment, an overcurrent latch method is assumed to be adopted in which once it is determined that the power transistor TrH [i] is in the overcurrent state, and thus the power transistor TrH [i] is turned off, the power transistor TrH [i] is kept in an off-state, for example, unless power is turned off or an instruction from the MCU 200 is provided, a self-return method may be adopted in which when the cancellation of the overcurrent state of the power transistor TrH [i] is recognized, the power transistor TrH [i] is allowed to be turned on (the same is true for the power transistor TrL [i]).

In the low load detection, when the current value $I_H$ [i] after a predetermined mask time has elapsed since the turning on of the power transistor TrH [i] or the current value $I_L$ [i] after the predetermined mask time has elapsed since the turning on of the power transistor TrL [i] is less than a predetermined low load detection threshold value, the drive circuit 111 [i] determines that the unit output circuit 110 [i] is in a low load state (that is, that the load connected to the output terminal OUTi of the unit output circuit 110 [i] is a low load) whereas when this is not true, the drive circuit 111 [i] does not determine that the unit output circuit 110 [i] is in the low load state. The results of the determinations are transmitted to the control circuit 120. For example, when the load is not connected to the output terminal OUTi (the wiring between the output terminal OUTi and the load is disconnected), it is determined that the unit output circuit 110 [i] is in the low load state. Naturally, the low load detection threshold value is less than the overcurrent protection threshold value. Unlike the overcurrent state, when it is determined that the unit output circuit 110 [i] is in the low load state, the drive circuit 111 [i] does not need to turn off, based on the result of the determination, the power transistor which is on within the unit output circuit 110 [i].

One drive CH (drive channel) can be formed with two unit output circuits. A drive CH formed with the unit output circuits 110 [1] and 110 [2], a drive CH formed with the unit output circuits 110 [3] and 110 [4], a drive CH formed with the unit output circuits 110 [5] and 110 [6] and a drive CH formed with the unit output circuits 110 [7] and 110 [8] are respectively referred to as a drive CH 1, a drive CH 2, a drive CH 3 and a drive CH 4 (see FIG. 1). As the motors M1 to M4, direct-current motors (such as a direct-current motor with a brush) can be adopted, in each of the drive CHs, a full bridge circuit is formed and thus the individual motors can be bidirectionally driven. The motors M1 to M4 may have the same configuration or any two of the motors may have different configurations.

Figure 8:
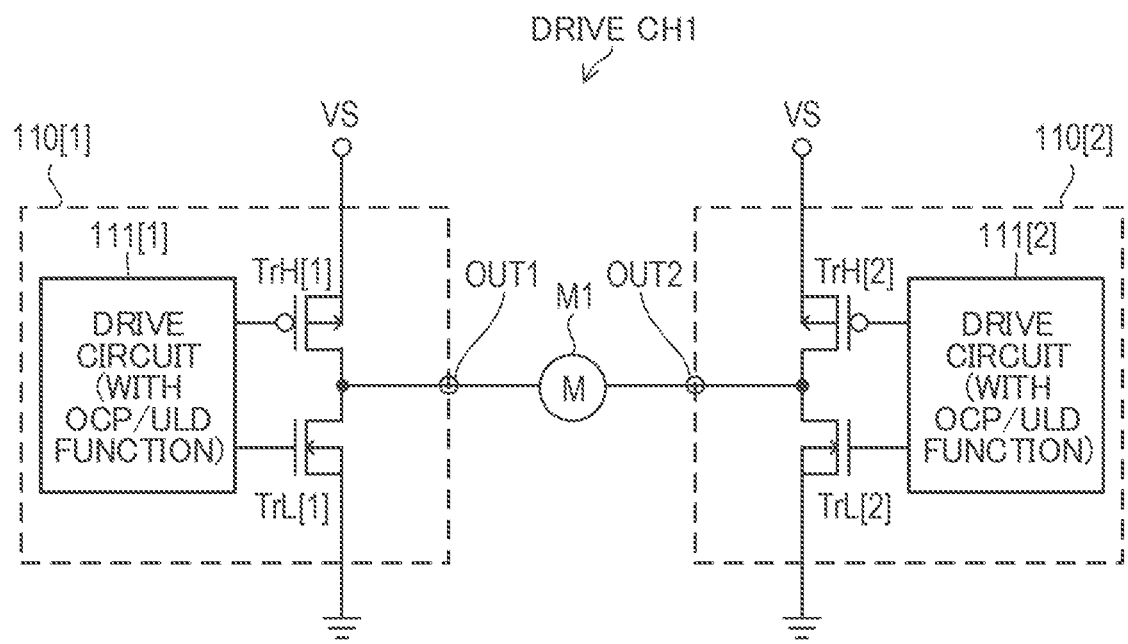
FIG. 8 is a diagram showing a connection relationship between two unit output circuits and a motor.

FIG. 8 is a diagram showing a connection relationship between the two unit output circuits 110 [1] and 110 [2] forming the drive CH 1 and the motor M1. The output terminal OUT [1] is connected to the positive terminal of the motor M1, and the output terminal OUT [2] is connected to the negative terminal of the motor M1. The motor M1 is a direct-current motor which is rotated forward (rotated in a first direction) when a current is passed from the positive terminal to the negative terminal and which is rotated backward (rotated in a second direction opposite to the first direction) when a current is passed from the negative terminal to the positive terminal. Hence, when the power transistors TrH [1], TrL [1], TrH [2] and TrL [2] are respectively turned on, turned off, turned off and turned on, a current is passed from the terminal OUT1 through the motor M1 to the terminal OUT2, and thus the motor M1 is rotated forward whereas when the power transistors TrH [1], TrL [1], TrH [2] and TrL [2] are respectively turned off, turned on, turned on and turned off, a current is passed from the terminal OUT2 through the motor M1 to the terminal OUT1, and thus the motor M1 is rotated backward. In the drive CHs other than the drive CH 1, the connection relationship between the two unit output circuits and the corresponding motor and the method of driving the motor are the same as in the drive CH 1.

The driver IC 100 includes write registers which write data based on instructions from the MCU 200 and read registers which can only read data from the MCU 200.

Figure 9:
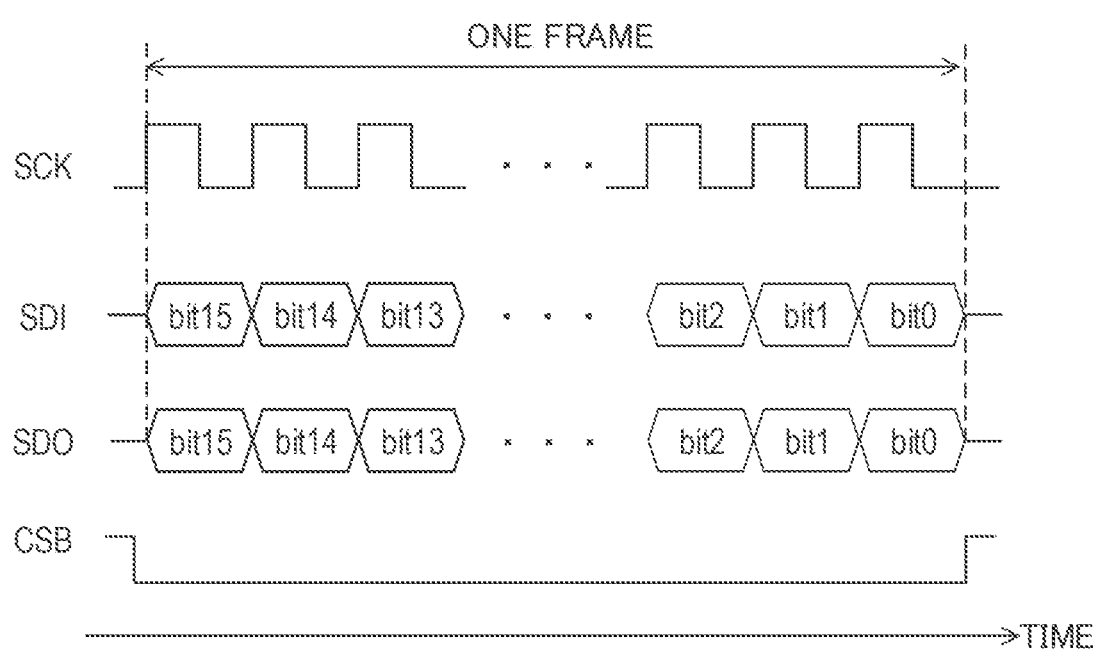
FIG. 9 is a diagram showing an outline of one frame in SPI communication.

As shown in FIG. 9, the communication between the MCU 200 and the driver IC 100 is the SPI communication in which one frame is a unit. One frame has a data length corresponding to 16 bits. Specifically, in one frame, the MCU 200 can supply the clock signals corresponding to 16 clocks to the terminal SCK, and transmit the data-in signals corresponding to 16 bits to the terminal SDI in synchronization with the clock signals, and the control circuit 120 can transmit the data-out signals corresponding to 16 bits from the terminal SDO to the MCU 200 in synchronization with the clock signals. Numeric values 0 to 15shown in FIG. 9 represent bit numbers in one frame which is noted, and data is transmitted and received in descending order of the bit numbers from the data of the bit number 15 toward the data of the bit number 0. The data of each of the bit numbers is binary data, and the value of "1" or "0" is acquired.

The MCU 200 performs communication either in a write & read register mode in which the writing of data into the write register of the driver IC 100 and the reading of data from the read register of the driver IC 100 are performed simultaneously or in a read register mode in which only the reading of data from the read register of the driver IC 100 is performed.

FIGS. 10 and 11 show the details of the write registers WR1 and WR2 incorporated in the driver IC 100. FIGS. 12 to 15 show the details of the read registers RR1 to RR4 incorporated in the driver IC 100. Each of the write registers and the read registers has a storage region which corresponds to 16 bits and in which bit numbers 15 to 0 are assigned. The individual write registers and the individual read registers are included in the control circuit 120 or are provided outside the control circuit 120.

When the data of the bit number 15 in the data-in signal is "1", the write & read register mode is entered whereas the data of the bit number 15 in the data-in signal is "0", the read register mode is entered. A write register into which data is actually written in the write & read register mode is referred to as a target write register, and a read register from which data is actually read in the write & read register mode or the read register mode is referred to as a target read register.

In the write & read register mode, by the data of the bit number 14 in the data-in signal, any one of the write registers WR1 and WR2 is selected as the target write register. Specifically, in the write & read register mode, when the data of the bit number 14 in the data-in signal is "0", the write register WR1 is selected as the target write register whereas when the data of the bit number 14 in the data-in signal is "1", the write register WR2 is selected as the target write register.

In the write & read register mode or the read register mode, by the data of the bit numbers 14 and 13 in the data-in signal, any one of the read registers RR1 to RR4 is selected as the target read register. Specifically, in the write & read register mode or the read register mode, when the data of the bit number 14 and the data of the bit number 13 in the data-in signal are respectively "0" and "0", the read register RR1 is selected as the target read register, when the data of the bit number 14 and the data of the bit number 13 in the data-in signal are respectively "1" and "0", the read register RR2 is selected as the target read register, when the data of the bit number 14 and the data of the bit number 13 in the data-in signal are respectively "0" and "1", the read register RR3 is selected as the target read register and when the data of the bit number 14 and the data of the bit number 13 in the data-in signal are respectively "1" and "1", the read register RR4 is selected as the target read register.

In the write & read register mode, the control circuit 120 performs write processing in which the data of the bit numbers 15 to 0 in the data-in signal is written into the bits (storage region) of the bit numbers 15 to 0 in the target write register, and simultaneously performs read processing in which the data stored in the bits (storage region) of the bit numbers 15 to 0 in the target read register is read and in which the read data is output from the terminal SDO as the data of the bit numbers 15 to 0 in the data-out signal. In the read register mode, only the read processing of the write processing and the read processing is performed.

However, since the target write register is not fixed until the data of the bit number 14 in the data-in signal is received, in actuality, in the write & read register mode, the data of the bit numbers 15 and 14 in the data-in signal may be written into the bits (storage region) of the bit numbers 15 and 14 in both the write registers WR1 and WR2. Since the target read register is not fixed until the data of the bit number 13 in the data-in signal is received, in actuality, in the write & read register mode or the read register mode, the data of the bit numbers 15 to 13 in the data-out signal may be data stored in the bits of the bit numbers 15 to 13 in an arbitrary one of the read registers RR1 to RR4. Although details will be described later, the data stored in the bits of the bit numbers 15 to 13 in the read register is the same in the read registers RR1 to RR4, and thus no problem occurs.

The data-in signal transmitted from the MCU 200 to the driver IC 100 by the SPI communication can be said to be a write & read command signal which provides an instruction to perform the write processing and the read processing in the write & read register mode, and can be said to be a read command signal which provides an instruction to perform the read processing in the read register mode. A communication protocol may be changed such that a write command signal which provides an instruction to perform only the write processing can be transmitted from the MCU 200 to the driver IC 100. In this case, the MCU 200 may be able to transmit the write command signal instead of the write & read command signal.

The write registers WR1 and ER2 will be described in detail (see FIGS. 10 and 11). The roles of the bit numbers 15 to 13 in each of the write registers are as described above. The bits of the bit numbers 12 in the write registers WR1 and WR2 are intended to reset all the registers. When "1" is written into the bit of the bit number 12 in the write register WR1 or WR2, the control circuit 120 performs logic reset processing for setting all the bits in the registers WR1 and WR2 and RR1 to RR4 to "0". The initial values of all the bits in the write registers WR1 and WR2 are "0".

The bits of the bit numbers 4 to 11 in the write registers WR1 and WR2 are bits for specifying the on/off states of the power transistors in each of the unit output circuits. Specifically, the bits of the bit numbers 4, 5, 6, 7, 8, 9, 10 and 11 in the write register WR1 are respectively on/off specifying bits which correspond to the power transistors TrL [1], TrH [1], TrL [2], TrH [2], TrL [3], TrH [3], TrL [4] and TrH [4], and the bits of the bit numbers 4, 5, 6, 7, 8, 9, 10 and 11 in the write register WR2 are respectively on/off specifying bits which correspond to the power transistors TrL [5], TrH [5], TrL [6], TrH [6], TrL [7], TrH [7], TrL [8] and TrH [8]. When a certain on/off specifying bit is "1", the control circuit 120 turns on the power transistor corresponding to the on/off specifying bit whereas when a certain on/off specifying bit is "0", the control circuit 120 turns off the power transistor corresponding to the on/off specifying bit.

The bits of the bit numbers 3 to 0 in the write register WR1 and the bits of the bit numbers 3 and 0 in the write register WR2 are bits related to the turning on and off of a low load detection function in drive circuits 111 [1] to 111 [8], whether or not the results of detection of the temperature protection circuit 134, the OVP circuit 133 and the UVLO circuit 132 are latched, the setting of the OVP determination voltage and the setting of a test mode utilized at the time of design and manufacturing of the driver IC 100, and here, the detailed description of the bits will be omitted. The bits of the bit numbers 2 and 1 in the write register WR2 are reserve bits. The reserve bits are bits which are not used when the driver IC 100 is actually operated, and writing into the reserve bits is disabled.

The read registers RR1 to RR4 will then be described in detail (see FIGS. 12 to 15). In the read registers RR1 and RR2, the initial values of the bit numbers 15 to 0 are 0, 1, 1, 0, 0, 0, 0, 0, 0, 0, 0, 0, 1, 1, 1 and 1, respectively. In the read registers RR3 and RR4, the initial values of the bit numbers 15 to 0 are 0, 1, 1, 0, 1, 1, 1, 1, 1, 1, 1, 1, 1, 1, 1 and 1, respectively. In the read registers RR1 to RR4, the bits of the bit numbers 15 and 12 are bits which are not used, and invalid data is stored in the bits.

With respect to the read registers, the same data is stored in the bits of the bit numbers 14 in the read registers RR1 to RR4, and the same data is stored in the bits of the bit numbers 13 in the read registers RR1 to RR4. The control circuit 120 stores, in the bits of the bit numbers 14 and 13 in the read registers RR1 to RR4, data based on information from the temperature protection circuit 134. Specifically, when in the temperature protection circuit 134, it is determined that the temperature is in the shutdown temperature state, "1" is stored in the bits of the bit numbers 14 in the read registers RR1 to RR4 whereas when this is not true, "0" is stored in the bits. When in the temperature protection circuit 134, it is determined that the temperature is in the warning temperature state, "1" is stored in the bits of the bit numbers 13 in the read registers RR1 to RR4 whereas when this is not true, "0" is stored in the bits.

Once in the temperature protection circuit 134, it is determined that the temperature is in the shutdown temperature state, the data of the bits (that is, the bits of the bit numbers 14 in the read registers RR1 to RR4) into which "1" is written based on the result of the determination may be latched until a predetermined condition is satisfied (that is, for example, may be held until the logic reset processing described above is performed).

Likewise, once in the temperature protection circuit 134, it is determined that the temperature is in the warning temperature state, the data of the bits (that is, the bits of the bit numbers 13 in the read registers RR1 to RR4) into which "1" is written based on the result of the determination may be latched until a predetermined condition is satisfied (that is, for example, may be held until the logic reset processing described above is performed).

In actuality, whether or not the latching described above is performed on the shutdown temperature state and the warning temperature state is determined by the data which is written into the bit of the bit number 2 in the write register WR1.

With respect to the read registers, the same data is stored in the bits of the bit numbers 1 in the read registers RR1 and RR2, and the same data is stored in the bits of the bit numbers 0 in the read registers RR1 and RR2.

The control circuit 120 stores, in the bits of the bit numbers 1 in the read registers RR1 and RR2, data based on information from the OVP circuit 133. Specifically, when in the OVP circuit 133, it is determined that the voltage is in the overvoltage state, "1" is stored in the bits of the bit numbers 1 in the read registers RR1 and RR2 whereas when this is not true, "0" is stored in the bits.

The control circuit 120 stores, in the bits of the bit numbers 0 in the read registers RR1 and RR2, data based on information from the UVLO circuit 132. Specifically, when in the UVLO circuit 132, it is determined that the voltage is in the reduced voltage state, "1" is stored in the bits of the bit numbers 0 in the read registers RR1 and RR2 whereas when this is not true, "0" is stored in the bits.

Once in the OVP circuit 133, it is determined that the voltage is in the overvoltage state, the data of the bits (that is, the bits of the bit numbers 1 in the read registers RR1 and RR2) into which "1" is written based on the result of the determination may be latched until a predetermined condition is satisfied (that is, for example, may be held until the logic reset processing described above is performed).

Likewise, once in the UVLO circuit 132, it is determined that the voltage is in the reduced voltage state, the data of the bits (that is, the bits of the bit numbers 0 in the read registers RR1 and RR2) into which "1" is written based on the result of the determination may be latched until a predetermined condition is satisfied (that is, for example, may be held until the logic reset processing described above is performed).

In actuality, whether or not the latching described above is performed on the overvoltage state and the reduced voltage state is determined by the data which is written into the bit of the bit number 1 in the write register WR1.

The bits of the bit numbers 4 to 11 in the read registers RR1 and RR2 are bits for indicating the on/off states of the power transistors in each of the unit output circuits.

When the control circuit 120 writes data into the individual bits in the write registers WR1 and WR2 based on the reception of the write & read command signal, the control circuit 120 turns on or off, according to the written data, the power transistors in each of the unit output circuits. Simultaneously therewith or thereafter, the control circuit 120 stores data indicating the states of the power transistors (that is, whether the power transistors are on or off) in each of the unit output circuits in the bits of the bit numbers 4 to 11 in the read registers RR1 and RR2. The control circuit 120 may periodically update the data stored in the bits of the bit numbers 4 to 11 in the read registers RR1 and RR2.

The bits of the bit numbers 4, 5, 6, 7, 8, 9, 10 and 11 in the read register RR1 are respectively on/off state bits which correspond to the power transistors TrL [1], TrH [1], TrL [2], TrH [2], TrL [3], TrH [3], TrL [4] and TrH [4], and the bits of the bit numbers 4, 5, 6, 7, 8, 9, 10 and 11 in the read register RR2 are respectively on/off state bits which correspond to the power transistors TrL [5], TrH [5], TrL [6], TrH [6], TrL [7], TrH [7], TrL [8] and TrH [8]. When a certain power transistor is on, "1" is stored in the on/off state bit corresponding to the power transistor whereas when a certain power transistor is off, "0" is stored in the on/off state bit corresponding to the power transistor.

In the bits of the bit numbers 0 to 7 in the read registers RR3 and RR4, data indicating whether or not an overcurrent is present is stored for each of the unit output circuits and for each of the power transistors.

The bits of the bit numbers 0, 1, 2, 3, 4, 5, 6 and 7 in the read register RR3 are respectively individual overcurrent state bits which correspond to the power transistors TrL [1], TrH [1], TrL [2], TrH [2], TrL [3], TrH [3], TrL [4] and TrH [4], and the bits of the bit numbers 0, 1, 2, 3, 4, 5, 6 and 7 in the read register RR4 are respectively individual overcurrent state bits which correspond to the power transistors TrL [5], TrH [5], TrL [6], TrH [6], TrL [7], TrH [7], TrL [8] and TrH [8].

In the unit output circuit 110 [i], when it is determined by the drive circuit 111 [i] that a certain power transistor is in the overcurrent state, "1" is stored in the individual overcurrent state bit corresponding to the power transistor whereas when it is not determined that a certain power transistor is in the overcurrent state, "0" is stored in the individual overcurrent state bit corresponding to the power transistor.

In the bit of the bit number 3 in the read register RR1, the logical sum of data in the bits of the bit numbers 0 to 7 in the read register RR3 is stored, and in the bit of the bit number 3 in the read register RR2, the logical sum of data in the bits of the bit numbers 0 to 7 in the read register RR4 is stored.

Specifically, when it is determined that at least one of a total of eight power transistors included in the unit output circuits 110 [1] to 110 [4] is in the overcurrent state, "1" is stored in the bit of the bit number 3 in the read register RR1 whereas only when this is not true, "0" is stored in the bit of the bit number 3 in the read register RR1. Likewise, when it is determined that at least one of a total of eight power transistors included in the unit output circuits 110 [5] to 110 [8] is in the overcurrent state, "1" is stored in the bit of the bit number 3 in the read register RR2 whereas only when this is not true, "0" is stored in the bit of the bit number 3 in the read register RR2.

In the following description, the bit of the bit number 3 in the read register RR1 or RR2 may be referred to as a logical sum overcurrent state bit.

Once it is determined that a certain power transistor is in the overcurrent state, the data of the individual overcurrent state bit and the logical sum overcurrent state bit into which "1" is written based on the result of the determination is latched until a predetermined condition is satisfied (that is, for example, is held until the logic reset processing described above is performed).

In the bits of the bit numbers 8 to 11 in the read registers RR3 and RR4, for each of the unit output circuits, data indicating whether or not the unit output circuit is in the low load state is stored.

The bits of the bit numbers 8, 9, 10 and 11 in the read register RR3 are respectively individual low load state bits which correspond to the unit output circuit 110 [1] connected to the output terminal OUT1, the unit output circuit 110 [2] connected to the output terminal OUT2, the unit output circuit 110 [3] connected to the output terminal OUT3 and the unit output circuit 110 [4] connected to the output terminal OUT4, and the bits of the bit numbers 8, 9, 10 and 11 in the read register RR4 are respectively individual low load state bits which correspond to the unit output circuit 110 [5] connected to the output terminal OUT5, the unit output circuit 110 [6] connected to the output terminal OUT6, the unit output circuit 110 [7] connected to the output terminal OUT7 and the unit output circuit 110 [8] connected to the output terminal OUT8.

In the unit output circuit 110 [i], when it is determined by the drive circuit 111 [i] that the unit output circuit 110 [i] is in the low load state, "1" is stored in the individual low load state bit corresponding to the unit output circuit 110 [i] whereas when it is not determined that the unit output circuit 110 [i] is in the low load state, "0" is stored in the individual low load state bit corresponding to the unit output circuit 110 [i].

In the bit of the bit number 2 in the read register RR1, the logical sum of data in the bits of the bit numbers 8 to 11 in the read register RR3 is stored, and in the bit of the bit number 2 in the read register RR2, the logical sum of data in the bits of the bit numbers 8 to 11 in the read register RR4 is stored.

Specifically, when it is determined that at least one of the unit output circuits 110 [1] to 110 [4] is in the low load state, "1" is stored in the bit of the bit number 2 in the read register RR1 whereas only when this is not true, "0" is stored in the bit of the bit number 2 in the read register RR1. Likewise, when it is determined that at least one of the unit output circuits 110 [5] to 110 [8] is in the low load state, "1" is stored in the bit of the bit number 2 in the read register RR2 whereas only when this is not true, "0" is stored in the bit of the bit number 2 in the read register RR2.

In the following description, the bit of the bit number 2 in the read register RR1 or RR2 may be referred to as a logical sum low load state bit.

Once it is determined that a certain unit output circuit is in the low load state, the data of the individual low load state bit and the logical sum low load state bit into which "1" is written based on the result of the determination is latched until a predetermined condition is satisfied (that is, for example, is held until the logic reset processing described above is performed).

As described above, the driver IC 100 can detect various types of abnormalities, and can be said to include an abnormality detection circuit for detecting an abnormality (detecting whether or not an abnormality occurs). The abnormalities to be detected include: an abnormality caused by the overcurrent state and an abnormality caused by the low load state which are detected with the drive circuit 111 [i] (see FIG. 7); an abnormality caused by the reduced voltage state which is detected with the UVLO circuit 132 (see FIG. 6); an abnormality caused by the overvoltage state which is detected with the OVP circuit 133 (see FIG. 6); and an abnormality caused by the warning temperature state or the shutdown temperature state which is detected with the temperature protection circuit 134 (see FIG. 6).

[Terminal Arrangement (Part 1)]

Figure 16:
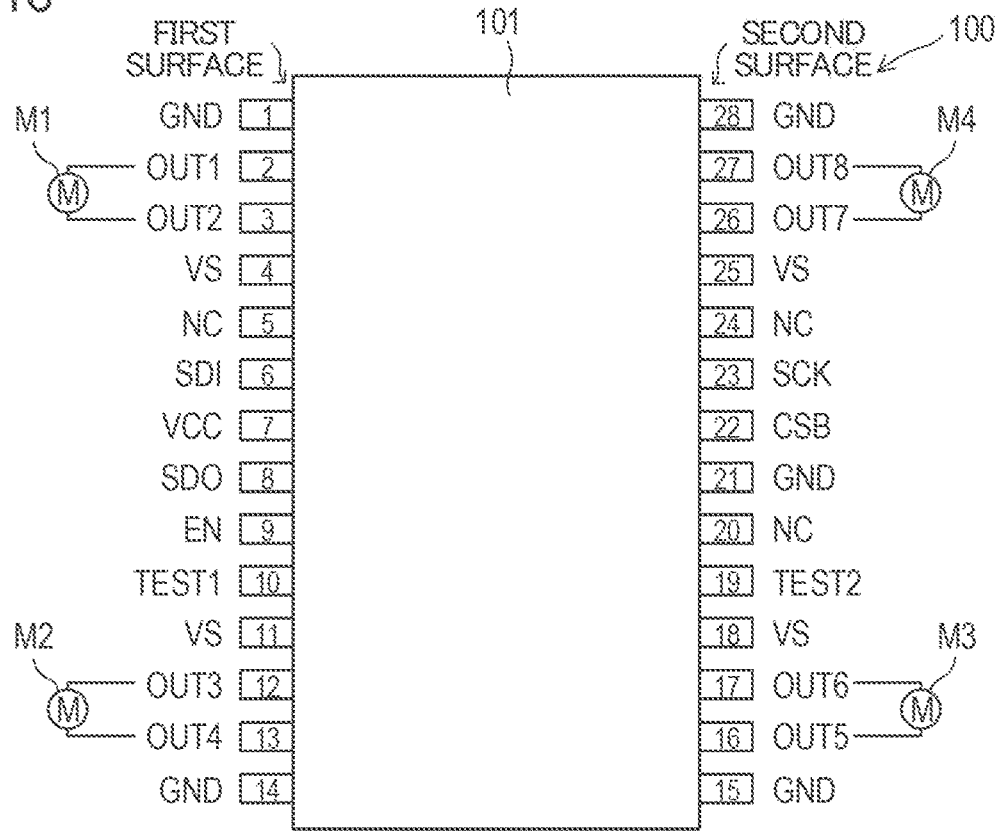
FIG. 16 is a diagram showing a connection relationship between individual drive CHs and motors in the driver IC in the first embodiment of the present invention.

A description will be given of the terminal arrangement (so-called pin arrangement) of the driver IC 100. In the driver IC 100 serving as the load drive device, as shown in FIG. 16, a pair of output terminals forming each drive CH are arranged adjacent to each other. In other words, in each drive CH, no other terminal is present between a pair of output terminals. Furthermore, in each drive CH, the terminal GND which is connected to the ground and the terminal VS which receives the load power supply voltage VA are arranged so as to sandwich a pair of output terminals, and those four terminals are aligned adjacent to each other. Specifically, with respect to the drive CH 1, on the first surface of the housing 101 of the driver IC, the terminals GND, OUT1, OUT2 and VS are arranged adjacent to each other in this order, and with respect to the drive CH 3, on the second surface of the housing 101 of the driver IC, the terminals GND, OUT5, OUT6 and VS are arranged adjacent to each other in this order. The same is true for the drive CH 2 and the drive CH 4.

Hence, on the substrate SUB, the routing of wiring (pattern) between the driver IC 100 and the motors M1 to M4 is easily performed, and thus it is easier to reduce the size of the substrate SUB. It is also possible to easily reduce signal crosstalk between the motors, and thus this is also advantageous in reducing the size of the substrate SUB.

Figure 17:
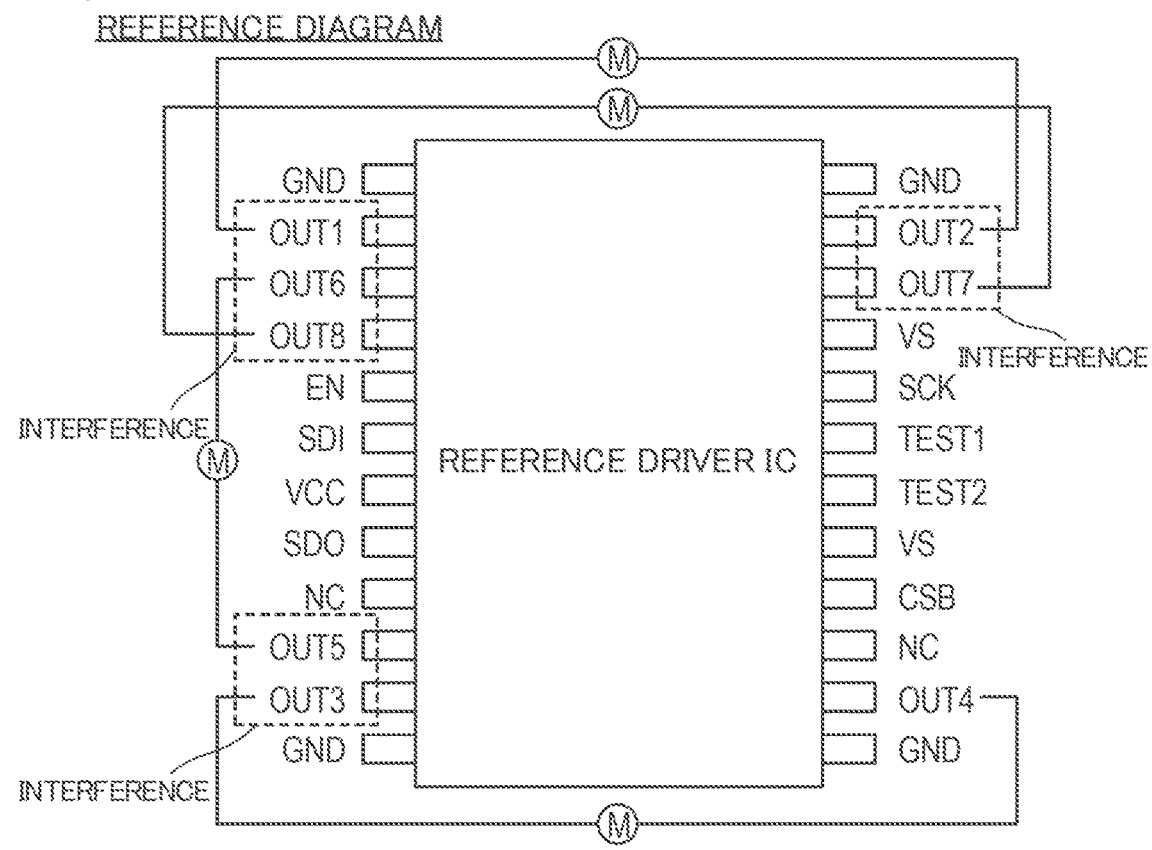
FIG. 17 is a diagram showing a connection relationship between a reference driver IC and motors.

FIG. 17 shows a reference driver IC which is used for comparison with the driver IC 100. In the terminal arrangement of the reference driver IC or the like, signal crosstalk between motors is increased (signal interference occurs within broken line frames of FIG. 17) whereas when signal crosstalk attempts to be reduced, the routing of wiring on the substrate is prolonged. Consequently, it is difficult to reduce the size of the substrate.

Since in the reference driver IC, the output terminals of different drive CHs are adjacent to each other, when a short circuit failure occurs between the terminals, the influence of the failure is exerted on the two drive CHs. Specifically, for example, when in the reference driver IC of FIG. 17, a short circuit occurs between the output terminals OUT1 and OUT6, the influence thereof is exerted on the drive CH corresponding to the output terminals OUT1 and OUT2 and the drive CH corresponding to the output terminals OUT5 and OUT6.

By contrast, in the driver IC 100 according to the present embodiment, the output terminals of different drive CHs are not adjacent to each other. Specifically, for example, in the driver IC 100, on the first surface of the housing 101, between the pair of output terminals OUT1 and OUT2 corresponding to the drive CH 1 and the pair of output terminals OUT3 and OUT4 corresponding to the drive CH 2, one or more terminals different from the output terminal are provided. The same is true for the drive CHs 3 and 4 on the second surface of the housing 101. Hence, if one output terminal is short-circuited to the adjacent terminal, the influence thereof is exerted on only the one drive CH, and thus as compared with the reference driver IC, it is possible to reduce influence caused when a failure occurs. Interference (which corresponds to the "interference" in FIG. 17) is unlikely to occur between a signal in the output terminal of a certain drive CH and a signal in the output terminal of another drive CH.

[Terminal Arrangement (Part 2)]

The driver IC 100 includes: an output terminal group (first terminal group) which is a collection of terminals including output terminals; a control terminal group (second terminal group) which is a collection of terminals including a terminal that needs to be connected to the MCU 200.

Figure 18:
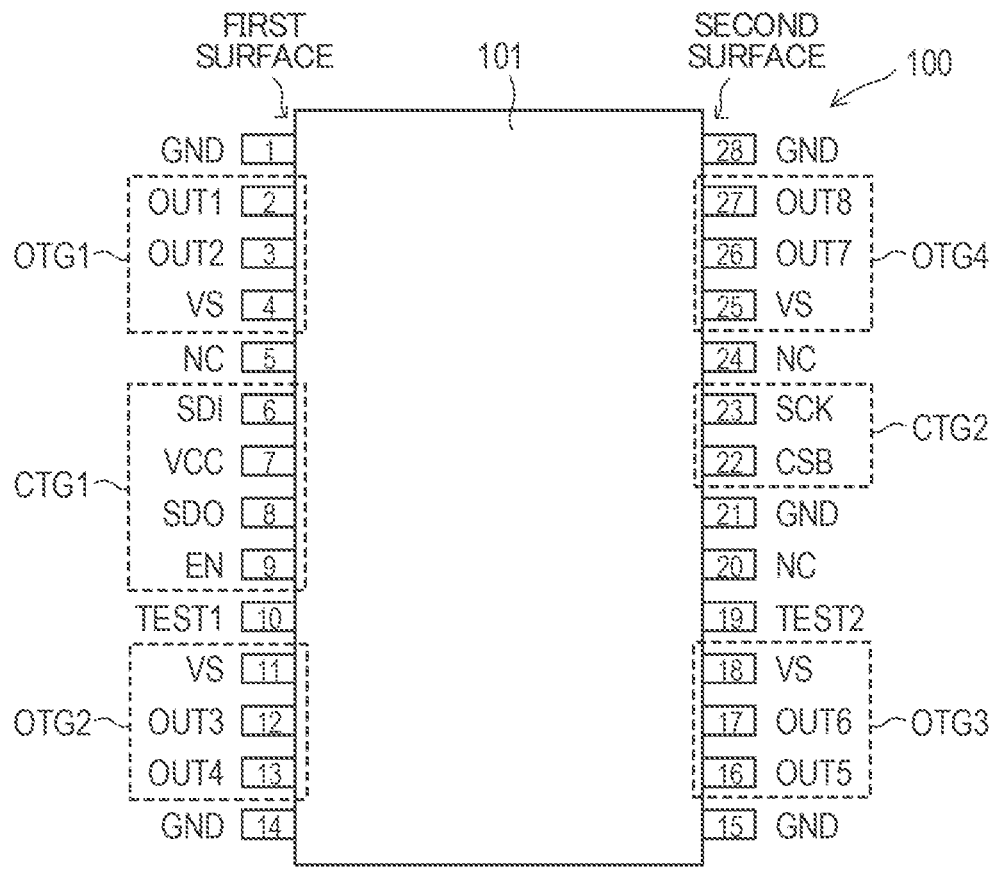
FIG. 18 is a diagram for illustrating output terminal groups and control terminal groups provided in the driver IC in the first embodiment of the present invention.

As shown in FIG. 18, as the output terminal groups, output terminal groups OTG1 to OTG4 are provided, and as the control terminal groups, control terminal groups CTG1 and CTG2 are provided. The terminal groups OTG1 to OTG4 and CTG1 and CTG2 are separated from each other, and among the terminal groups OTG1 to OTG4 and CTG1 and CTG2, between arbitrary two terminal groups, a common terminal is prevented from being included.

Each of the output terminal groups is formed with a plurality of terminals which are adjacent to each other and are aligned in a line on the first surface or the second surface of the housing 101, and each of the control terminal groups is formed with a plurality of terminals which are adjacent to each other and are aligned in a line on the first surface or the second surface of the housing 101. More specifically, the output terminal group OTG1 is formed with the three terminals OUT1, OUT2 and VS of the pin numbers 2 to 4 which are adjacent to each other and are aligned in a line on the first surface of the housing 101, the output terminal group OTG2 is formed with the three terminals VS, OUT3 and OUT4 of the pin numbers 11 to 13 which are adjacent to each other and are aligned in a line on the first surface of the housing 101, the output terminal group OTG3 is formed with the three terminals OUT5, OUT6 and VS of the pin numbers 16 to 18 which are adjacent to each other and are aligned in a line on the second surface of the housing 101 and the output terminal group OTG4 is formed with the three terminals VS, OUT7 and OUT8 of the pin numbers 25 to 27 which are adjacent to each other and are aligned in a line on the second surface of the housing 101.

The control terminal group CTG1 is formed with the four terminals SDI, VCC, SDO and EN of the pin numbers 6 to 9 which are adjacent to each other and are aligned in a line on the first surface of the housing 101, and the control terminal group CTG2 is formed with the two terminals CSB and SCK of the pin numbers 22 and 23 which are adjacent to each other and are aligned in a line on the second surface of the housing 101.

Since the load power supply voltage VA itself or a voltage based on the load power supply voltage VA is applied to each of the terminals of the output terminal group, the withstand voltage of each of the terminals of the output terminal group is equal to or more than a predetermined first withstand voltage. The first withstand voltage has a value (for example, 40V) which is equal to or more than the maximum value (for example, 32V) of a voltage that is assumed to be the load power supply voltage VA. Hence, even when a voltage corresponding to the first withstand voltage is applied to any of the terminals of the output terminal group, the circuit within the driver IC 100 which is connected to the terminal is prevented from being damaged or degraded.

Since the control power supply voltage VB itself which is relatively low or a voltage (signal) based on the control power supply voltage VB is applied to each of the terminals of the control terminal group, the withstand voltage of each of the terminals of the control terminal group is equal to or more than a predetermined second withstand voltage. The second withstand voltage has a value (for example, 10V) which is equal to or more than the maximum value (for example, 5V) of a voltage that is assumed to be the control power supply voltage VB. Hence, even when a voltage corresponding to the second withstand voltage is applied to any of the terminals of the control terminal group, the circuit within the driver IC 100 which is connected to the terminal is prevented from being damaged or degraded.

The three terminals NC and the terminals TEST1 and TEST2 are terminals (hereinafter referred to as unused terminals) which are different from the power supply terminals (VS and VCC), the output terminals (OUT1 to OUT8) and the ground terminal (GND) and the individual terminals of the control terminal group, and the withstand voltage of each of the unused terminals is equal to or more than the first withstand voltage. Hence, even when the voltage corresponding to the first withstand voltage is applied to each of the unused terminals, the circuit within the driver IC 100 which is connected to the unused terminal is prevented from being damaged or degraded. The terminal NC serving as the unused terminal is a terminal which is not connected to the circuit within the driver IC 100 (which can be regarded as not being connected in terms of the circuit function even when being connected). As described above, the terminals TEST1 and TEST2 are terminals which are used only in the development and manufacturing stages of the driver IC 100, and are not used when the driver IC 100 is actually operated.

As is clear from the above description, each of the output terminal groups OTG1 to OTG4 does not include the power supply terminal (VCC) which receives the supply of the control power supply voltage VB, the terminals (EN, SCK, CSB, SDI and SDO) which need to be connected to the MCU 200 and the unused terminals, and is here considered not to include the ground terminal (GND). Each of the control terminal groups CTG1 and CTG2 does not include the output terminals (OUT1 to OUT8), the power supply terminal (VS) which receives the supply of the load power supply voltage VA and the unused terminals, and is here considered not to include the ground terminal (GND).

Notably, in the first surface or the second surface of the driver IC 100, one or more unused terminals (separate terminals) are arranged between the output terminal group (first terminal group) and the control terminal group (second terminal group) adjacent to each other. Specifically, for example, in the first surface of the driver IC 100, the unused terminal NC is arranged between the output terminal group OTG1 and the control terminal group CTG1, and in the second surface of the driver IC 100, the three terminals including the unused terminals TEST2 and NC are arranged between the output terminal group OTG3 and the control terminal group CTG2. The same is true for the other combinations of the output terminal group and the control terminal group.

Hence, even when the terminals adjacent to each other are short-circuited, the driver IC 100 is prevented from being destroyed. For example, even when the terminal VS of the pin number 11 and the terminal TEST1 of the pin number 10 are short-circuited, since the withstand voltage of the terminal TEST1 is equal to or more than the supply voltage (load drive voltage VA) of the terminal VS, IC destruction does not occur. When the terminal VS of the pin number 11 and the output terminal OUT3 of the pin number 12 are short-circuited, when the output terminal OUT3 of the pin number 12 and the output terminal OUT4 of the pin number 13 are short-circuited or when the OUT4 of the pin number 13 and the terminal GND of the pin number 14 are short-circuited, an excessive current can be temporarily passed through the drive CH2 but the overcurrent protection functions, with the result that IC destruction does not occur. The ground terminal (GND) is prevented from being arranged adjacent to the power supply terminals (VS and VCC) such that the power supply voltage (VA, VB) is prevented from being short-circuited to the ground.

Figure 19:
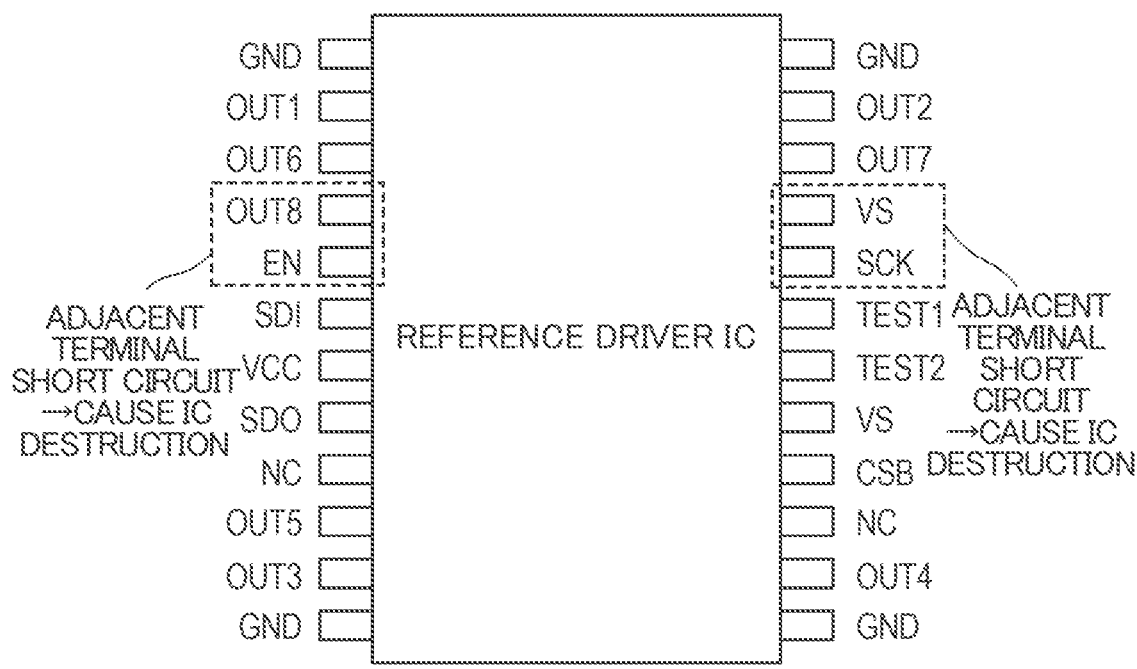
FIG. 19 is a diagram for illustrating an influence of a short circuit between adjacent terminals in the reference driver IC.

FIG. 19 shows the terminal arrangement of the reference driver IC. In the reference driver IC, IC destruction can occur by a short circuit between adjacent terminals.

It can be considered that in order to prevent the driver IC from being destroyed when a short circuit occurs between adjacent terminals, the withstand voltage of each of the terminals of the control terminal group is set equal to or more than the first withstand voltage, and in actuality, in the driver IC 100, the withstand voltage of each of the terminals of the control terminal group may be set equal to or more than the first withstand voltage. However, even in such a case, if the power supply terminal receiving the supply of the load power supply voltage VA and the terminal of the control terminal group are short-circuited (if in the reference driver IC of FIG. 19, for example, the terminals VS and SCK adjacent to each other are short-circuited), a separate electronic component (in the load drive system of the present embodiment, the MCU 200) which is connected to the terminal of the control terminal group may be destroyed. Hence, in the driver IC 100, when individual electronic components including the driver IC 100 are mounted on the substrate SUB, the unused terminal (NC, TEST1 or TEST2) which do not need to be connected to any of the electronic components (any of the circuits) is inserted between the output terminal group and the control terminal group adjacent to each other.

The driver IC 100 or the load drive system has the following features on disconnections.

A disconnection in wiring for supplying the load power supply voltage VA to the power supply terminal VS is detected with the UVLO circuit 132, and a disconnection in wiring for supplying the control power supply voltage VB to the power supply terminal VCC is detected with the power-on reset circuit 135.

A disconnection between the output terminal and the load is detected with the low load detection function.

In order for unintended control to be prevented from being applied to the driver IC 100 when wiring to the terminals EN, CSB, SCK and SDI is disconnected, the terminals are pulled down or pulled up within the driver IC 100 (FIG. 6). The terminals TEST1 and TEST2 are also pulled down within the driver IC 100.

When wiring to the terminal SDO is disconnected, information reflecting an input command signal from the MCU 200 to the driver IC 100 is not output from the terminal SDO, and thus the disconnection can be detected in the MCU 200.

Since two or more power supply terminals (VS) which need to receive the supply of the load power supply voltage VA and two or more ground terminals (GND) which pair therewith are provided, in a primary failure, the driver IC 100 is unlikely to malfunction.

[Applications of Motors]

Figure 20:
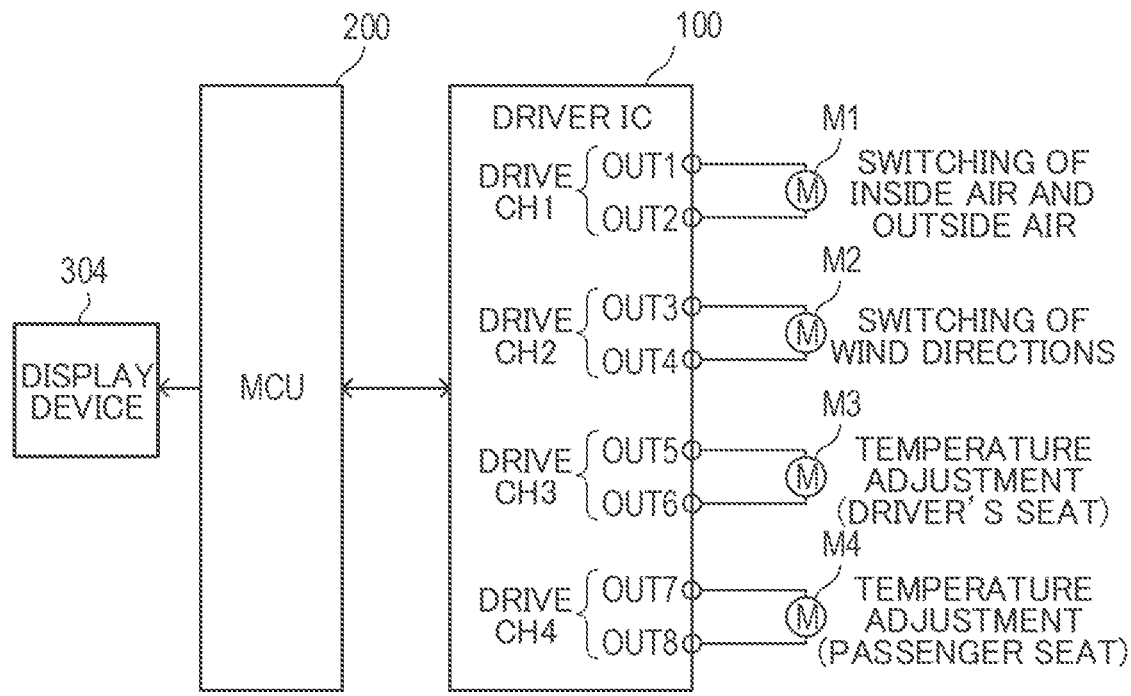
FIG. 20 is a diagram showing the applications of motors which are assumed in the first embodiment of the present invention.

FIG. 20 shows examples of use of the motors in the present embodiment. The load drive system according to the present embodiment is mounted in the vehicle CC (see FIG. 3) which is a passenger car or a truck vehicle where a driver's seat and a passenger seat are provided, and the motors M1, M2, M3 and M4 driven with the drive CHs 1, 2 3 and 4 are respectively utilized as a motor for switching inside air and outside air, a motor for switching wind directions, a motor for adjusting the temperature of the driver's seat and a motor for adjusting the temperature of the passenger seat. The switching of the inside air and the outside air means the switching of a mode in which the inflow of the outside air of the vehicle CC into the vehicle CC is blocked and in which air is circulated within the vehicle CC and a mode in which the outside air of the vehicle CC is taken into the vehicle CC. The switching of the wind directions means the switching of directions in which a wind is blown from an air conditioner provided in the vehicle CC. The temperature adjustment of the driver's seat and the passenger seat means the adjustment of the temperature of the wind blown from the air conditioner toward each of the driver's seat and the passenger seat. However, the applications of the motors M1 to M4 are not limited to the applications described above. The driver IC 100 has the function of switching the OVP determination voltages described above used in the determination of the overvoltage state so as to determine the OVP determination voltage depending on the data written into the bit (see FIG. 11) of the bit number 3 in the write register WR2. For example, it is possible to selectively use an appropriate OVP determination voltage according to whether the vehicle CC is a passenger car or a truck vehicle.

Second Embodiment

A second embodiment of the present invention will be described. The second embodiment is an embodiment on the basis of the first embodiment, and with respect to items which are not particularly described in the second embodiment, unless otherwise specified and unless a contradiction arises, the description of the first embodiment is applied to the second embodiment. Although in an example shown in FIG. 20, the vehicle CC is assumed in which the temperature adjustment can be individually performed on each of the driver's seat and the passenger seat, depending on the type of vehicle CC, there is a vehicle CC in which temperature adjustment common to the driver's seat and the passenger seat is performed. In this case, one of the motors M1 to M4 is not mounted in the vehicle CC.

In the second embodiment, it is assumed that the load drive system is mounted in the vehicle CC in which the temperature adjustment common to the driver's seat and the passenger seat is performed, and that only the motors M1 to M3 are driven with the load drive system. Specifically, the load drive system of the second embodiment has a configuration in which the unit output circuits 110 [7] and 110 [8], the output terminals OUT7 and OUT8 and the motor M4 are omitted from the load drive system of the first embodiment (hence, in the second embodiment, the drive CH 4 is not present). Except for the omission described above, the items which are not particularly described in the second embodiment, such as the operation, the configuration and the like of the load drive system, including a communication method between the driver IC and the MCU are the same in the first and second embodiments.

Figure 21:
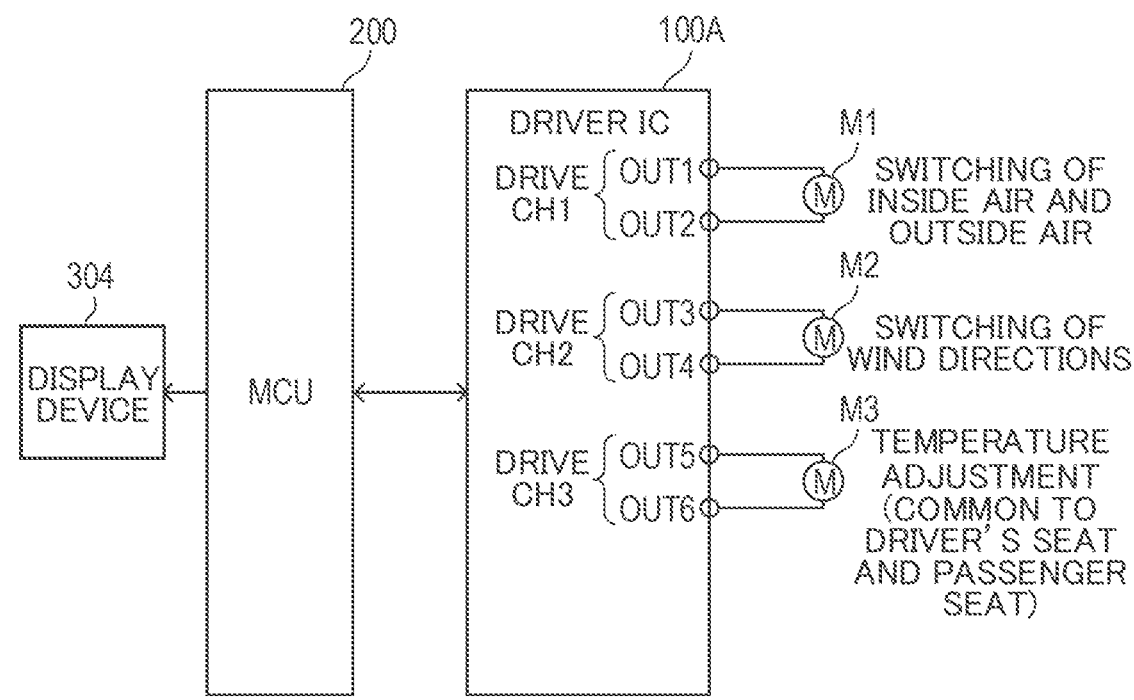
FIG. 21 is a diagram showing the applications of motors which are assumed in a second embodiment of the present invention.

In other words, as shown in FIG. 21, the load drive system according to the second embodiment is mounted in the vehicle CC in which the temperature adjustment common to the driver's seat and the passenger seat is performed, and the motors M1, M2 and M3 driven with the drive CHs 1, 2 and 3 are respectively utilized as a motor for switching inside air and outside air, a motor for switching wind directions and a motor for adjusting the common temperature of the driver's seat and the passenger seat. However, the applications of the motors M1 to M3 are not limited to the applications described above.

The driver IC according to the second embodiment is represented by a symbol 100A. The driver IC 100A has a configuration in which the unit output circuits 110 [7] and 110 [8] and the output terminals OUT7 and OUT8 are omitted from the driver IC 100, and except for the omission described above, the items which are not particularly described in the second embodiment such as the operation, the configuration and the like of the driver IC are the same in the driver ICs 100 and 100A.

Figures 22, 23:
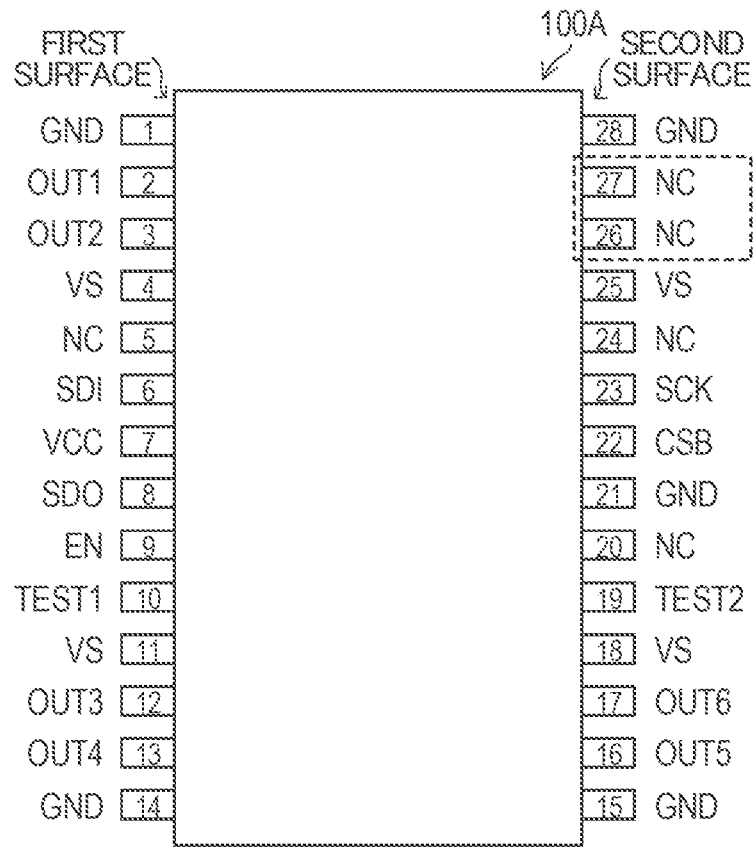
FIG. 22 is a diagram showing the terminal arrangement of a driver IC in the second embodiment of the present invention.
FIG. 23 is a diagram for comparing registers in the first and second embodiments of the present invention.

FIG. 22 shows the terminal arrangement (so-called pin arrangement) of the driver IC 100A. Although in the driver IC 100A, as in the driver IC 100, a total of 28 metal terminals are provided in which pin numbers 1 to 28 are assigned, the metal terminals of the pin numbers 26 and 27 are terminals NC. As described previously, the terminals NC are not connected to the semiconductor integrated circuit of the driver IC 100A, and do not affect the operation of the driver IC 100A at all. Except for the terminals of the pin numbers 26 and 27, the terminal arrangement of the driver IC is the same in the driver ICs 100 and 100A, and the size and shape of the housing of the driver IC are the same in the driver ICs 100 and 100A.

With reference to FIG. 23, although the driver IC 100 according to the first embodiment includes the write registers WR1 and WR2 as the first and second write registers and the read registers RR1 to RR4 as the first to fourth read registers, the driver IC 100A according to the second embodiment includes write registers WR1 and WR2A as the first and second write registers and read registers RR1, RR2A, RR3 and RR4A as the first to fourth read registers. In other words, in the driver IC 100A, the registers WR2, RR2 and RR4 in the driver IC 100 are replaced with the registers WR2A, RR2A and RR4A.

Although as described above, with respect to the items which are not particularly described in the second embodiment, unless otherwise specified and unless a contradiction arises, the description of the first embodiment is applied to the second embodiment, in this application, the symbols "100", "WR2", "RR2" and "RR4" in the description of the first embodiment are respectively replaced with symbols "100A", "WR2A", "RR2A" and "RR4A".

The details of the write register WR2A are shown in FIG. 24. The write register WR2A is the same as the write register WR2 except that the bits of the bit numbers 8 to 11 are write dummy bits. That the bits of the bit numbers 8 to 11 are write dummy bits in the write register WR2A means that a memory space corresponding to the bits of the bit numbers 8 to 11 is a write dummy memory space in which writing is disabled. Specifically, although the write register WR2A is a register in which a memory space corresponding to 16 bits is assigned, in the write dummy memory space of the memory space corresponding to 16 bits, a bit capable of storing data is not present or a semiconductor circuit corresponding to a bit capable of storing data is provided but the semiconductor circuit is not connected to any circuit.

In any case, in the write register WR2A, the write dummy memory space and the write dummy bits are a memory space and bits which do not affect at all the state of the driver IC 100A including the state of the unit output circuits and the operation thereof regardless of whether data can be written thereinto. In actuality, for example, the write dummy bits of the write register WR2A are treated as reserve bits, and the writing of data into the write dummy bits with the write & read command signal is disabled.

FIGS. 25 and 26 show the details of the read registers RR2A and RR4A.

The read register RR2A is the same as the read register RR2 except that the bits of the bit numbers 8 to 11 are read dummy bits and that the details of data indicated by the bits of the bit numbers 2 and 3 are different. In the read register RR2A, a fixed value "0" is constantly stored in the bits (read dummy bits) of the bit numbers 8 to 11.

In the bit (logical sum low load state bit) of the bit number 2 in the read register RR2A, the logical sum of data in the bits of the bit numbers 8 and 9 in the read register RR4A is stored. Specifically, when it is determined that at least one of the unit output circuits 110 [5] and 110 [6] is in the low load state, "1" is stored in the bit of the bit number 2 in the read register RR2A whereas only when this is not true, "0" is stored in the bit of the bit number 2 in the read register RR2A.

In the bit (logical sum overcurrent state bit) of the bit number 3 in the read register RR2A, the logical sum of data in the bits of the bit numbers 0 to 3 in the read register RR4A is stored. Specifically, when it is determined that at least one of a total of four power transistors included in the unit output circuits 110 [5] and 110 [6] is in the overcurrent state, "1" is stored in the bit of the bit number 3 in the read register RR2A whereas only when this is not true, "0" is stored in the bit of the bit number 3 in the read register RR2A.

The read register RR4A is the same as the read register RR4 except that the bits of the bit numbers 4 to 7, 10 and 11 are read dummy bits and that the initial values of the bits of the bit numbers 4 to 7, 10 and 11 are "0". In the read register RR4A, a fixed value "0" is constantly stored in the bits (read dummy bits) of the bit numbers 4 to 7, 10 and 11.

That the bits of the bit numbers 8 to 11 are read dummy bits in the read register RR2A means that a memory space corresponding to the bits of the bit numbers 8 to 11 is a read dummy memory space in which invalid data is stored. Specifically, although the read register RR2A is a register in which a memory space corresponding to 16 bits is assigned, in the read dummy memory space of the memory space corresponding to 16 bits, data of "0" is fixedly stored.

Likewise, that the bits of the bit numbers 4 to 7, 10 and 11 are read dummy bits in the read register RR4A means that a memory space corresponding to the bits of the bit numbers 4 to 7, 10 and 11 is a read dummy memory space in which invalid data is stored. Specifically, although the read register RR4A is a register in which a memory space corresponding to 16 bits is assigned, in the read dummy memory space of the memory space corresponding to 16 bits, data of "0" is fixedly stored.

Hence, when the write & read command signal or the read command signal is received, the driver IC 100A constantly reads the fixed value "0" as the storage data of the read dummy bit so as to transmit it to the MCU 200.

The MCU 200 includes a computation processing device which executes a predetermined program, and executes the program so as to perform the individual operations which need to be realized in the MCU 200. A program which is produced for the driver IC 100 in the first embodiment is now represented by a program $PR_4$. The program $PR_4$ can be used for the driver IC 100A in the second embodiment without being changed. A description will be given of it.

As compared with the write register WR2 (FIG. 11) of the first embodiment, in the write register WR2A (FIG. 24) of the second embodiment, as described above, the bit corresponding to the drive CH 4 which is not present is only replaced with the write dummy bit. Hence, even when the MCU 200 according to the second embodiment executes the program $PR_4$ and transmits such a write & read command signal as to perform, in addition to control on the drive CHs 1 to 3, control on the drive CH 4 which is not present in the second embodiment, the latter control only results in being disabled, with the result that no problem occurs at all. Since the configuration of the bits other than the write dummy bits is the same in the write registers WR2 and WR2A, a program on the writing of data into the write registers within the program $PR_4$ can be used for the driver IC 100A in the second embodiment without being changed.

As compared with the read registers RR2 and RR4 (FIGS. 13 and 15) of the first embodiment, in the read registers RR2A and RR4A (FIGS. 25 and 26) of the second embodiment, the bit corresponding to the drive CH 4 which is not present is basically only replaced with the read dummy bit. When the write & read command signal or the read command signal is received, the driver IC 100A transmits, to the MCU 200, data indicating that the individual power transistors are off (see the bit numbers 8 to 11 in the RR2A) and that no abnormality caused by the overcurrent state and the low load state is present (see the bit numbers 4 to 7, 10 and 11 in the RR4A) for the drive CH 4 which is not present. The logical sum overcurrent state bit and the logical sum low load state bit are treated in the same manner (see the bit numbers 3 and 2 in the RR2A). Since the configuration of the bits other than the read dummy bits is the same in the read registers RR2 and RR2A and in the read registers RR4 and RR4A, a program on the reading of data with the read registers within the program $PR_4$ can be used for the driver IC 100A in the second embodiment without being changed.

In addition, the substrate SUB which is used in the load drive system of the first embodiment can be used in the load drive system of the second embodiment without being changed. Although in the substrate SUB (see FIG. 2) which is used in the load drive system of the first embodiment, a pad for mounting various components including the driver IC 100, the MCU 200 and the connector CN, wiring (pattern), a through hole and the like are formed, the driver IC 100A is mounted in the position of the substrate SUB in which the driver IC 100 needs to be mounted, and thus the load drive system of the second embodiment is formed. With respect to the terminals of the driver IC 100A, as compared with the driver IC 100, the terminal corresponding to the drive CH 4 is only replaced with the terminal NC (see FIG. 22), and the other terminals including the arrangement thereof are the same as those of the driver IC 100. Since the drive CH 4 is not present in the second embodiment, the motor M4 is preferably prevented from being connected to the connector CN. In other words, the connector CN is also not needed to be changed in the first and second embodiments.

When the substrate is changed according to the number of channels, it is necessary to perform evaluations (designs and evaluations in the development stage) corresponding to the types of substrates, and thus a heavier burden is placed on the development. Hence, it is preferable to use the same substrate without depending on the number of channels. In terms of cost, it is preferable to use the same substrate as much as possible. The load drive systems according to the first and second embodiments can satisfy such a request.

Third Embodiment

A third embodiment of the present invention will be described. In the third embodiment, supplementary explanations, variations and the like for the technologies described in the first and second embodiments will be described. With respect to items which are not particularly described in the third embodiment, unless otherwise specified, the description of the first or second embodiment is applied to the third embodiment. The third embodiment includes examples EX3_1 to EX3_6 below. Unless a contradiction arises, two or more arbitrary examples among the examples EX3_1 to EX3_6 can be combined together.

Example EX3_1

The example EX3_1 will be described. In the description of the first embodiment (see FIG. 18), the driver IC 100 includes the output terminal groups (OTG1 to OTG4) and the control terminal groups (CTG1 and CTG2), and the unused terminal is arranged between the output terminal group and the control terminal group. This is also true for the driver IC 100A in the second embodiment (in the driver IC 100A, the output terminal group OTG4 is only omitted).

In the driver ICs 100 and 100A according to the first and second embodiments, for example, the number of unused terminals provided between the output terminal group OTG2 and the control terminal group CTG1 is one (see FIG. 18). However, in the driver IC according to the present invention, the number of unused terminals (separate terminals) provided between the output terminal group (first terminal ground) and the control terminal group (second terminal group) adjacent to each other on the same surface may be one or an arbitrary number equal to or more than two. Each of the driver ICs 100 and 100A is one type of driver IC according to the present invention.

In the driver ICs 100 and 100A according to the first and second embodiments, each of the output terminal groups includes the power supply terminal VS (first power supply terminal) which receives the supply of the load power supply voltage VA. However, in the driver IC according to the present invention, each of the output terminal groups does not need to include the power supply terminal VS or the output terminal group which includes the power supply terminal VS and the output terminal group which does not include the power supply terminal VS may be mixed together. In the driver IC according to the present invention, the number of power supply terminals VS which receive the supply of the load power supply voltage VA may be one or two or more.

In the driver ICs 100 and 100A according to the first and second embodiments, the control terminal group (CTG1) which includes the power supply terminal VCC (second power supply terminal) that receives the supply of the control power supply voltage VB and the control terminal group (CTG2) which does not include the power supply terminal VCC are mixed together. However, in the driver IC according to the present invention, each of the control terminal groups does not need to include the power supply terminal VCC or each of the control terminal groups may include the power supply terminal VCC. In the driver IC according to the present invention, the number of power supply terminals VCC which receive the supply of the control power supply voltage VB may be one or two or more.

The control terminal group includes terminals (hereinafter referred to as external connection terminals) which need to be connected to the MCU 200. The terminals EN, SCK, CSB, SDI and SDO are the external connection terminals. Although in the driver ICs 100 and 100A according to the first and second embodiments, the number of external connection terminals included in one control terminal group (CTG1 or CTG2) is two or more, in the driver IC according to the present invention, the number thereof may be arbitrary (may be one).

In the driver IC 100 and 100A according to the first and second embodiments, four or three output terminal groups and two control terminal groups are provided. However, in the driver IC according to the present invention, the number of output terminal groups provided may be an arbitrary number (including one) other than four or three, and the number of control terminal groups provided may be an arbitrary number (including one) other than two.

Example EX3_2

The example EX3_2 will be described. In the driver IC (100, 100A), based on the write & read command signal, data (which corresponds to data of the on/off specifying bits and which is hereinafter referred to as state specifying data) that specifies the states of the individual power transistors in each of the unit output circuits is written into the write register, and the control circuit 120 controls, based on the state specifying data, the states (on or off) of the individual power transistors in each of the unit output circuits.

Hence, in the driver IC (100, 100A), in the write register, as the storage bits of the state specifying data, a storage region corresponding to a predetermined first bit number is provided in each of the drive CHs. The on/off specifying bits of the write register correspond to the storage bits of the state specifying data (see FIGS. 10 and 11), and here, four power transistors are provided in one drive CH, with the result that the predetermined first bit number is "4". Hence, for example, in the driver IC 100, the storage region corresponding to a total of 16 bits which corresponds to the product of the number "4" of drive CHs and the predetermined first bit number "4" is acquired with the bits of the bit numbers 4 to 11 in the write register WR1 and the bits of the bit numbers 4 to 11 in the write register WR2 (see FIGS. 10 and 11).

In the driver IC 100A of the second embodiment, the drive CHs 1 to 3 are included and the drive CH 4 is not included, and thus the memory space corresponding to the predetermined first bit number is set to the write dummy memory space (see FIG. 24). However, if the driver IC 100A is varied such that the drive CHs 1 and 3 are included and that the drive CHs 2 and 4 are not included, a memory space twice as large as the predetermined first bit number is preferably set to the write dummy memory space. In this case, in the driver IC 100A according to the variation, the bits of the bit numbers 8 to 11 in the write register WR1 which correspond to the drive CH 2 are set to the write dummy bits.

The way of thinking as described above is widely applied when the driver IC 100 includes m drive CHs and the driver IC 100A includes an arbitrary number of drive CHs where the arbitrary number is less than m (m is an arbitrary integer equal to or more than two). In other words, this is generalized to be said as follows.

In each of the driver ICs 100 and 100A, the write storage portion in which a write memory space corresponding to w bits is defined is formed with one or more write registers.

In the driver IC 100A which includes less than m drive CHs, w has a value which is equal to or more than the product of an integer (m) greater than the number of drive CHs and the predetermined first bit number (here, four), and the write dummy memory space corresponding to an integral multiple of the predetermined first bit number is present in the write memory space corresponding to w bits.

In the driver IC 100A embodied in the second embodiment, m=4 and w=32, and the write dummy memory space is the memory space corresponding to one time the first bit number "4". Various variations of the circuit configurations of the individual unit output circuits and the individual drive CHs are possible, and consequently, the predetermined first bit number can be a number other than 4.

Example EX3_3

The example EX3_3 will be described. In the driver IC (100, 100A), data (which corresponds to data of the on/off state bits and which is hereinafter referred to as state data) that indicates the states of the individual power transistors in each of the unit output circuits is stored in the read register, and when the write & read command signal or the read command is received, the storage data of the read register including the state data is transmitted from the driver IC to the MCU 200.

Hence, in the driver IC (100, 100A), in the read register, as the storage bits of the state data, a storage region corresponding to a predetermined second bit number is provided in each of the drive CHs. The on/off state bits of the read register correspond to the storage bits of the state data (see FIGS. 12 and 13), and here, four power transistors are provided in one drive CH, with the result that the predetermined second bit number is "4". Hence, for example, in the driver IC 100, the storage region corresponding to a total of 16 bits which corresponds to the product of the number "4" of drive CHs and the predetermined second bit number "4" is acquired with the bits of the bit numbers 4 to 11 in the read register RR1 and the bits of the bit numbers 4 to 11 in the read register RR2 (see FIGS. 12 and 13).

In the driver IC 100A of the second embodiment, the drive CHs 1 to 3 are included and the drive CH 4 is not included, and thus the memory space corresponding to the predetermined second bit number is set to the read dummy memory space on the state data (see FIG. 25). However, if the driver IC 100A is varied such that the drive CHs 1 and 3 are included and that the drive CHs 2 and 4 are not included, a memory space twice as large as the predetermined second bit number is preferably set to the read dummy memory space on the state data. In this case, in the driver IC 100A according to the variation, the bits of the bit numbers 8 to 11 in the read register RR1 which correspond to the drive CH 2 are set to the read dummy bits.

The way of thinking as described above is widely applied when the driver IC 100 includes m drive CHs and the driver IC 100A includes an arbitrary number of drive CHs where the arbitrary number is less than m (m is an arbitrary integer equal to or more than two). In other words, this is generalized to be said as follows.

In each of the driver ICs 100 and 100A, the read storage portion in which a read memory space corresponding to r bits is defined is formed with one or more read registers.

In the driver IC 100A which includes less than m drive CHs, r has a value which is equal to or more than the product of an integer (m) greater than the number of drive CHs and the predetermined second bit number (here, four), and the read dummy memory space corresponding to an integral multiple of the predetermined second bit number is present in the read memory space corresponding to r bits.

In the driver IC 100A embodied in the second embodiment, m=4 and r=64, and the read dummy memory space on the state data is the memory space corresponding to one time the second bit number "4". Various variations of the circuit configurations of the individual unit output circuits and the individual drive CHs are possible, and consequently, the predetermined second bit number can be a number other than 4.

The same is true for data other than the state data. Specifically, for example, in the driver IC (100, 100A), in the read register, as the storage bits of data (hereinafter referred to as individual abnormality data) indicating, for each of the power transistors or for each of the unit output circuits, whether or not an abnormality caused by the overcurrent state or the low load state is detected, a storage region corresponding to a predetermined third bit number is provided in each of the drive CHs. The individual overcurrent state bits and the individual low load state bits of the read register correspond to the storage bits of the individual abnormality data (see FIGS. 14 and 15), and here, the predetermined third bit number is "6". Hence, for example, in the driver IC 100, the storage region corresponding to a total of 24 bits which corresponds to the product of the number "4" of drive CHs and the predetermined third bit number "6" is acquired with the bits of the bit numbers 0 to 11 in the read register RR3 and the bits of the bit numbers 0 to 11 in the read register RR4 (see FIGS. 14 and 15).

In the driver IC 100A of the second embodiment, the drive CHs 1 to 3 are included and the drive CH 4 is not included, and thus the memory space corresponding to the predetermined third bit number is set to the read dummy memory space on the individual abnormality data (see FIG. 26). However, if the driver IC 100A is varied such that the drive CHs 1 and 3 are included and that the drive CHs 2 and 4 are not included, a memory space twice as large as the predetermined third bit number is preferably set to the read dummy memory space on the individual abnormality data. In this case, in the driver IC 100A according to the variation, the bits of the bit numbers 4 to 7, 10 and 11 in the read register RR3 which correspond to the drive CH 2 are set to the read dummy bits.

The way of thinking as described above is widely applied when the driver IC 100 includes m drive CHs and the driver IC 100A includes an arbitrary number of drive CHs where the arbitrary number is less than m (m is an arbitrary integer equal to or more than two). In other words, this is generalized to be said as follows.

In each of the driver ICs 100 and 100A, the read storage portion in which a read memory space corresponding to r bits is defined is formed with one or more read registers.

In the driver IC 100A which includes less than m drive CHs, r has a value which is equal to or more than the product of an integer (m) greater than the number of drive CHs and the predetermined third bit number (here, six), and the read dummy memory space corresponding to an integral multiple of the predetermined third bit number is present in the read memory space corresponding to r bits.

In the driver IC 100A embodied in the second embodiment, m=4 and r=64, and the read dummy memory space on the individual abnormality data is the memory space corresponding to one time the third bit number "6". Depending on the type of individual abnormality data and the like, the predetermined third bit number can be a number other than 6.

Example EX3_4

The example EX3_4 will be described. The number of drive CHs provided in the driver IC and the load drive system according to the present invention may be a number other than 4 or 3. Specifically, the value of "m" described above can be an arbitrary value equal to or more than 2 (for example, 6, 8, 12 or 16). Although in at least two or more of all the drive CHs provided in the driver IC and the load drive system according to the present invention, pairs of output terminals are adjacent to each other, a drive CH in which the pair of output terminals is not adjacent to each other can be present.

Example EX3_5

Figure 27A:
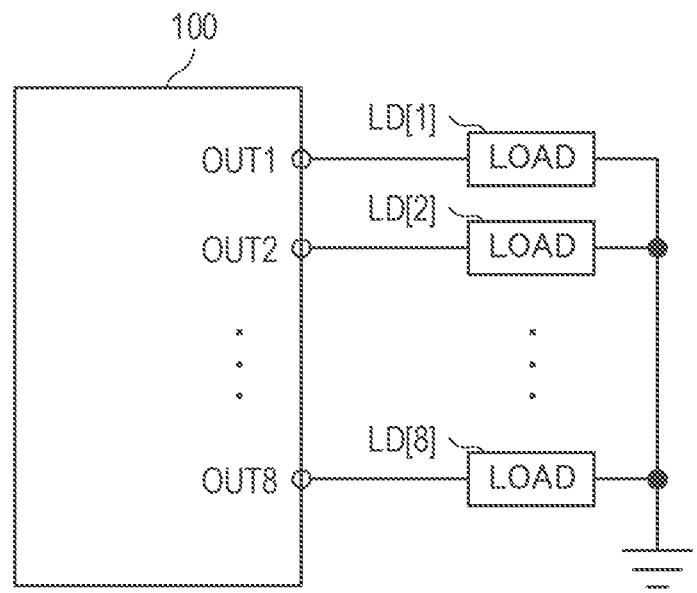
FIGS. 27A and 27B are diagrams showing a connection relationship between a driver IC and a plurality of loads in a third embodiment of the present invention.
Figure 27B:
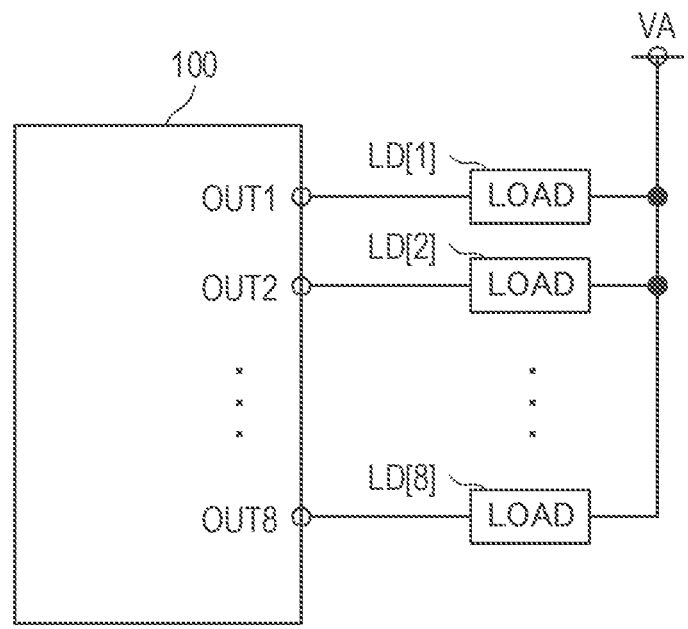

The example EX3_5 will be described. The loads which are connected to the individual output terminals in the driver IC according to the present invention are not limited to the motors, and may be arbitrary loads. Specifically, for example, when the unit output circuits 110 [1] to 110 [8] and the output terminals OUT [1] to OUT [8] are provided in the driver IC according to the present invention, as shown in FIGS. 27A and 27B, loads LD [1] to LD [8] which are different from each other may be respectively connected to the output terminals OUT [1] to OUT [8]. The load LD [i] may be the motor or may be an arbitrary load (for example, a relay, a light-emitting element or a heater) other than the motor (i is an integer). Arbitrary two or more of the loads LD [1] to LD [8] may be loads of the same type or loads of different types. In FIG. 27A, the load LD [i] is connected between the output terminal OUT [i] and the ground, and a current is passed from the output terminal OUT [i] through the load LD [i] to the ground so as to provide drive power to the load LD [i]. In FIG. 27B, the load LD [i] is connected between the load power supply terminal to which the load power supply voltage VA (see FIG. 1) is applied and the output terminal OUT [i], and a current is passed from the load power supply terminal through the load LD [i] and the output terminal OUT [i] to the ground so as to provide drive power to the load LD [i]. In the connection example as shown in FIG. 27A or 27B, for example, when the overcurrent state or the low load state is detected only in the unit output circuit 110 [1], the operation (the power supply operation to the load) of only the unit output circuit 110 [1] is stopped, and the operations (the power supply operations to the loads) of the unit output circuits 110 [2] to 110 [8] can be maintained.

In the configuration examples as shown in FIGS. 27A and 27B, it can be considered that one drive CH is formed with one unit output circuit.

Example EX3_6

The example EX3_6 will be described. Although in the above description, the output stage of each of the unit output circuits is the half-bridge circuit, the output stage of each of the unit output circuits does not need to be the half-bridge circuit. Specifically, for example, in the connection example of FIG. 27A, the power transistor (TrL [i]) on the side of the low side may be omitted from each of the unit output circuits or in the connection example of FIG. 27B, the power transistor (TrH [i]) on the side of the high side may be omitted from each of the unit output circuits.

Although in the above description, bidirectional communication is realized between the MCU 200 and the driver IC 100 by the SPI communication, as long as bidirectional communication can be performed between the MCU 200 and the driver IC 100, in the MCU 200 and the driver IC 100, any communication method may be adopted, and parallel communication may be adopted.

Although the load drive system is assumed to be mounted in the vehicle, the load drive system can be mounted and utilized in various devices other than the vehicle.

The load drive device $W_A$ embodied in each of the embodiments described above and according to one aspect of the present invention includes a pair of output terminals in each of a plurality of channels, in each of the channels, power can be supplied from the pair of output terminals to the load, the load drive device includes an external connection terminals (for example, the SDI, the SDO or the EN) which is connected to the external devices for the load drive device so as to transmit or receive signals and in each of two or more channels included in the plurality of channels, one or more of other terminals (for example, the NC or the TEST1) are arranged between the pair of output terminals (for example, the pair of the OUT1 and the OUT2 or the pair of the OUT3 and OUT4) and the external connection terminal.

Although when the pair of output terminals and the external connection terminal are short-circuited, a voltage which is applied to the output terminals is applied to the external device, and thus the external device may be adversely affected, as described above, one or more of other terminals are arranged between the pair of output terminals and the external connection terminal, with the result that it is possible to reduce the possibility that such a short circuit occurs.

Fourth Embodiment

A fourth embodiment of the present invention will be described. The fourth embodiment is an embodiment on the basis of the first embodiment, and with respect to items which are not particularly described in the fourth embodiment, unless otherwise specified and unless a contradiction arises, the description of the first embodiment is applied to the fourth embodiment. In the fourth embodiment, with respect to items which contradict the first embodiment, the description of the fourth embodiment is prioritized. An item which is described in the fourth embodiment and an item which is described in the second or third embodiment can be arbitrarily combined so as to be practiced. The fourth embodiment includes examples EX4_1 to EX4_6 below. Unless a contradiction arises, arbitrary two or more of the examples EX4_1 to EX4_6 can be combined.

Example EX4_1

Figure 28:
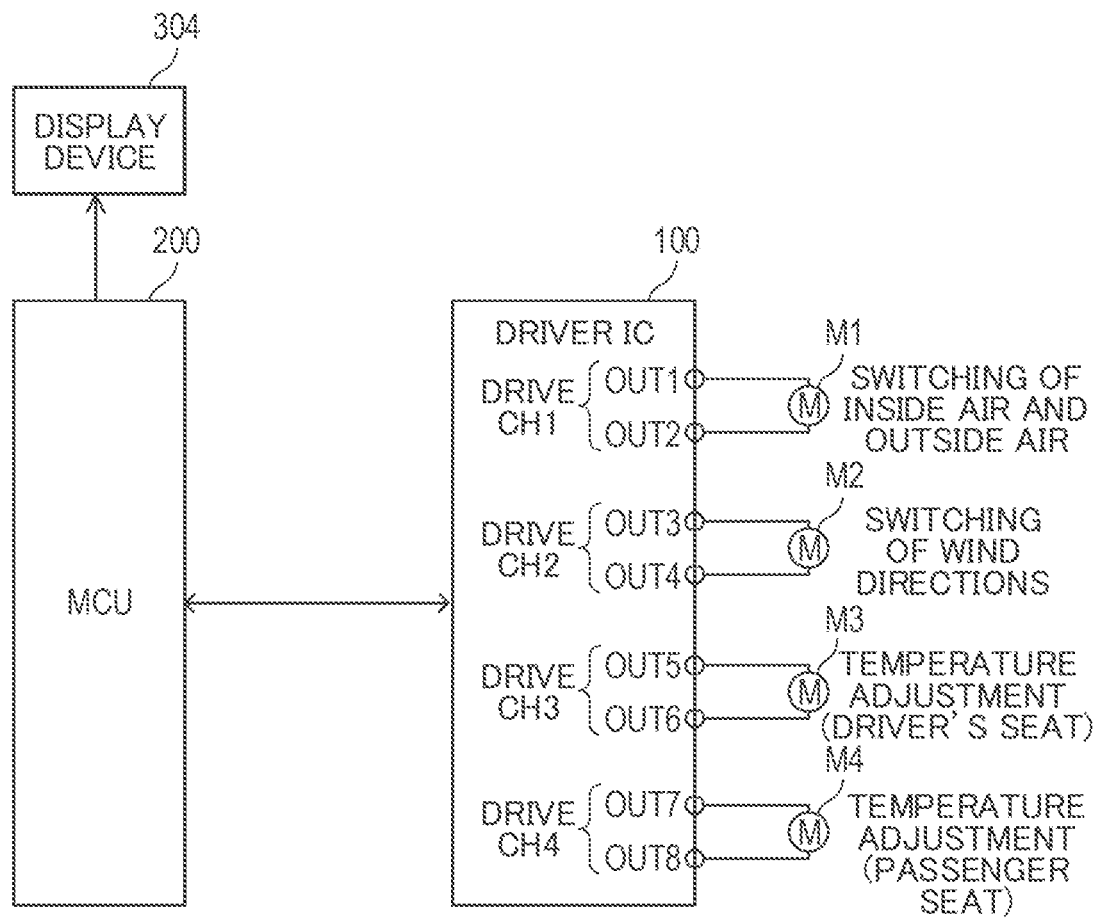
FIG. 28 is a diagram showing the applications of motors which are assumed in a fourth embodiment of the present invention.

The example EX4_1 will be described. In the individual examples of the fourth embodiment, in order to embody the description, an example of use of a motor shown in FIG. 28 is assumed. Specifically, the load drive system is mounted in the vehicle CC (see FIG. 3) which is a passenger car or a truck vehicle where a driver's seat and a passenger seat are provided, and the motors M1, M2, M3 and M4 driven with the drive CHs 1, 2 3 and 4 are respectively utilized as a motor for switching inside and outside air, a motor for switching wind directions, a motor for adjusting the temperature of the driver's seat and a motor for adjusting the temperature of the passenger seat. The switching of the inside air and the outside air means the switching of a mode in which the inflow of the outside air of the vehicle CC into the vehicle CC is blocked and in which air is circulated within the vehicle CC and a mode in which the outside air of the vehicle CC is taken into the vehicle CC. The switching of the wind directions means the switching of directions in which a wind is blown from an air conditioner provided in the vehicle CC. The temperature adjustment of the driver's seat and the passenger seat means the adjustment of the temperature of the wind blown from the air conditioner toward each of the driver's seat and the passenger seat. However, the applications of the motors M1 to M4 are not limited to the applications described above.

Figure 29:
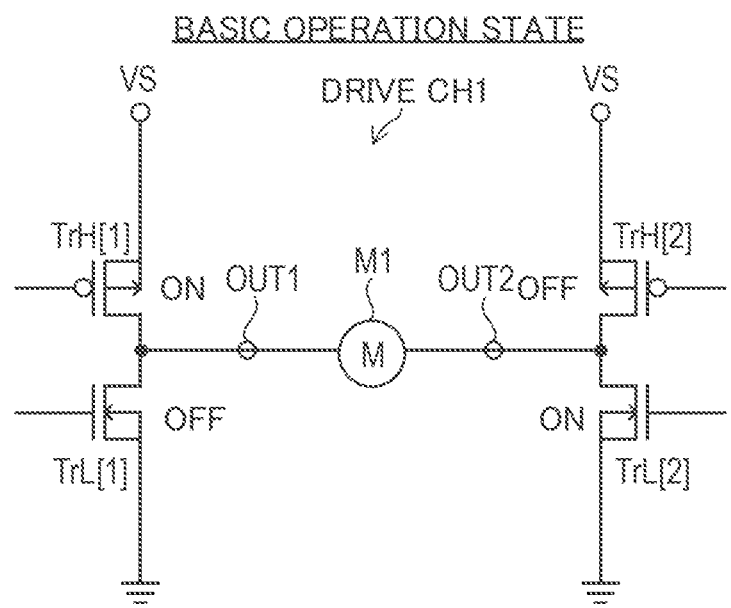
FIG. 29 is a diagram showing the basic operation state of a plurality of unit output circuits.

Furthermore, in order to embody the description, a basic operation state as shown in FIG. 29 is assumed. In the basic operation state, based on the write & read command signal which is transmitted from the MCU 200 to the driver IC 100 before the basic operation state is entered, in the drive CH 1, the power transistors TrH [1], TrL [1], TrH [2] and TrL [2] are respectively turned on, turned off, turned off and turned on, in the drive CH 2, the power transistors TrH [3], TrL [3], TrH [4] and TrL [4] are respectively turned on, turned off, turned off and turned on, in the drive CH 3, the power transistors TrH [5], TrL [5], TrH [6] and TrL [6] are respectively turned on, turned off, turned off and turned on and in the drive CH 4, the power transistors TrH [7], TrL [7], TrH [8] and TrL [8] are respectively turned on, turned off, turned off and turned on.

In the basic operation state, it is assumed that no abnormality occurs in the load drive system including the driver IC 100.

The flow of the operation of the load drive system when the motor is disconnected will be described with reference to FIG. 30. It is now assumed that the basic operation state described above is a starting point and that wiring between the output terminal OUT2 and the motor M1 is disconnected (#11). Then, both the current value $I_H$ [1] of the power transistor TrH [1] detected in the unit output circuit 110 [1] and the current value $I_L$ [2] of the power transistor TrL [2]

detected in the unit output circuit 110 [2] are less than a predetermined low load detection threshold value, and consequently, it is detected that the unit output circuits 110 [1] and 110 [2] are in the low load state. Although based on the result of the detection, the control circuit 120 stores "1" in the bits (individual low load state bits) of the bit numbers 8 and 9 in the read register RR3 (see FIG. 14), and stores "1" in the bit (logical sum low load state bit) of the bit number 2 in the read register RR1 (see FIG. 12), since the low load state does not cause, for example, the destruction of the power transistors, the power transistors TrH [1] and TrL [2] are kept on.

Thereafter, when the write & read command signal or the read command signal in which the read register RR3 is the target read register is received in the driver IC 100, by the transmission of the data-out signal, information for identifying the part and details of an abnormality (here, the abnormality caused by the low load state) is notified from the driver IC 100 to the MCU 200 (#12). That is, the details of the data of the individual bits in the read register RR3 are acquired in the MCU 200. By the acquisition described above, the MCU 200 recognizes that the abnormality caused by the low load state occurs in the unit output circuits 110 [1] to 110 [2], notifies the occurrence of the abnormality by use of the display device 304 and transmits the write & read command signal for stopping the operation of the abnormal part (#13). In other words, the MCU 200 transmits, to the driver IC 100, the write & read command signal for provides an instruction to turn off all the power transistors in the unit output circuits 110 [1] and 110 [2]. The notification means notification to the user of the load drive system and a person who rides in the vehicle CC.

However, it is assumed that by the transmission of the write & read command signal, the states of the individual power transistors in the unit output circuits 110 [3] to 110 [8] are not changed. Specifically, the MCU 200 controls the driver IC 100 such that among the unit output circuits 110 [1] to 110 [8], only the operations of the unit output circuits 110 [1] and 110 [2] in which the abnormality is detected are stopped, that is, that among the drive CHs 1 to 4, only the operation of the drive CH 1 in which the abnormality is detected is stopped. The operation of the unit output circuit refers to the operation of supplying power to the load which needs to be connected to the unit output circuit (the same is true for the operation of the drive CH).

In a conventional system, in general, even when an abnormality is detected only in one part, the drive of all the motors is stopped. By contrast, in the present example, the driver IC 100 can stop, based on the result of detection of the abnormality detection circuit (here, the result of the low load detection of the drive circuit), the operation of only the part in which the abnormality is detected by the cooperation with the MCU 200. Hence, for example, even when as described above, a failure occurs in the switching of the inside air and the outside air with the air conditioner, the switching of the directions in which the wind is blown and the temperature adjustment can be maintained, with the result that comfort within the vehicle is easily maintained as compared with the conventional system.

When a failed vehicle is brought to an agency which performs a failure investigation or repair, a failure investigator in the agency first investigates in which part a failure (abnormality) occurs, and in the present example, the failure investigator checks details stored in the read register RR3 so as to be able to immediately understand that the abnormality caused by the low load state occurs in the unit output circuits 110 [1] and 110 [2], with the result that it is easy to perform repair.

Preferably, since details stored in the read registers RR1 to RR4 are lost when the supply of the control power supply voltage VB is stopped, the MCU 200 acquires, as necessary, all or part of data stored in the read registers RR1 to RR4 by utilization of the SPI communication so as to store the acquired data in a nonvolatile memory (such as a flash memory; unillustrated) incorporated in itself. Then, the agency which performs the failure investigation or repair on the vehicle CC connects, with arbitrary timing, for example, a tester to a dedicated terminal provided in the vehicle CC so as to be able to transmit, from the tester to the MCU 200, a predetermined command signal for requesting the return of the data stored in the memory. In this way, the data stored in the memory including all or part of the data stored in the read registers RR1 to RR4 before the supply of the control power supply voltage VB is stopped is acquired with the tester, the acquired details are referenced and thus the agency can rapidly check the part where an abnormality occurs and the details of the abnormality. The MCU 200 may be able to display, on the display device 304, the data stored in the memory including all or part of the data stored in the read registers RR1 to RR4 before the supply of the control power supply voltage VB is stopped. The agency checks the details of the display so as to be able to rapidly check the part where the abnormality occurs and the details of the abnormality.

Example EX4_2

The example EX4_2 will be described.

The flow of the operation of the load drive system when a short-circuit failure occurs in the example EX4_2 will be described with reference to FIG. 31. It is now assumed that the basic operation state of FIG. 29 is a starting point and that a failure occurs in which the output terminals OUT1 and OUT2 are short-circuited (#21). Then, the current value $I_H$ [1] of the power transistor TrH [1] detected in the unit output circuit 110 [1] is equal to or more than a predetermined overcurrent protection threshold value, and consequently, it is detected that the power transistor TrH [1] is in the overcurrent state. Although here, it can be considered that the current value $I_L$ [2] of the power transistor TrL [2] detected in the unit output circuit 110 [2] is also equal to or more than the overcurrent protection threshold value, for convenience of description, whether or not the power transistor TrL [2] is in the overcurrent state is ignored here (it may be assumed that overcurrent detection is not performed on the power transistor TrL [2]).

Based on the result of the detection in which the power transistor TrH [1] is in the overcurrent state, the control circuit 120 stores "1" in the bit (individual overcurrent state bit) of the bit number 1 in the read register RR3 (see FIG. 14) and stores "1" in the bit (logical sum overcurrent state bit) of the bit number 3 in the read register RR1 (see FIG. 12). Furthermore, in order to protect the power transistor TrH [1] from the overcurrent state, the control circuit 120 instantly turns off the power transistor TrH [1] or instantly turns off all the power transistors in the drive CH 1. The off states of the power transistors (including at least the TrH [1]) which are turned off in order to protect the power transistor TrH [1] from the overcurrent state may be maintained until a predetermined condition is satisfied (for example, until the logic reset processing is performed) without depending on the data of the write register WR1 (FIG. 10).

Thereafter, when the write & read command signal or the read command signal in which the read register RR3 is the target read register is received in the driver IC 100, by the transmission of the data-out signal, information for identifying the part and details of an abnormality (here, the abnormality caused by the overcurrent state) is notified from the driver IC 100 to the MCU 200 (#22). In other words, the details of the data of the individual bits in the read register RR3 are acquired in the MCU 200. By the acquisition described above, the MCU 200 recognizes that the abnormality caused by the overcurrent state occurs in the power transistor TrH [1], notifies the occurrence of the abnormality by use of the display device 304 and transmits the write & read command signal for stopping the operation of the abnormal part (#23). In other words, the MCU 200 transmits, to the driver IC 100, the write & read command signal for providing an instruction to turn off one or more power transistors including the power transistor TrH [1]. Here, since it is assumed that the motor M1 is subjected to full-bridge drive by the unit output circuits 110 [1] and 110 [2], the write & read command signal for providing an instruction to turn off all the power transistors in the unit output circuits 110 [1] and 110 [2] may be transmitted to the driver IC 100.

However, it is assumed that by the transmission of the write & read command signal, the states of the individual power transistors in the unit output circuits 110 [3] to 110 [8] are not changed. Specifically, the MCU 200 controls the driver IC 100 such that among the unit output circuits 110 [1] to 110 [8], only the operations (the power supply operations to the load) of the unit output circuits 110 [1] and 110 [2] in which the abnormality is detected are stopped, that is, that among the drive CHs 1 to 4, only the operation (the power supply operation to the load) of the drive CH 1 in which the abnormality is detected is stopped. Unlike the example EX4_1, when the overcurrrent state is detected, since the corresponding power transistors are instantly turned off on the side of the driver IC 100 without an instruction from the MCU 200 being waited for, the transmission of the write & read command signal for stopping the operation of the abnormal part can be omitted.

In the conventional system, in general, even when an abnormality is detected only in one part, the drive of all the motors is stopped. By contrast, in the present example, the driver IC 100 can stop, based on the result of detection of the abnormality detection circuit (here, the result of the overcurrent detection of the drive circuit), the operation of only the part in which the abnormality is detected. Hence, for example, even when as described above, a failure occurs in the switching of the inside air and the outside air with the air conditioner, the switching of the directions in which the wind is blown and the temperature adjustment can be maintained, with the result that comfort within the vehicle is easily maintained as compared with the conventional system.

When a failed vehicle is brought to an agency which performs a failure investigation or repair, a failure investigator in the agency first investigates in which part a failure (abnormality) occurs, and in the present example, the failure investigator checks details stored in the read register RR3 so as to be able to immediately understand that the abnormality caused by the overcurrent state occurs in the unit output circuit 110 [1] (more specifically, the power transistor TrH [1]), with the result that it is easy to perform repair.

Example EX4_3

The example EX4_3 will be described.

Figure 32:
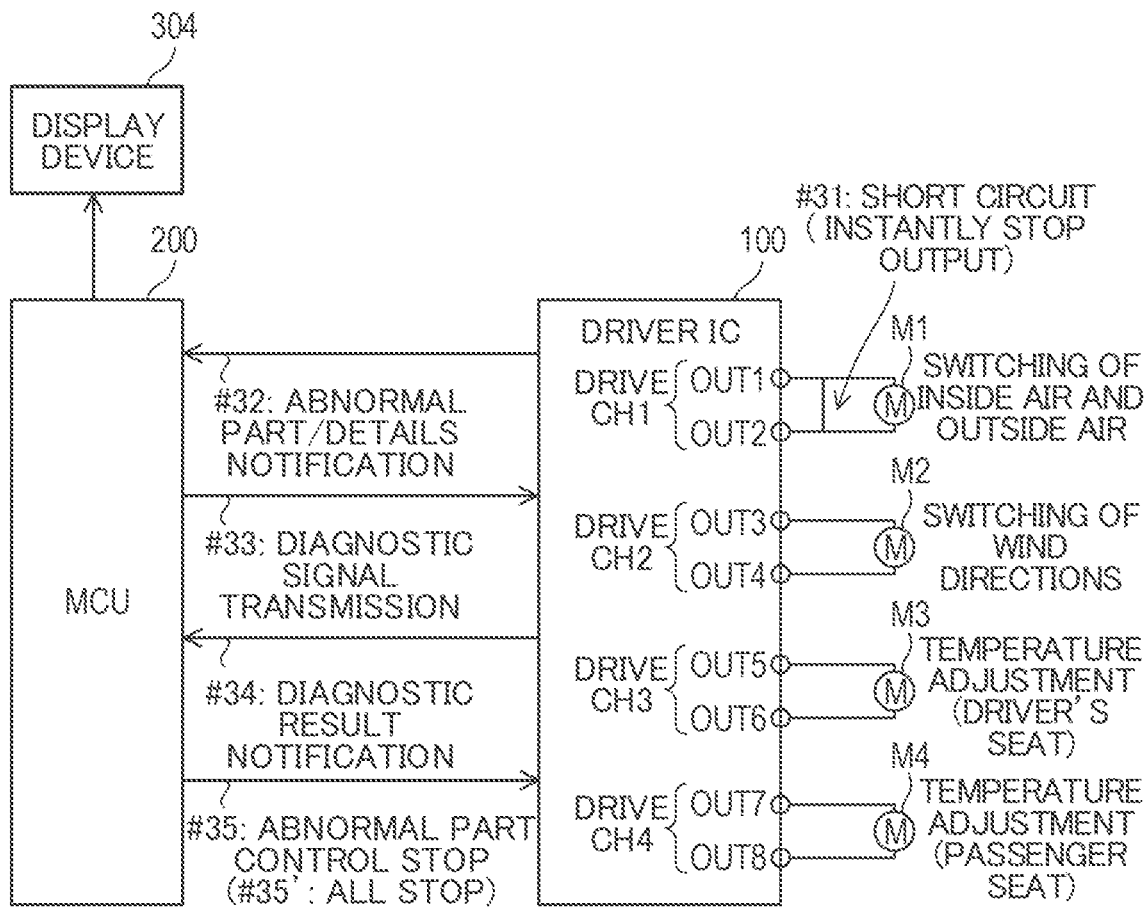
FIG. 32 is an illustrative diagram of the operation of the load drive system when a short circuit failure occurs in the example EX4_3 of the fourth embodiment of the present invention.

The flow of the operation of the load drive system when a short-circuit failure occurs in the example EX4_3 will be described with reference to FIG. 32. It is now assumed that the basic operation state of FIG. 29 is a starting point and that a failure occurs in which the output terminals OUT1 and OUT2 are short-circuited (#31). Then, the current value $I_H$ [1] of the power transistor TrH [1] detected in the unit output circuit 110 [1] is equal to or more than a predetermined overcurrent protection threshold value, and consequently, it is detected that the power transistor TrH [1] is in the overcurrent state. Although here, it can be considered that the current value $I_L$ [2] of the power transistor TrL [2] detected in the unit output circuit 110 [2] is also equal to or more than the overcurrent protection threshold value, for convenience of description, whether or not the power transistor TrL [2] is in the overcurrent state is ignored here (it may be assumed that overcurrent detection is not performed on the power transistor TrL [2]).

Based on the result of the detection in which the power transistor TrH [1] is in the overcurrent state, the control circuit 120 stores "1" in the bit (individual overcurrent state bit) of the bit number 1 in the read register RR3 (see FIG. 14) and stores "1" in the bit (logical sum overcurrent state bit) of the bit number 3 in the read register RR1 (see FIG. 12). Furthermore, in order to protect the power transistor TrH [1] from the overcurrent state, the control circuit 120 instantly turns off the power transistor TrH [1] or instantly turns off all the power transistors in the drive CH 1. The off states of the power transistors (including at least the TrH [1]) which are turned off in order to protect the power transistor TrH [1] from the overcurrent state may be maintained until a predetermined condition is satisfied (for example, until the logic reset processing is performed) without depending on the data of the write register WR1 (FIG. 10).

Thereafter, when the write & read command signal or the read command signal in which the read register RR3 is the target read register is received in the driver IC 100, by the transmission of the data-out signal, information for identifying the part and details of an abnormality (here, the abnormality caused by the overcurrent state) is notified from the driver IC 100 to the MCU 200 (#32). In other words, the details of the data of the individual bits in the read register RR3 are acquired in the MCU 200. By the acquisition described above, the MCU 200 recognizes that the abnormality caused by the overcurrent state occurs in the power transistor TrH [1], notifies the occurrence of the abnormality by use of the display device 304 and transmits diagnostic signals (#33).

In the transmission of the diagnostic signals, a first write & read command signal for performing the logic reset processing is first transmitted, and a second write & read command signal is then transmitted that provides an instruction to turn on only the power transistor TrH [1] in which the overcurrent state is detected among the four power transistors of the drive CH 1 and to turn off the remaining three power transistors TrL [1], TrH [2] and TrL [2]. The logic reset processing is needed in order to release the latching of the bit on the overcurrent of the read register (the MCU 200 cannot acquire the result of the diagnostic processing while the bit is being latched to "1").

Figure 33:
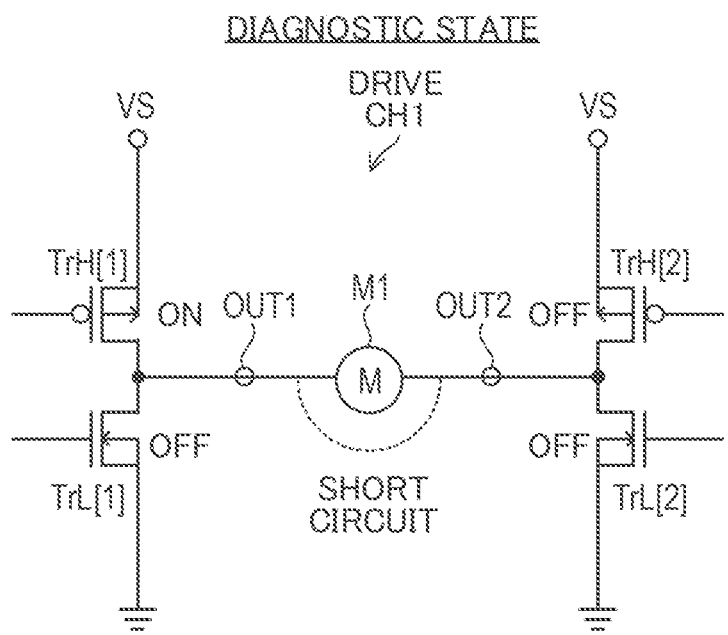
FIG. 33 is a diagram showing the diagnostic state of power transistors on diagnostic processing in the example EX4_3 of the fourth embodiment of the present invention.

When the driver IC 100 receives the diagnostic signals (first and second write & read command signals), after the logic reset processing is performed, the state of the drive CH 1 is brought into a diagnostic state shown in FIG. 33. The diagnostic state here follows the second write & read command signal, and in the diagnostic state, the power transistors TrH [1], TrL [1], TrH [2] and TrL [2] are respectively turned on, turned off, turned off and turned off.

The control circuit 120 reflects the result of the overcurrent detection in the diagnostic state on the read register as the result of the diagnostic processing. Specifically, when in the diagnostic state, it is determined that the power transistor TrH [1] is in the overcurrent state, "1" is stored in the bit of the bit number 1 in the read register RR3 (see FIG. 14) whereas when this is not true, the data of the bit is kept at "0".

After a predetermined time has elapsed since the transmission of the diagnostic signals, the MCU 200 transmits, to the driver IC 100, the write & read command signal or the read command signal in which the read register RR3 is the target read register, and the driver IC 100 receives the signal so as to transmit the data-out signal and thereby transmits, to the MCU 200, the details of the data of the individual bits in the read register RR3. In other words, the driver IC 100 notifies the result of the diagnostic processing to the MCU 200 (#34). The diagnostic processing here refers to a series of processing steps in which by the transmission of the diagnostic signals, the state of the power transistors in the drive CH on the abnormality of the overcurrent is set to the diagnostic state and in which the detection result information (here, the data of the individual bits in the read register RR3) of the overcurrent in the drive CH in the diagnostic state is acquired.

Here, since the abnormality which occurs in the drive CH 1 is a short circuit between the output terminals OUT1 and OUT2, in the diagnostic state, the power transistor TrH [1] is not in the overcurrent state. The MCU 200 receives the result of the diagnostic processing so as to determine that the abnormality detected in the power transistor TrH [1] and caused by the overcurrent state is caused by the short circuit between the output terminals OUT1 and OUT2, and thereby transmits the write & read command signal for stopping the operation of the abnormal part (#35). In other words, the MCU 200 transmits, to the driver IC 100, the write & read command signal for providing an instruction to turn off one or more power transistors including the power transistor TrH [1]. Here, since it is assumed that the motor M1 is subjected to full-bridge drive by the unit output circuits CH1 and CH2, the write & read command signal for providing an instruction to turn off all the power transistors in the unit output circuits 110 [1] and 110 [2] may be transmitted to the driver IC 100.

However, it is assumed that by the transmission of the write & read command signal, the states of the individual power transistors in the unit output circuits 110 [3] to 110 [8] are not changed. Specifically, the MCU 200 controls the driver IC 100 such that among the unit output circuits 110 [1] to 110 [8], only the operations (the power supply operations to the load) of the unit output circuits 110 [1] and 110 [2] in which the abnormality is detected are stopped, that is, that among the drive CHs 1 to 4, only the operation (the power supply operation to the load) of the drive CH 1 in which the abnormality is detected is stopped.

As described above, the driver IC 100 acquires the result of the overcurrent detection in the diagnostic state (FIG. 33), thereafter notifies the result to the MCU 200 (#34), then receives the write & read command signal from the MCU 200 (#35), responses to the reception thereof and thereby turns off the output power transistor on the abnormal part. In this stage, the overcurrent state bit corresponding to the power transistor which is turned off on the abnormal part is "0". Thereafter, the MCU 200 acquires, as necessary, through the transmission of the read command signal or the write & read command signal, the data (including the data of the bit of the bit number 1 in the read register RR3) of the overvoltage state bit corresponding to the power transistor which is turned off on the abnormal part, and thereby can confirm that the overcurrent state is removed.

In the conventional system, in general, even when an abnormality is detected only in one part, the drive of all the motors is stopped. By contrast, in the present example, the driver IC 100 can stop, based on the result of detection of the abnormality detection circuit (here, the result of the overcurrent detection of the drive circuit), the operation of only the part in which the abnormality is detected. Hence, for example, even when as described above, a failure occurs in the switching of the inside air and the outside air with the air conditioner, the switching of the directions in which the wind is blown and the temperature adjustment can be maintained, with the result that comfort within the vehicle is easily maintained as compared with the conventional system.

When a failed vehicle is brought to an agency which performs a failure investigation or repair, a failure investigator in the agency first investigates in which part a failure (abnormality) occurs, and in the present example, the failure investigator checks details stored in the read register RR3 so as to be able to immediately understand that the abnormality caused by the overcurrent state occurs in the unit output circuit 110 [1] (more specifically, the power transistor TrH [1]), with the result that it is easy to perform repair.

In the diagnostic state described above, information indicating that the power transistor TrH [1] is in the overcurrent state may be acquired. Such information can be acquired when the output terminal OUT1 is short-circuited to the ground or when the driver IC 100 is destroyed. If the information indicating that in the diagnostic state, the power transistor TrH [1] is in the overcurrent state is included in the result of the diagnostic processing, since it is preferable to stop the entire operation of the driver IC 100, the MCU 200 transmits, to the driver IC 100, the write & read command signal for providing an instruction to turn off all the power transistors in the unit output circuits 110 [1] to 110 [8] (#35'). An enable signal for the driver IC 100 may be turned low. Furthermore, when a switch which is inserted in series between the battery 301 and the terminal VS is provided in the load drive system, the switch may be turned off.

Example EX4_4

The example EX4_4 will be described. In the following examples including the example EX4_4, supplementary explanations and variation technology explanations on the details of the technologies embodied in the first embodiment and the examples EX4_1 to EX4_3 of the fourth embodiments will be performed.

As described above, the driver IC 100 can be said to include the abnormality detection circuit for detecting an abnormality. Specifically, on the abnormality detection circuit, the detection of an abnormality is preferably interpreted to indicate the detection of whether or not an abnormality occurs. Abnormalities to be detected can include a plurality of types of abnormalities. Among the types of abnormalities, on specific abnormalities, the abnormalities can be detected for each of the unit output circuits (whether or not the abnormalities occur can be detected) or the abnormalities can be detected (whether or not the abnormalities occur can be detected) for each of the unit output circuits and in each of the power transistors. In the first embodiment and the examples EX4_1 to EX4_3 of the fourth embodiments, the specific abnormalities include an abnormality caused by the overcurrent state and an abnormality caused by the low load state (the same may be true in the second and third embodiments).

However, the specific abnormalities which are detected in each of the unit output circuits may be abnormalities other than them. Specifically, for example, an abnormality on the temperature, an abnormality on the overvoltage or an abnormality on the reduced voltage may be included in the specific abnormalities. In order to include the abnormality on the temperature in the specific abnormalities, it is preferable to perform a temperature measurement in each of the unit output circuits so as to determine whether or not the warning temperature state or the shutdown temperature state is entered in each of the unit output circuits. The same is true for the abnormality on the overvoltage and the abnormality on the reduced voltage.

Figure 34:
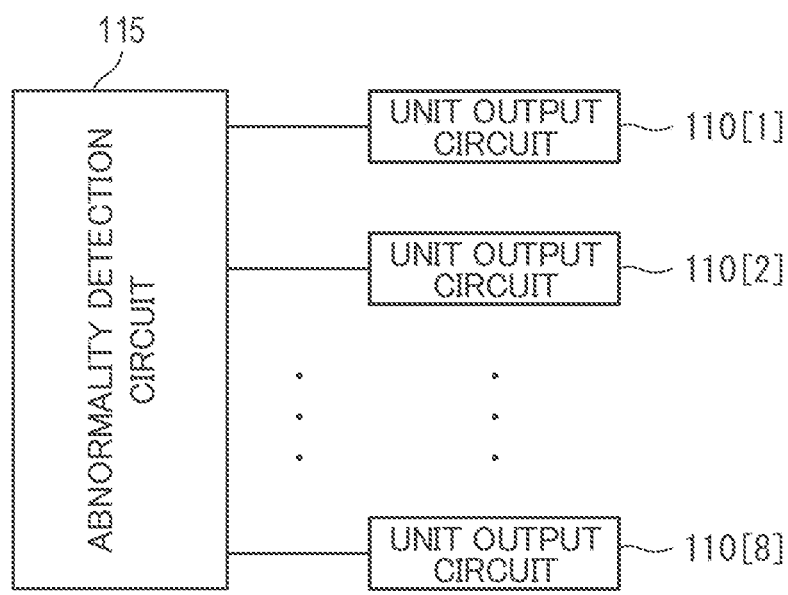
FIG. 34 is a diagram showing a relationship between an abnormality detection circuit and a plurality of unit output circuits in the example EX4_4 of the fourth embodiment of the present invention.

In the configuration examples described above, the drive circuit 111 [i] of each of the unit output circuits has the function of detecting the specific abnormalities (specifically, the function of detecting whether or not the specific abnormalities occur; hereinafter referred to as the specific abnormality detection function). In other words, the abnormality detection circuit for the specific abnormality detection function is formed with the drive circuits 111 [1] to 111 [8]. However, it can also be considered that as shown in FIG. 34, the circuit for the specific abnormality detection function, that is, the abnormality detection circuit 115 for detecting the specific abnormalities (whether or not the specific abnormalities occur) in each of the unit output circuits is provided in the driver IC 100 separately from the unit output circuits 110 [1] to 110 [8]. When it is considered that the drive circuit 111 [i] has the specific abnormality detection function, though a first circuit for driving the power transistor and a second circuit for the specific abnormality detection function are included in the drive circuit 111 [i], it may be considered that the unit output circuit 110 [i] is formed with the first circuit and the power transistors TrH [i] and TrL [i] and that the abnormality detection circuit 115 is formed with the second circuit separate from the unit output circuit 110 [i].

The abnormalities in the example EX4_4 and the example EX4_5 to be discussed later which will be described below are assumed to refer to the "specific abnormalities" described above unless otherwise specified.

As described in the examples EX4_1 to EX4_3, the control circuit 120 of the driver IC 100 can stop, based on the result of detection of the abnormality detection circuit, the operations of only part of the unit output circuits 110 [1] to 110 [8]. For example, in the examples of FIGS. 30 and 31, it is possible to stop the operations (the power supply operations to the load) of only the unit output circuits 110 [1] and 110 [2]. The effects resulting therefrom are as described in the examples EX4_1 to EX4_3.

In the driver IC 100, the read registers are included which store information indicating whether or not an abnormality is detected for each of the unit output circuits. For example, on the abnormality caused by the low load state, by the bits of the bit numbers 8 to 11 in the read registers RR3 and RR4 (see FIGS. 14 and 15), the information indicating whether or not an abnormality is detected is stored for each of the unit output circuits, and on the abnormality caused by the overcurrent state, by the bits of the bit numbers 0 to 7 in the read registers RR3 and RR4, the information indicating whether or not an abnormality is detected is stored for each of the unit output circuits and for each of the power transistors. As described above, when it is detected that an abnormality occurs in a specific unit output circuit among the unit output circuits 110 [1] to 110 [8], the control circuit 120 stores information indicating that the abnormality is detected in the specific unit output circuit (including the unit output circuit 110 [1] in the examples of FIGS. 30 to 32) in the corresponding bit of the corresponding read register, and can stop the operation (the power supply operation to the load) of at least the specific unit output circuit.

When it is detected that an abnormality occurs in the specific unit output circuit, for example, if the specific unit output circuit is the unit output circuit 110 [1], the operation of only the unit output circuit 110 [1] may be stopped. However, since in the first embodiment and the examples EX4_1 to EX4_3 of the fourth embodiment, it is assumed that the motor M1 is subjected to full-bridge drive by the unit output circuits 110 [1] and 110 [2], the operations of both the unit output circuits 110 [1] and 110 [2] may be stopped (the same may be true in the second and third embodiments).

In the driver IC 100, communication terminal portions is provided which is connected to the MCU 200 so as to be able to communicate therewith. The communication terminal portions include the terminals SCK, SDI and SDO and can include the terminal CSB. In the driver IC 100, individual abnormality information indicating whether or not an abnormality is detected in each of the unit output circuits and logical sum abnormality information indicating whether or not an abnormality is detected in any one or more of two or more unit output circuits are stored in the read register. In the examples shown in FIGS. 12 to 15, the individual abnormality information is stored in the individual overcurrent state bit and the individual low load state bit of the read registers RR3 and RR4, and the logical sum abnormality information is stored in the logical sum overcurrent state bit and the logical sum low load state bit of the read registers RR1 and RR2. When the write & read command signal or the read command signal is received in the communication terminal portion, the control circuit 120 can selectively transmit, to the MCU 200, the storage information of the read register (RR3 or RR4) storing the individual abnormality information or the storage information of the read register (RR1 or RR2) storing the logical sum abnormality information.

Figure 35:
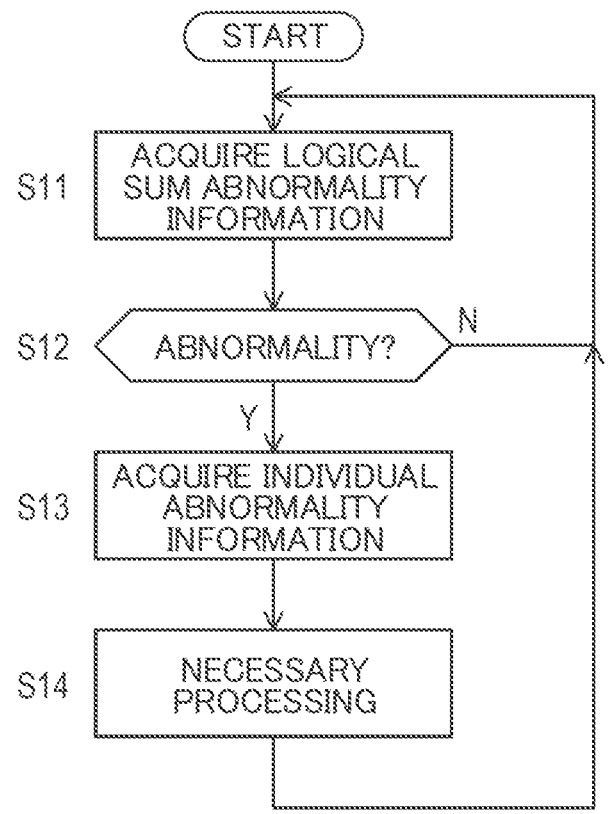
FIG. 35 is a diagram showing the flow of the load drive system on abnormality detection and the corresponding operation in the example EX4_4 of the fourth embodiment of the present invention.

Hence, in a flow shown in FIG. 35, the load drive system can be operated. Specifically, the MCU 200 transmits the predetermined write & read command signal so as to bring the states of the power transistors in each of the unit output circuits into desired states suitable for the drive of the load (for example, the basic operation state of FIG. 29), and thereafter periodically transmits the read command signal (or the write & read command signal) in which the read register RR1 or RR2 is the target read register so as to acquire the logical sum abnormality information from the driver IC 100 (step S11). When an abnormality is not recognized in the logical sum abnormality information, it is not necessary to read the storage data in the read register RR3 or RR4 (N in step S12) whereas when an abnormality is recognized in the logical sum abnormality information (Y in step S12), the MCU 200 transmits the read command signal (or the write & read command signal) in which the read register RR3 or RR4 is the target read register so as to acquire the individual abnormality information from the driver IC 100 (step S13), and uses the method as described in the examples EX4_1 to EX4_3 so as to perform necessary processing such as the stopping of the operation of the unit output circuit in which the abnormality occurs (step S14). Specifically, when the data of the bit of the bit number 2 or 3 in the read register RR1 is "1", the read command signal (or the write & read command signal) in which the read register RR3 is the target read register is preferably transmitted whereas when the data of the bit of the bit number 2 or 3 in the read register RR2 is "1", the read command signal (or the write & read command signal) in which the read register RR4 is the target read register is preferably transmitted.

In this way, it is possible to perform the method of using the driver IC 100 as follows. Basically, the details stored in the read register RR1 or RR2 are periodically acquired, and thus the state of each of the power transistors and whether or not an abnormality occurs in any one or more of the unit output circuits are periodically checked, and when it is found that an abnormality occurs in any one or more of the unit output circuits, the details stored in the read register RR3 or RR4 are acquired such that in which one of the unit output circuits the abnormality occurs is found in detail.

Since it is difficult to think that abnormalities occur with high frequency, the necessity to usually monitor the individual abnormality information is low. The usual monitoring of even the individual abnormality information can result in increasing the processing load of the MCU 200 beyond necessity. When the flow of the operation as shown in FIG. 35 is adopted, it is possible to acquire the individual abnormality information as necessary without increasing the processing load of the MCU 200. It can be considered that the advantage of this method is enhanced as the number of unit output circuits provided in the driver IC 100 is increased.

The MCU 200 (processing device) which is the external device for the driver IC (load drive device) can specify the state of each of the unit output circuits and acquire information stored in each of the read registers through communication using the communication terminal portion. Specifically, the write & read command signal is transmitted so as to be able to specify the states of the power transistors in each of the unit output circuits, and the write & read command signal or the read command signal is transmitted so as to be able to acquire the information stored in the read registers (RR1 to RR4).

Then, when the MCU 200 transmits the write & read command signal or the read command signal to the communication terminal portion so as to acquire information indicating that an abnormality is detected in the specific unit output circuit, the MCU 200 can change the control state of the driver IC 100 from a first control state to a second control state. The first control state is a control state in which all the operations (the power supply operations to the load) of the unit output circuits 110 [1] to 110 [8] are allowed, and the basic operation state of FIG. 29 is included in the first control state. The second control state is a control state in which the operations (the power supply operations to the load) of part of the unit output circuits 110 [1] to 110 [8] including the specific unit output circuit are stopped and in which the operations (the power supply operations to the load) of the remaining part of the unit output circuits are allowed.

Figure 30:
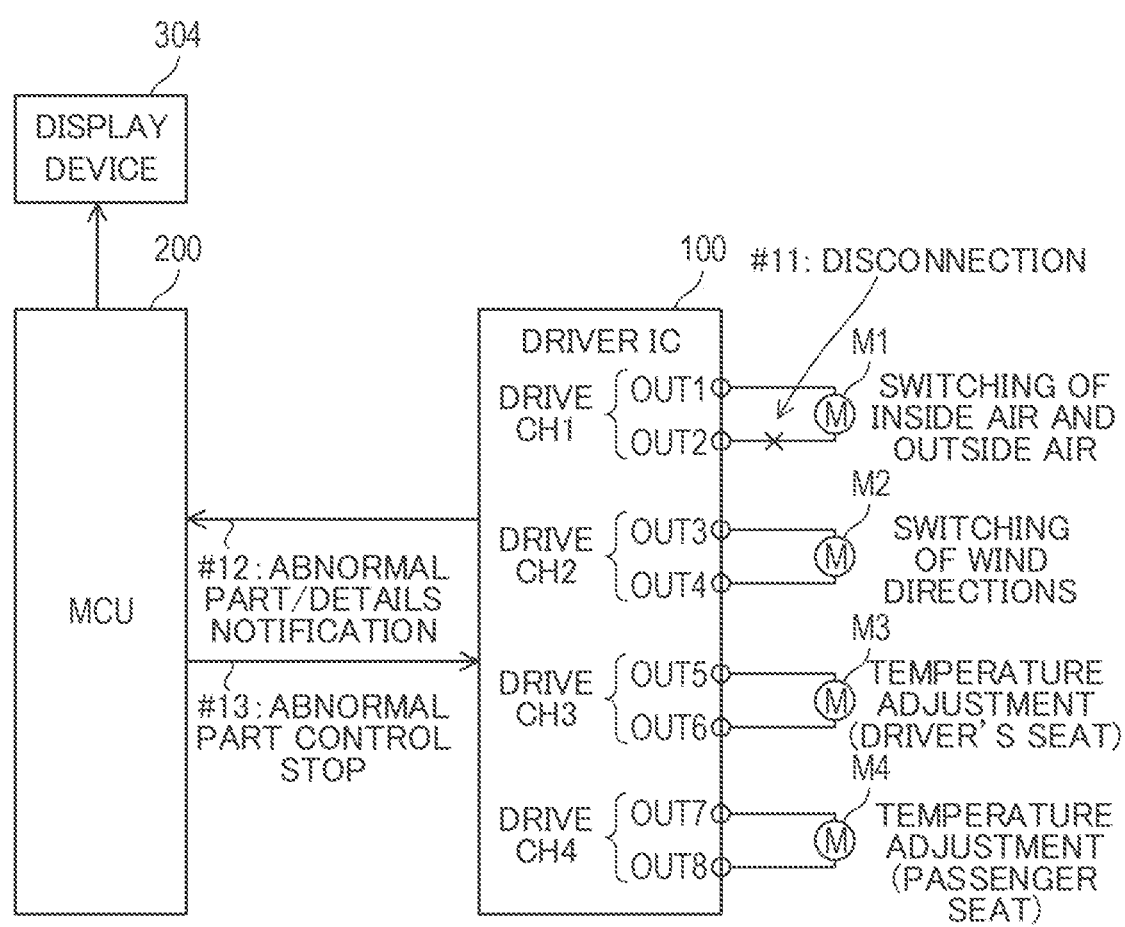
FIG. 30 is an illustrative diagram of the operation of a load drive system when a motor is disconnected in the example EX4_1 of the fourth embodiment of the present invention.
Figure 31:
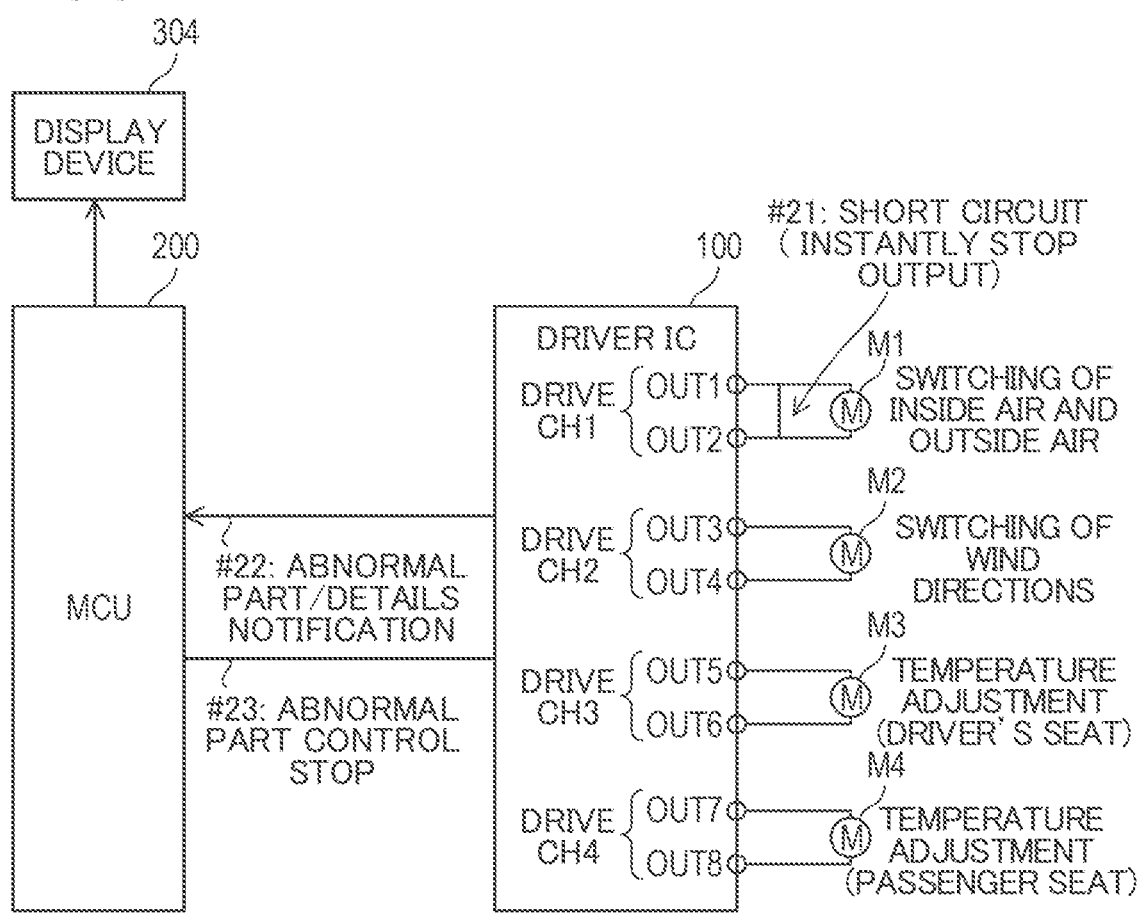
FIG. 31 is an illustrative diagram of the operation of the load drive system when a short circuit failure occurs in the example EX4_2 of the fourth embodiment of the present invention.

In the example of FIG. 30 or FIG. 31, the unit output circuits 110 [1] and 110 [2] correspond to the specific unit output circuits or only the unit output circuit 110 [1] corresponds to the specific unit output circuit. In the example of FIG. 30, before a disconnection failure (#11) occurs, the first control state is entered, and after the disconnection failure occurs, the first control state is transferred to the second control state through communication between the MCU 200 and the driver IC 100 (#12 and #13). In the example of FIG. 31, before a short-circuit failure (#21) occurs, the first control state is entered, and after the short-circuit failure occurs, the first control state is transferred to the second control state through the communication between the MCU 200 and the driver IC 100 (#22 and #23).

In the method of the example EX4_3 (see FIGS. 32 and 33), when an abnormality is detected in the specific unit output circuit, the predetermined diagnostic processing can be performed, and the MCU 200 can switch between the stopping of the operations of only part of the unit output circuits 110 [1] to 110 [8] including the specific unit output circuit (#35) and the stopping of the operations of all the unit output circuits (#35') according to the result of the diagnostic processing. By the diagnostic processing, it is possible to find the details of the cause of the abnormality, and the control of the operation corresponding to the result thereof is performed.

Example EX4_5

The example EX4_5 will be described.

Although the method of storing the logical sum abnormality information in the read register of the driver IC 100 is described above, in the driver IC 100, logical sum circuits which generate the logical sum abnormality information based on the individual abnormality information may be provided. Specifically, for example, in the driver IC 100, the following logical sum circuits may be provided: a first logical sum circuit which receives an input of data in the bits (individual overcurrent state bits) of the bit numbers 0 to 7 in the read register RR3 and which generates and outputs the logical sum of the input data as first logical sum abnormality information; a second logical sum circuit which receives an input of data in the bits (individual overcurrent state bits) of the bit numbers 0 to 7 in the read register RR4 and which generates and outputs the logical sum of the input data as second logical sum abnormality information; a third logical sum circuit which receives an input of data in the bits (individual low load state bits) of the bit numbers 8 to 11 in the read register RR3 and which generates and outputs the logical sum of the input data as third logical sum abnormality information; and a fourth logical sum circuit which receives an input of data in the bits (individual low load state bits) of the bit numbers 8 to 11 in the read register RR4 and which generates and outputs the logical sum of the input data as fourth logical sum abnormality information.

In this case, the control circuit 120 can use, instead of the logical sum abnormality information which needs to be stored in the bits (logical sum overcurrent state bits) of the bit numbers 3 in the read registers RR1 and RR2, the first and second logical sum abnormality information output from the first and second logical sum circuits, and can use, instead of the logical sum abnormality information which needs to be stored in the bits (logical sum low load state bits) of the bit numbers 2 in the read registers RR1 and RR2, the third and fourth logical sum abnormality information output from the third and fourth logical sum circuits. Hence, although in the above description, "when the write & read command signal or the read command signal is received in the communication terminal portion, the control circuit 120 can selectively transmit, to the MCU 200, the storage information of the read register (RR3 or RR4) storing the individual abnormality information or the storage information of the read register (RR1 or RR2) storing the logical sum abnormality information", instead of this operation, an operation may be performed in which when the write & read command signal or the read command signal is received in the communication terminal portion, the control circuit 120 selectively transmits, to the MCU 200, the storage information of the read register (RR3 or RR4) storing the individual abnormality information or the logical sum abnormality information from the logical sum circuits (any one or more of the first to fourth logical sum circuits).

The load which is connected to each of the output terminals in the driver IC 100 is not limited to the motor, and may be an arbitrary load. As shown in FIG. 27A or 27B, loads LD [1] to LD [8] which are different from each other may be respectively connected to the output terminals OUT [1] to OUT [8]. The load LD [i] may be the motor or may be an arbitrary load (for example, a relay, a light-emitting element or a heater) other than the motor (i is an integer). Arbitrary two or more of the loads LD [1] to LD [8] may be loads of the same type or loads of different types. In FIG. 27A, the load LD [i] is connected between the output terminal OUT [i] and the ground, and a current is passed from the output terminal OUT [i] through the load LD [i] to the ground so as to provide drive power to the load LD [i]. In FIG. 27B, the load LD [i] is connected between the load power supply terminal to which the load power supply voltage VA (see FIG. 1) is applied and the output terminal OUT [i], and a current is passed from the load power supply terminal through the load LD [i] and the output terminal OUT [i] to the ground so as to provide drive power to the load LD [i]. In the connection example as shown in FIG. 27A or 27B, for example, when the overcurrent state or the low load state is detected only in the unit output circuit 110 [1], the operation (the power supply operation to the load) of only the unit output circuit 110 [1] is stopped, and the operations (the power supply operations to the loads) of the unit output circuits 110 [2] to 110 [8] can be maintained.

Although in the above description, in the driver IC 100, the output stage of each of the unit output circuits is the half-bridge circuit, the output stage of each of the unit output circuits does not need to be the half-bridge circuit. Specifically, for example, in the connection example of FIG. 27A, the power transistor (TrL [i]) on the side of the low side may be omitted from each of the unit output circuits or in the connection example of FIG. 27B, the power transistor (TrH [i]) on the side of the high side may be omitted from each of the unit output circuits.

Although in the above description, bidirectional communication is realized between the MCU 200 and the driver IC 100 by the SPI communication, as long as bidirectional communication can be performed between the MCU 200 and the driver IC 100, in the MCU 200 and the driver IC 100, any communication method may be adopted, and parallel communication may be adopted.

The number of unit output circuits and the number of output terminals provided in the driver IC 100 are not limited to 8, and the numbers thereof can be arbitrary two or more (for example, 6, 8, 12 or 16).

Although the load drive system is assumed to be mounted in the vehicle, the load drive system can be mounted and utilized in various devices other than the vehicle.

Example EX4_6

The example EX4_6 will be described.

The load drive device supplies power to a load so as to drive the load. A device which drives a motor as the load may also be referred to as a motor driver. Motor drivers are used in various applications including a vehicle-mounted application. In the load drive device like the motor driver, a function of detecting an abnormality such as an overcurrent is often provided.

In the load drive device, output circuits in each of a plurality of channels may be provided, and in this case, in general, when an abnormality is detected in any one of the output circuits, the operations of all the output circuits are stopped. However, for example, when in a vehicle-mounted motor driver (load drive device) which drives, four loads, a motor for switching inside air and outside air, a motor for switching wind directions, a motor for adjusting the temperature of the driver's seat and a motor for adjusting the temperature of the passenger seat, an abnormality is detected in an output circuit for the motor for switching inside air and outside air, if the drive of all the motors is stopped, comfort within the vehicle is greatly impaired. Although the operation on the vehicle-mounted motor driver is described, in various load drive devices, the same or similar situation can be present.

It is beneficial to provide a load drive device, a semiconductor device, a load drive system and a vehicle which contribute to optimization of circuit control on abnormality detection.

In view of the foregoing, a load drive device $W_B$ embodied in each of the embodiments described above (in particular, the first and fourth embodiments) and according to one aspect of the present invention is configured as below.

The load drive device $W_B$ includes: a plurality of output circuits which can supply power to individual loads; an abnormality detection circuit which detects an abnormality for each of the output circuits; and a control circuit which controls the output circuits, and the control circuit can stop the operations of only part of the output circuits based on the result of the detection of the abnormality detection circuit (hereinafter referred to as a configuration J1).

Preferably, specifically, for example, in the load drive device $W_B$ according to the configuration J1, the control circuit includes a storage portion, and when it is detected that an abnormality occurs in a specific output circuit of the output circuits, information indicating that the abnormality is detected in the specific output circuit can be stored in the storage portion, and the operation of at least the specific output circuit can be stopped (hereinafter referred to as a configuration J2).

Preferably, here, for example, in the load drive device $W_B$ according to the configuration J2, the storage portion stores, for each of the output circuits, information indicating whether or not an abnormality is detected in the abnormality detection circuit (hereinafter referred to as a configuration J3).

Preferably, furthermore, for example, in the load drive device $W_B$ according to the configuration J3, the storage portion includes: a first storage portion which stores individual abnormality information that is the information indicating, for each of the output circuits, whether or not an abnormality is detected; and a second storage portion which stores logical sum abnormality information indicating whether or not an abnormality is detected in any two or more of the output circuits (hereinafter referred to as a configuration J4).

Preferably, for example, in the load drive device $W_B$ according to any one of the configurations J2 to J4, a communication terminal portion which connects an external device for the load drive device and the load drive device such that they can communicate with each other is provided in the load drive device, and when a predetermined command signal is received in the communication terminal portion, the control circuit outputs the information stored in the storage portion from the communication terminal portion (hereinafter referred to as a configuration J5).

Preferably, for example, in the load drive device $W_B$ according to the configuration J4, a communication terminal portion which connects an external device for the load drive device and the load drive device such that they can communicate with each other is provided in the load drive device, and when a predetermined command signal is received in the communication terminal portion, the control circuit selectively outputs the information stored in the first storage portion or the information stored in the second storage portion from the communication terminal portion (hereinafter referred to as a configuration J6).

Preferably, for example, in the load drive device $W_B$ according to the configuration J3, a logical sum circuit is further provided, the storage portion stores individual abnormality information that is the information indicating, for each of the output circuits, whether or not an abnormality is detected and the logical sum circuit outputs, based on the details stored in the storage portion, logical sum abnormality information indicating whether or not an abnormality is detected in any two or more of the output circuits (hereinafter referred to as a configuration J4a).

Preferably, here, for example, in the load drive device $W_B$ according to the configuration J4a, a communication terminal portion which connects an external device for the load drive device and the load drive device such that they can communicate with each other is provided in the load drive device, and when a predetermined command signal is received in the communication terminal portion, the control circuit selectively outputs, from the communication terminal portion, the individual abnormality information stored in the storage portion or the logical sum abnormality information from the logical sum circuit (hereinafter referred to as a configuration J6a).

Preferably, specifically, for example, in the load drive device $W_B$ according to any one of the configurations J1 to J6, J4a and J6a, each of the output circuits includes a half-bridge circuit formed by connecting two transistors in series (hereinafter referred to as a configuration J7).

A semiconductor device according to the present invention is a semiconductor device which forms a load drive device serving as the load drive device $W_B$ according to any one of the configurations J1 to J7, J4a and J6a, and the load drive device is formed with an integrated circuit (hereinafter referred to as a configuration J8).

Preferably, for example, in the semiconductor device according to the configuration J8, a dissipation pad is provided on a housing in which the integrated circuit is sealed (hereinafter referred to as a configuration J9).

A load drive system according to the present invention includes: a load drive device serving as the load drive device $W_B$ according to the configuration J5, J6 or J6a; and a processing device which is connected to the load drive device through the communication terminal portion in the load drive device and which serves as the external device, and the processing device can specify the state of each of the output circuits through communication using the communication terminal portion and can acquire, through the transmission of the command signal to the communication terminal portion, the information stored in the storage portion (hereinafter referred to as a configuration J10). Preferably, here, in the configuration J10, when the configuration J6a is applied, the processing device transmits the command signal to the communication terminal portion so as to be able to acquire the information (the individual abnormality information) stored in the storage portion or the logical sum abnormality information from the logical sum circuit.

Preferably, specifically, for example, in the load drive system according to the configuration J10, when the processing device transmits the command signal to the communication terminal portion so as to acquire the information indicating that an abnormality is detected in the specific output circuit, the processing device can change the control state of the load drive device from a first control state in which the operations of the plurality of output circuits are allowed to a second control state in which the operations of part of the output circuits including the specific output circuit are stopped and in which the operations of the remaining part of the output circuits are allowed (hereinafter referred to as a configuration J11).

Preferably, for example, in the load drive system according to the configuration J10, when the processing device transmits the command signal to the communication terminal portion so as to acquire the information indicating that an abnormality is detected in the specific output circuit, the processing device can perform diagnostic processing in which the states of one or more of the output circuits including the specific output circuit are brought into a predetermined diagnostic state, and stops, according to the result of the diagnostic processing, the operations of only part of the output circuits including the specific output circuit or stops the operations of all the output circuits (hereinafter referred to as a configuration J12).

Preferably, a vehicle in which the load drive system according to any one of the configurations J10 to J12 is mounted is formed.

According to the configurations as described above, it is possible to provide the load drive device, the semiconductor device, the load drive system and the vehicle which contribute to optimization of circuit control on abnormality detection.

In the embodiments of the present invention, various modifications can be made as necessary within the range of technical thought indicated in the scope of claims. The embodiments described above are only examples of the embodiment of the present invention, and the meanings of terms in the present invention and individual constituent requirements are not limited to those described in the embodiments discussed above. Specific numerical values indicated in the above description are simply illustrative, and can naturally be changed to various numerical values.

LIST OF REFERENCE SYMBOLS 100, 100A driver IC
101 housing
110 [1] to 110 [8] unit output circuit
120 control circuit
111 [i] to 111 [8] drive circuit
200 MCU
OUT1 to OUT8 output terminal
M1 to M4 motor
WR1, WR2, WR2A write register
RR1 to RR4, RR2A, RR4A read register

The invention claimed is:
1. A load drive device comprising:
a pair of output terminals in each of a plurality of channels, wherein, in each of the channels, power can be supplied from the pair of output terminals to a load, wherein in each of two or more channels included in the plurality of channels, the pair of output terminals are arranged adjacent to each other,
wherein in two target channels which are included in the two or more channels and in which the corresponding output terminals are provided on a same surface of a housing of the load drive device, between a pair of output terminals forming one of the target channels and a pair of output terminals forming the other target channel, one or more terminals different from the output terminals are arranged, the load drive device further comprising:
one or more first power supply terminals which receive supply of a first voltage;
one or more second power supply terminals which receive supply of a second voltage different from the first voltage;
a ground terminal which is kept at a predetermined reference potential;
a plurality of external connection terminals which are connected to an external device for the load drive device; and
a separate terminal which is different from the first power supply terminal, the second power supply terminal, the ground terminal and the external connection terminals,
wherein, in each of the channels, power based on the first voltage is supplied from the pair of output terminals to the load,
the second voltage itself or a signal based on the second voltage is applied to the external connection terminals,
on the same surface, a first terminal group which includes a pair of output terminals forming any one of the plurality of channels and which is formed with a plurality of terminals that are aligned adjacent to each other and a second terminal group which includes one or more of the external connection terminals and which is formed with a plurality of other terminals that are aligned adjacent to each other are provided, and
one or more of the separate terminals are arranged between the first terminal group and the second terminal group.

2. The load drive device according to claim 1, wherein the first terminal group further includes the first power supply terminal.

3. The load drive device according to claim 1, wherein the second terminal group includes two or more of the external connection terminals.

4. The load drive device according to claim 1, wherein the second terminal group further includes the second power supply terminal.

5. The load drive device according to claim 1, wherein the first voltage is higher than the second voltage, and
between the first terminal group and the second terminal group, the separate terminal arranged adjacent to the first terminal group has a withstand voltage equal to or higher than the first voltage.

6. The load drive device according to claim 1, further comprising:
a control circuit which includes, for each of the output terminals, an output circuit for supplying power to the load and which controls the output circuits,
wherein the control circuit includes a write storage portion into which state specifying data that specifies a state of each of the output circuits is written,
writes the state specifying data into the write storage portion based on a predetermined command signal which is received from the external device through any one or more of the plurality of external connection terminals and
performs state control on each of the output circuits based on the state specifying data in the write storage portion and
a storage region corresponding to a predetermined bit number is provided in the write storage portion for each of the channels as a storage bit of the state specifying data.

7. The load drive device according to claim 6,
wherein in the write storage portion, a write memory space corresponding to w bits is defined,
w has a value which is equal to or more than a product of an integer greater than a number of the channels and the predetermined bit number and
a dummy memory space which does not affect a state of the load drive device including the output circuits and which corresponds to an integral multiple of the predetermined bit number is present in the wright memory space.

8. The load drive device according to claim 1, further comprising:
a control circuit which includes, for each of the output terminals, an output circuit for supplying power to the load and which controls the output circuits,
wherein the control circuit
includes a read storage portion in which state data that indicates a state of each of the output circuits is stored,
reads, when receiving a predetermined command signal from the external device through any one or more of the plurality of external connection terminals, the state data from the read storage portion and
outputs the read state data through any one or more of the plurality of external connection terminals, and
a storage region corresponding to a predetermined bit number is provided in the read storage portion for each of the channels as a storage bit of the state data.

9. The load drive device according to claim 8,
wherein in the read storage portion, a read memory space corresponding to r bits is defined,
r has a value which is equal to or more than a product of an integer greater than a number of the channels and the predetermined bit number and
a dummy memory space from which a fixed value is read based on the command signal and which corresponds to an integral multiple of the predetermined bit number is present in the read memory space.

10. A semiconductor device which forms the load drive device according to claim 1, wherein the load drive device is formed with an integrated circuit.

11. The semiconductor device according to claim 10, wherein a dissipation pad is provided on a housing in which the integrated circuit is sealed.

12. A load drive system comprising:
the load drive device according to claim 1; and
a processing device which is connected to the load drive device through the plurality of external connection terminals in the load drive device and which serves as the external device.

13. A vehicle in which the load drive system according to claim 12 is mounted.

* * * * *